US012795994B2

(12) United States Patent
Xie et al.

(10) Patent No.: US 12,795,994 B2
(45) Date of Patent: Nov. 10, 2026

(54) PLACEHOLDER PROFILE FOR BACKSIDE SELF-ALIGNED CONTACT

(71) Applicant: International Business Machines Corporation, Armonk, NY (US)

(72) Inventors: Ruilong Xie, Niskayuna, NY (US); Kangguo Cheng, Schenectady, NY (US); Julien Frougier, Albany, NY (US); Chanro Park, Clifton Park, NY (US); Min Gyu Sung, Latham, NY (US)

(73) Assignee: International Business Machines Corporation, Armonk, NY (US)

( * ) Notice: Subject to any disclaimer, the term of this patent is extended or adjusted under 35 U.S.C. 154(b) by 606 days.

(21) Appl. No.: 17/899,174

(22) Filed: Aug. 30, 2022

(65) Prior Publication Data

US 2024/0072134 A1 Feb. 29, 2024

(51) Int. Cl.
*H10D 30/67* (2025.01)
*H10D 30/01* (2025.01)
(Continued)

(52) U.S. Cl.
CPC ....... *H10D 30/6729* (2025.01); *H10D 30/014* (2025.01); *H10D 62/121* (2025.01); *H10D 62/151* (2025.01); *H10D 64/01* (2025.01); *H10D 84/0149* (2025.01); *H10D 84/0186* (2025.01); *H10D 84/038* (2025.01);
(Continued)

(58) Field of Classification Search
CPC ........ H01L 21/76804; H01L 21/76823; H10D 30/6729; H10W 20/082; H10W 20/427; H10W 20/0696
See application file for complete search history.

(56) References Cited

U.S. PATENT DOCUMENTS 9,178,054 B2 11/2015 Zinn
9,397,049 B1 7/2016 Fan et al.
(Continued)

OTHER PUBLICATIONS

A. Gupta et al., "Buried Power Rail Integration with Si FinFETs for CMOS Scaling beyond the 5 nm Node," Symposium on VLSI Technology (VLSIT), IEEE, Jun. 2020, THL.6, 2 pages.

*Primary Examiner* — Christine S. Kim
*Assistant Examiner* — Andrew Victor Prostor
(74) *Attorney, Agent, or Firm* — Kristofer Haggerty

(57) ABSTRACT

Backside self-aligned contact designs using a replacement contact process with unique placeholder profile are provided. In one aspect, a semiconductor device includes: a field-effect transistor(s) on a frontside of the device; backside power rails on a backside of the device; a backside source/drain region contact connecting a given one of the backside power rails to a source/drain region of the field-effect transistor(s), and a dielectric placeholder(s) between the given backside power rail and another source/drain region of the field-effect transistor(s), where a first end of the dielectric placeholder(s) having a width W1 directly contacts the given backside power rail, a second end of the dielectric placeholder(s) having a width W2 directly contacts the other source/drain region, where W1>W2. The field-effect transistor(s) can include a stack of active layers with bottom dielectric isolation, and a gate-all-around configuration. A method of fabricating the present semiconductor devices is also provided.

15 Claims, 44 Drawing Sheets

(51) Int. Cl.

| | |
|---|---|
| ***H10D 62/10*** | (2025.01) |
| ***H10D 62/13*** | (2025.01) |
| ***H10D 64/01*** | (2025.01) |
| ***H10D 84/01*** | (2025.01) |
| ***H10D 84/03*** | (2025.01) |
| ***H10D 84/83*** | (2025.01) |
| ***H10D 84/85*** | (2025.01) |
| ***H10D 86/00*** | (2025.01) |
| ***H10W 20/00*** | (2026.01) |
| ***H10W 20/40*** | (2026.01) |
| *H10D 30/43* | (2025.01) |
| *H10W 20/41* | (2026.01) |

(52) U.S. Cl.

CPC ............. *H10D 84/83* (2025.01); *H10D 84/85* (2025.01); *H10D 86/00* (2025.01); *H10W 20/069* (2026.01); *H10W 20/0696* (2026.01); *H10W 20/481* (2026.01); *H10D 30/43* (2025.01); *H10D 30/6735* (2025.01); *H10D 30/6757* (2025.01); *H10W 20/082* (2026.01); *H10W 20/094* (2026.01); *H10W 20/427* (2026.01)

(56) References Cited

U.S. PATENT DOCUMENTS

| | | | | |
|---|---|---|---|---|
| 9,634,092 | B2 | 4/2017 | Bhuwalka et al. | |
| 10,797,139 | B2 | 10/2020 | Morrow et al. | |
| 2021/0111115 | A1 | 4/2021 | Morrow et al. | |
| 2021/0134721 | A1 | 5/2021 | Chiang et al. | |
| 2021/0202385 | A1 | 7/2021 | Huang et al. | |
| 2021/0305252 | A1 | 9/2021 | Chiang et al. | |
| 2021/0305381 | A1 | 9/2021 | Chiang et al. | |
| 2021/0335690 | A1* | 10/2021 | Huang ............... | H10D 84/0193 |
| 2021/0336019 | A1 | 10/2021 | Su et al. | |
| 2021/0351303 | A1 | 11/2021 | Ju et al. | |
| 2021/0376071 | A1 | 12/2021 | Liu et al. | |
| 2021/0376093 | A1 | 12/2021 | Chu et al. | |
| 2021/0391421 | A1 | 12/2021 | Chu et al. | |
| 2022/0165856 | A1* | 5/2022 | Yu ...................... | H10D 30/6757 |
| 2022/0406715 | A1* | 12/2022 | Xie .................... | H10D 84/0184 |
| 2023/0387012 | A1* | 11/2023 | Cheng ............... | H01L 21/76877 |

* cited by examiner

Y2-Y2'

PLACEHOLDER PROFILE FOR BACKSIDE SELF-ALIGNED CONTACT

FIELD OF THE INVENTION

The present invention relates to backside interconnect structures, and more particularly, to improved backside self-aligned contact designs using a replacement contact process with a unique placeholder profile.

BACKGROUND OF THE INVENTION

With a traditional semiconductor device architecture, signal and power delivery occur through a network of interconnects built on the frontside of a wafer. However, as device dimensions are scaled, resistance becomes a concern especially for power distribution. Namely, as devices become smaller and smaller, so do the interconnects carrying power to vital components such as transistors. For instance, scaling copper wires causes their resistance to increase exponentially.

While techniques such as the use of alternative interconnect materials can provide an incremental solution to the resistance bottleneck, advanced scaling requires a different approach. One such approach is backside power delivery. As its name implies, back side power delivery moves the power delivery layers (also referred to as a backside power distribution network) of a semiconductor device to the backside of the wafer.

However, implementing power delivery components such as power rails and source/drain contacts at the backside of the wafer presents some notable challenges. For instance, processing at the backside of the wafer must be coordinated with the location of structures already placed on the frontside of the wafer. Proper alignment of the backside components with their power delivery targets is necessary for optimal device performance.

Further, even if properly aligned, subsequent metal fill of the backside features such as contact vias can be difficult with conventional process flows due to their shape. As a result, voids may form which undesirably lead to an increase in contact resistance and a degradation of device performance.

Thus, backside self-aligned contact designs, and techniques for fabrication thereof, having a profile shape which reduces misplacement error and improves backside metallization would be desirable.

SUMMARY OF THE INVENTION

The present invention provides improved backside self-aligned contact designs using a replacement contact process with unique placeholder profile. In one aspect of the invention, a semiconductor device is provided. The semiconductor device includes: at least one field-effect transistor on a frontside of the semiconductor device; backside power rails on a backside of the semiconductor device; a backside source/drain region contact connecting a given one of the backside power rails to a source/drain region of the at least one field-effect transistor, and at least one dielectric placeholder between the given backside power rail and another source/drain region of the at least one field-effect transistor, where a first end of the at least one dielectric placeholder is in direct contact with the given backside power rail and has a first width W1, where a second end of the at least one dielectric placeholder is in direct contact with the other source/drain region of the at least one field-effect transistor and has a second width W2, and where W1 is greater than W2.

In another aspect of the invention, another semiconductor device is provided. The semiconductor device includes: at least one field-effect transistor on a frontside of the semiconductor device, where the at least one field-effect transistor includes a stack of active layers with bottom dielectric isolation, a gate surrounding the active layers in a gate-all-around configuration, and source/drain regions on opposite sides of the stack of active layers; backside power rails on a backside of the semiconductor device; a backside source/drain region contact connecting a given one of the backside power rails to a source/drain region of the at least one field-effect transistor; and at least one dielectric placeholder between the given backside power rail and another source/drain region of the at least one field-effect transistor, where a first end of the at least one dielectric placeholder is in direct contact with the given backside power rail and has a first width W1, where a second end of the at least one dielectric placeholder is in direct contact with the other source/drain region of the at least one field-effect transistor and has a second width W2, and where W1 is greater than W2.

In yet another aspect of the invention, a method of fabricating a semiconductor device is provided. The method includes: forming at least one field-effect transistor on a frontside of a wafer, where the forming of the at least one field-effect transistor includes patterning trenches in the wafer from the frontside of the wafer, reshaping the trenches using a sigma etch to form sigma-shaped trenches, forming dielectric placeholders in the trenches, and forming source/drain regions of the at least one field-effect transistor on the dielectric placeholders; fully removing the wafer to expose the dielectric placeholders from a backside of the semiconductor device; and selectively removing at least one of the dielectric placeholders and replacing the at least one dielectric placeholder with a backside source/drain region contact.

A more complete understanding of the present invention, as well as further features and advantages of the present invention, will be obtained by reference to the following detailed description and drawings.

DETAILED DESCRIPTION OF PREFERRED EMBODIMENTS

Provided herein are improved backside self-aligned contacts formed by a replacement contact process that involves creating a unique placeholder profile using a sigma etch. As will be described in detail below, due to its unique profile which is wider in the middle and tapers at the top and at the bottom, the present placeholder design advantageously enables large backside contact misplacement error tolerance. Further, following removal of the placeholder, the shape of the resulting feature vastly improves backside metallization to form backside contacts that are used to connect the source/drain regions to a backside power rail. Thus, these backside contacts may also be referred to herein as "backside source/drain region contacts." Specifically, as will be described in detail below, the present backside source/drain region contacts have a smaller width toward the source/drain regions and a larger width toward the backside power rail.

Advantageously, this configuration facilitates metallization of the backside source/drain region contacts without concerns about voids.

Figure 1:
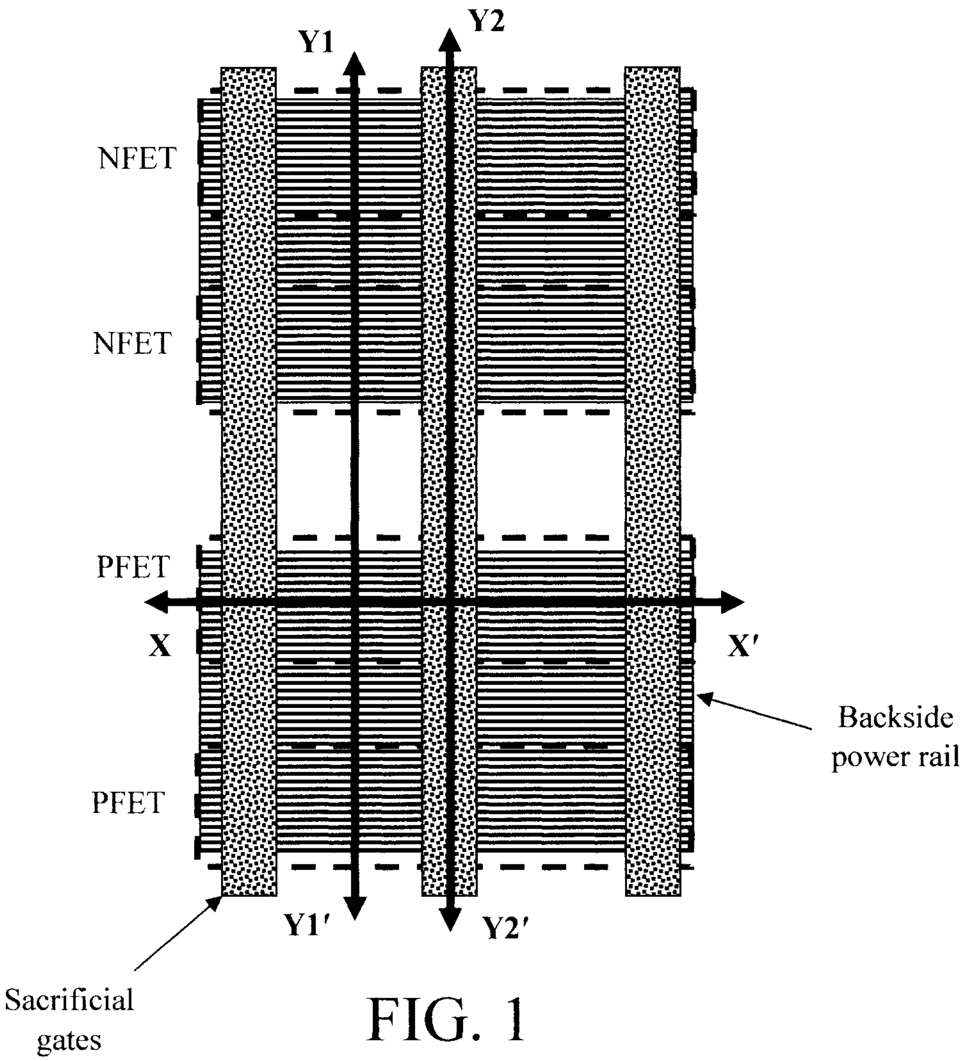
FIG. 1 is a top-down diagram illustrating the overall layout of the present semiconductor device and the orientations of the Y1-Y1', Y2-Y2' and X-X' cross-sectional views shown in the figures according to an embodiment of the present invention.

An exemplary methodology for fabricating a semiconductor device in accordance with the present techniques having backside source/drain region contacts which connect source/drain regions of the semiconductor device to a backside power rail is now described by way of reference to FIGS. 1-20. FIG. 1 is a top-down diagram illustrating an overall layout of the present semiconductor device design. As shown in FIG. 1, the present techniques employ a device architecture where individual p-channel field-effect transistors (PFETs) are formed adjacent to one another, and individual n-channel field-effect transistors (NFETs) are formed adjacent to one another. Adjacent pairs of PFETs are separated by a pair of NFETs, and vice versa. It is notable that the present example involves the formation of one pair of PFETs adjacent to one pair of NFETs. This is being done merely for ease and clarity of depiction, and embodiments are contemplated herein where multiple pairs of PFETs and NFETs are employed.

Device structures such as sacrificial gates will be formed on a frontside of the device wafer, while others such as the backside power rail will be formed on the backside of the wafer. The term "sacrificial," as used herein, refers to a material or structure that is used in one part of the process, and then later removed, in whole or in part, during fabrication of the semiconductor device. Thus, as is apparent from FIG. 1, a gate-last approach will be employed in the present example. With a gate-last approach, sacrificial gates are used as a placeholder during formation of the source/drain regions. The sacrificial gates are removed later on in the process, and replaced with the final gates of the device (also referred to herein as "replacement gates"). When the replacement gates are metal gates, they may also be referred to herein as "replacement metal gates." Advantageously, use of a gate-last process avoids exposing the replacement gate materials such as high-κ dielectrics to potentially damaging conditions such as the high temperatures experienced during source/drain region formation.

FIG. 1 further illustrates the orientations of the cross-sectional views that will be illustrated in the following figures. For instance, as shown in FIG. 1, the Y1-Y1' cross-sectional views that will be shown in the following figures depict cuts in between two of the sacrificial gates. The Y2-Y2' cross-sectional views depict cuts through one of the sacrificial gates. The X-X' cross-sectional views depict cuts, perpendicular to the Y1-Y1' and Y2-Y2' cross-sectional views, across each of the sacrificial gates.

Figure 2:
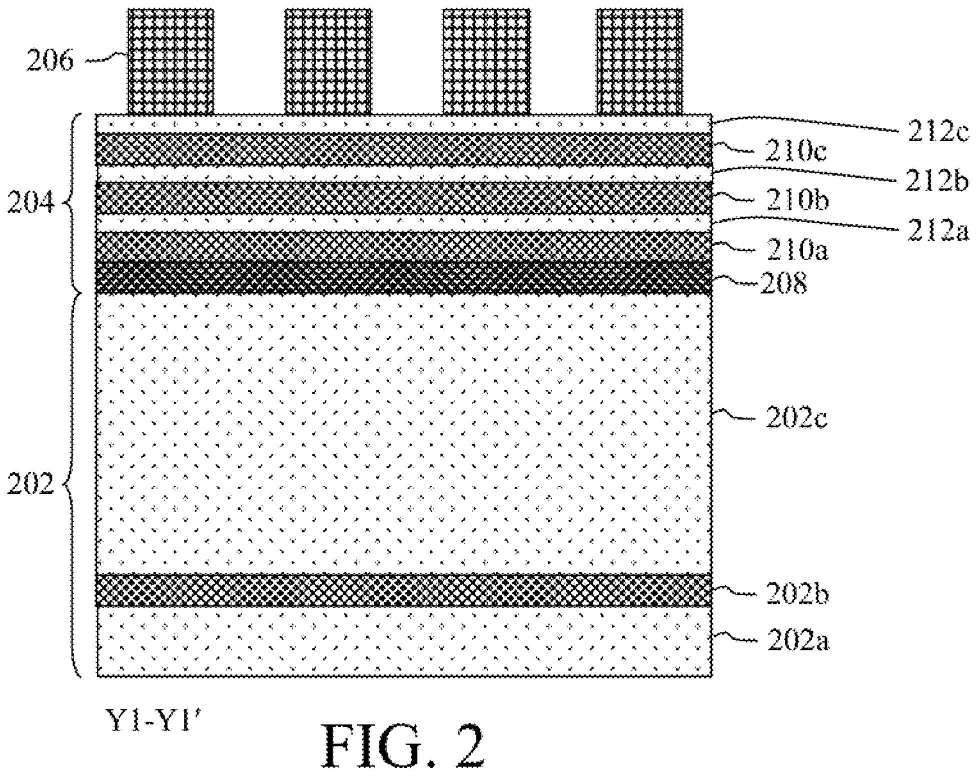
FIG. 2 is a Y1-Y1' cross-sectional view illustrating a stack of sacrificial/active layers having been formed on a frontside of a wafer (having a substrate, an etch stop layer, and a semiconductor layer), and a patterned hardmask having been formed on the sacrificial/active layer stack according to an embodiment of the present invention.

As shown in FIG. 2 (a Y1-Y1' cross-sectional view), the process begins with the formation of a sacrificial/active layer stack 204 on a frontside of a wafer 202, and the formation of a patterned hardmask 206 on the sacrificial/active layer stack 204. As will be described in detail below, the sacrificial/active layer stack 204 will serve as the basis for forming the NFETs and PFETs on the frontside of the wafer 202.

As shown in FIG. 2, wafer 202 includes a substrate 202*a*, an etch stop layer 202*b* disposed directly on the substrate 202*a*, and a semiconductor layer 202*c* disposed directly on the etch stop layer 202*b*. As will be described in detail below, etch stop layer 202*b* will be used during removal of the substrate 202*a* from a backside of the wafer 202. By way of example only, etch stop layer 202*b* can have a thickness of from about 2 nanometers (nm) to about 50 nm.

According to one exemplary embodiment, substrate 202*a* is a bulk semiconductor wafer, such as a bulk silicon (Si) wafer, and etch stop layer 202*b* is formed from silicon germanium (SiGe) that is epitaxially grown from the (Si) substrate 202*a*. In turn, semiconductor layer 202*c* (e.g., Si) can be epitaxially grown from the etch stop layer 202*b*. Alternatively, according to another exemplary embodiment, etch stop layer 202*b* is an oxide layer. In that case, wafer 202 can be a semiconductor-on-insulator or SOI wafer. An SOI wafer has an SOI layer separated from an underlying substrate by a buried insulator. When the buried insulator is an oxide, it is also referred to herein as a buried oxide or BOX. In the present example, the substrate, BOX, and SOI layer correspond to the substrate 202*a*, the (oxide) etch stop layer 202*b*, and the semiconductor layer 202*c*, respectively. As above, the SOI layer/semiconductor layer 202*c* can include any suitable semiconductor material(s), such as Si.

Sacrificial/active layer stack 204 includes alternating sacrificial and active layers oriented horizontally one on top of another on wafer 202 (in particular, on semiconductor layer 202*c* of wafer 202). In one exemplary embodiment, the sacrificial and active layers are nanosheets. The term "nanosheet" as used herein, generally refers to a sheet or a layer having nanoscale dimensions. Further, the term "nanosheet" is meant to encompass other nanoscale structures such as nanowires. For instance, the term "nanosheet" can refer to a nanowire with a larger width, and/or the term "nanowire" can refer to a nanosheet with a smaller width, and vice versa.

Specifically, as shown in FIG. 2, the sacrificial/active layer stack 204 includes a (first) sacrificial layer 208 deposited on the wafer 202, and alternating layers of (second) sacrificial layers 210*a,b,c*, etc. and active layers 212*a,b,c*, etc. deposited on sacrificial layer 208. As will be described in detail below, the sacrificial layers 210*a,b,c*, etc. will be removed later on in the process to permit the formation of a gate-all-around configuration for the semiconductor device. By contrast, active layers 212*a,b,c*, etc. will remain in place and serve as channels of the field-effect transistors. It is notable that the number of sacrificial layers 210*a,b,c*, etc. and active layers 212*a,b,c*, etc. shown in the figures is provided merely as an example to illustrate the present techniques. For instance, embodiments are contemplated herein where more or fewer sacrificial layers 210*a,b,c*, etc. and/or more or fewer active layers 212*a,b,c*, etc. are present than shown. According to an exemplary embodiment, each of the sacrificial layers 210*a,b,c*, etc. and each of the active layers 212*a,b,c*, etc. is deposited/formed on semiconductor layer 202*c* of wafer 202 using an epitaxial growth process. According to an exemplary embodiment, each of the sacrificial layers 210*a,b,c*, etc. and each of the active layers 212*a,b,c*, etc. has a thickness of from about 6 nm to about 25 nm.

The materials employed for the sacrificial layers 210*a,b,c*, etc. and active layers 212*a,b,c*, etc. are such that the sacrificial layers 210*a,b,c*, etc. can be removed selective to the active layers 212*a,b,c*, etc. during fabrication. Further, as will be described in detail below, the material employed for sacrificial layer 208 is such that sacrificial layer 208 can be removed selective to sacrificial layers 210*a,b,c*, etc. during fabrication in order to enable the formation of a bottom dielectric isolation layer. Advantageously, bottom dielectric isolation prevents source-to-drain leakage via the wafer 202.

For instance, according to an exemplary embodiment, the sacrificial layers 210*a,b,c*, etc. are each formed from SiGe, while the active layers 212*a,b,c*, etc. are formed from Si. Etchants such as wet hot SC1, vapor phase hydrogen chloride (HCl), vapor phase chlorine trifluoride ($ClF_3$) and other reactive clean processes (RCP) are selective for etching of SiGe versus Si. This is, however, only one exemplary combination of sacrificial/active material that may be employed in accordance with the present techniques. For instance, by way of example only, the opposite configuration can instead be implemented where the sacrificial layers 210*a,b,c*, etc. are each formed from Si, and the active layers 212*a,b,c*, etc. are each formed from SiGe.

Further, high germanium (Ge) content SiGe can be removed selective to low Ge content SiGe using an etchant such as dry HCl. Thus, according to an exemplary embodiment, sacrificial layer 208 is formed from SiGe having a high Ge content. For instance, in one exemplary embodiment, high Ge content SiGe is SiGe having from about 45% Ge to about 70% Ge. For instance, in one non-limiting example, sacrificial layer 208 is formed from SiGe55 (which is SiGe having a Ge content of about 55%). Use of a higher Ge content SiGe will enable the sacrificial layer 208 to be etched selective to the sacrificial layers 210*a,b,c*, etc. when forming the bottom dielectric isolation layer (see below). In that case, sacrificial layers 210*a,b,c*, etc. are preferably formed from a low Ge content SiGe. For instance, in one exemplary embodiment, low Ge content SiGe is SiGe having from about 15% Ge to about 35% Ge. For example, in one non-limiting embodiment, sacrificial layers 210*a,b,c*, etc. are formed from SiGe30 (which is SiGe having a Ge content of about 30%).

Suitable materials for hardmask 206 include, but are not limited to, silicon nitride (SiN), silicon dioxide ($SiO_2$), titanium nitride (TiN) and/or silicon oxynitride (SiON). Standard lithography and etching techniques can be employed to pattern hardmask 206. With standard lithography and etching techniques, a lithographic stack (not shown), e.g., photoresist/anti-reflective coating/organic planarizing layer, is used to pattern the hardmask 206 with the footprint and location of a plurality of individual device stacks (see below). Alternatively, the hardmask 206 can be formed by other suitable techniques, including but not limited to, sidewall image transfer (SIT), self-aligned double patterning (SADP), self-aligned quadruple patterning (SAQP), and other self-aligned multiple patterning (SAMP).

Figure 3:
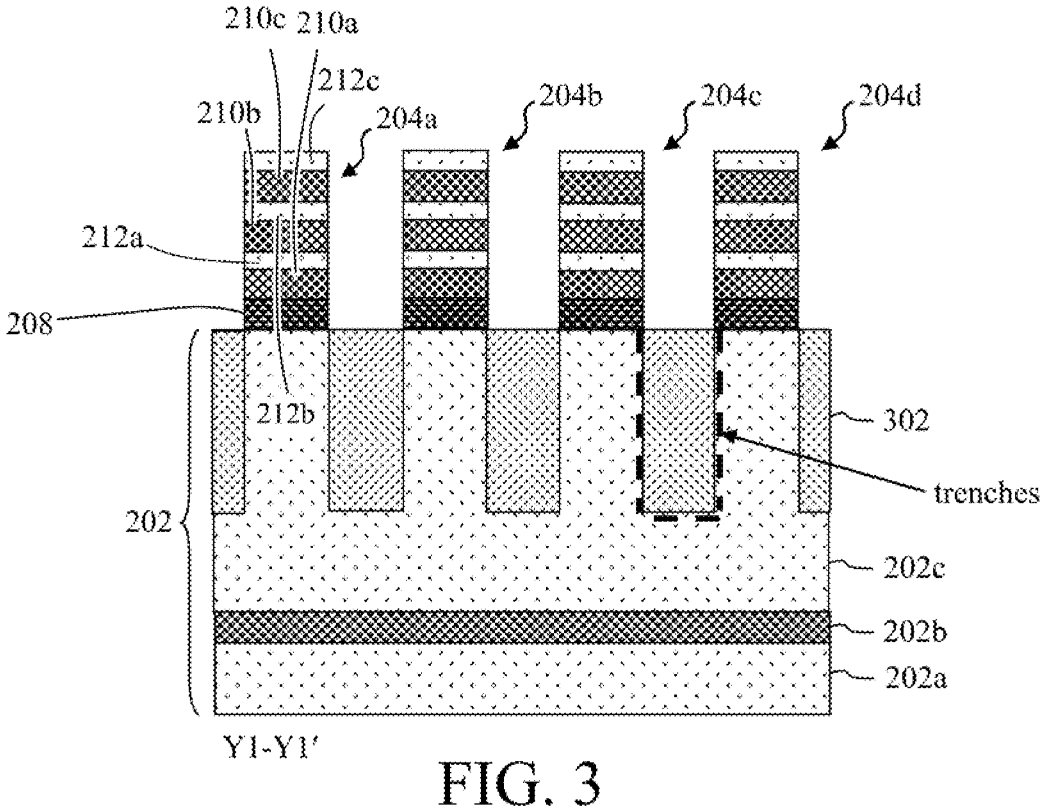
FIG. 3 is a Y1-Y1' cross-sectional view illustrating an etch having been performed to transfer the pattern from the hardmask to the underlying sacrificial/active layer stack to form individual device stacks, and shallow trench isolation regions having been formed in the wafer between the device stacks according to an embodiment of the present invention.

As shown in FIG. 3 (a Y1-Y1' cross-sectional view), an etch is then performed to transfer the pattern from the hardmask 206 to the underlying stack 204 of sacrificial layer 208/sacrificial layers 210*a,b,c*, etc. and active layers 212*a, b,c*, etc. to form individual device stacks 204*a,b,c,d*, etc. each containing a patterned portion of the sacrificial layer 208/sacrificial layers 210*a,b,c*, etc. and active layers 212*a, b,c*, etc., and shallow trench isolation regions 302 are then formed in the wafer 202 between the device stacks 204*a,b, c,d*, etc.

Suitable etching processes for the stack etch include, but are not limited to, directional (anisotropic) etching processes such as reactive ion etching. As shown in FIG. 3, the etch used to pattern the device stacks 204*a,b,c,d*, etc. is extended beyond stack 204 resulting in the patterning of trenches 302 in the semiconductor layer 202*c* from the frontside of wafer 202 between the device stacks 204*a,b,c,d*, etc. in an area of the source/drain regions of the NFET and PFET transistors (see below). For clarity, a dashed outline is used in FIG. 3 to illustrate one of these trenches, with the understanding that a trench is present at the location of each shallow trench isolation region 302. Namely, the shallow trench isolation regions 302 are then formed in the trenches between the device stacks 204*a,b,c,d*, etc. Shallow trench isolation regions 302 serve to isolate the device stacks 204*a,b,c,d*, etc. To form the shallow trench isolation regions 302, a dielectric such as an oxide (which may also be generally referred to herein as a 'shallow trench isolation oxide') is deposited into, and filling, the trenches, followed by planarization and recess. Although not explicitly shown in the figures, a liner (e.g., a thermal oxide or silicon nitride (SiN)) may be deposited into the trenches prior to the shallow trench isolation oxide. Suitable shallow trench isolation oxides include, but are not limited to, oxide low-κ materials such as silicon oxide (SiOx) and/or oxide ultralow-κ interlayer dielectric (ULK-ILD) materials, e.g., having a dielectric constant κ of less than 2.7. Suitable ultralow-κ dielectric materials include, but are not limited to, porous organosilicate glass (pSiCOH). A process such as chemical vapor deposition (CVD), atomic layer deposition (ALD), or physical vapor deposition (PVD) can be employed to deposit the shallow trench isolation oxide, after which the shallow trench isolation oxide can be planarized using a process such as chemical mechanical polishing. After that, the shallow trench isolation oxide is recessed using a dry or wet etch process to form the shallow trench isolation regions 302 at a base of the device stacks 204*a,b,c,d*, etc.

Figure 4A:
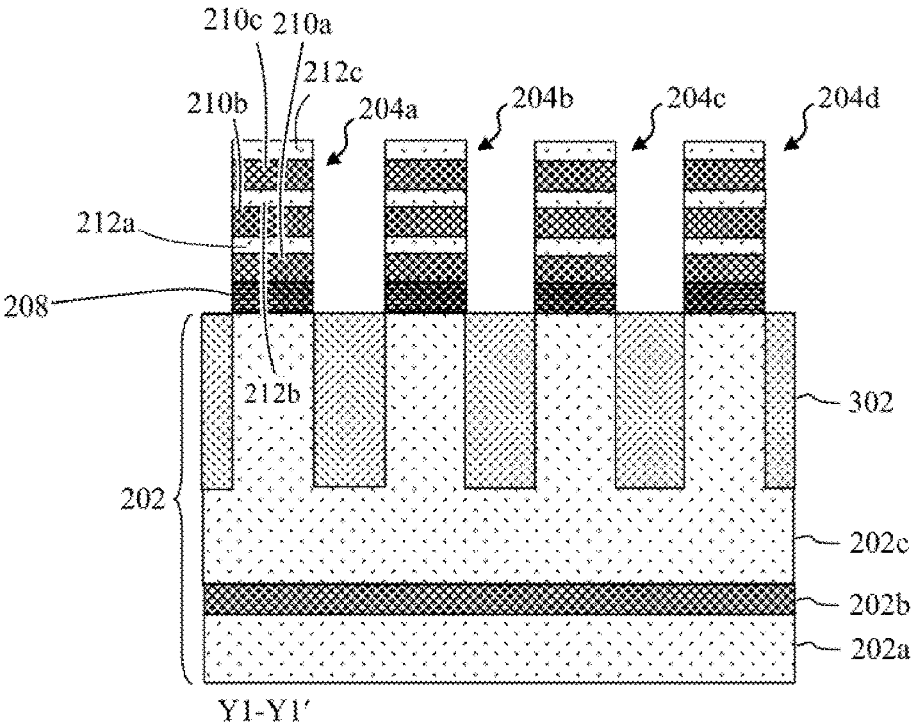
FIG. 4A is a Y1-Y1' cross-sectional view.
Figure 4B:
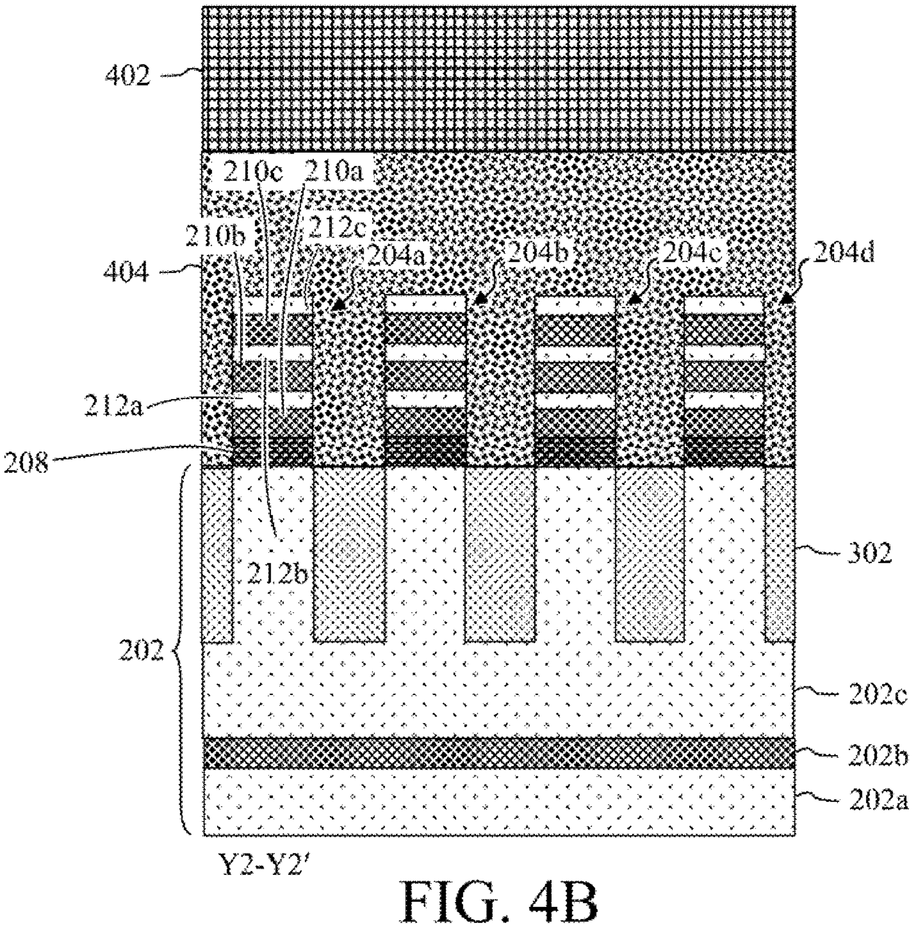
FIG. 4B is a Y2-Y2' cross-sectional view.
Figure 4C:
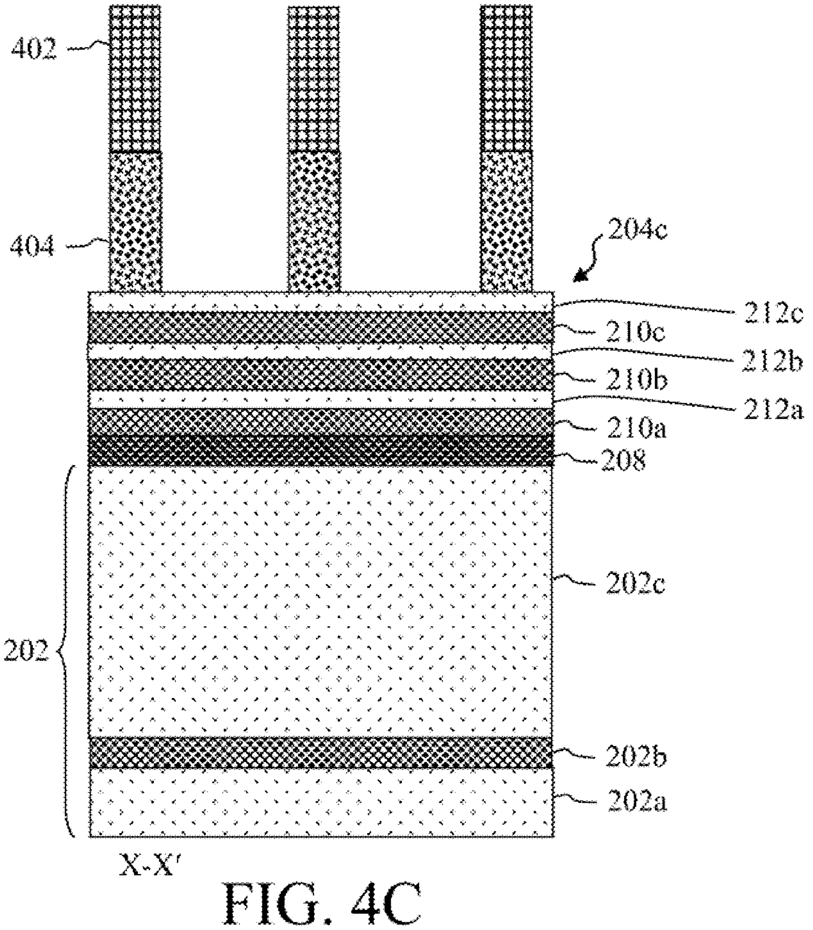
FIG. 4C is an X-X' cross-sectional view illustrating sacrificial gates having been formed on the device stacks according to an embodiment of the present invention.

As shown in FIG. 4A (a Y1-Y1' cross-sectional view), FIG. 4B (a Y2-Y2' cross-sectional view) and FIG. 4C (an X-X' cross-sectional view), sacrificial gates 404 are next formed on the device stacks 204*a,b,c,d*, etc. To form the sacrificial gates 404, a sacrificial gate material is first blanket deposited over the device stacks 204*a,b,c,d*, etc. Suitable sacrificial gate materials include, but are not limited to, poly-silicon and/or amorphous silicon. A process such as CVD, ALD or PVD can be employed to deposit the sacrificial gate material over the device stacks 204*a,b,c,d*, etc. According to an exemplary embodiment, a thin (e.g., from about 1 nm to about 3 nm) layer of SiOx (not shown) is first formed on the device stacks 204*a,b,c,d*, etc., followed by deposition of the poly-silicon and/or amorphous silicon.

Sacrificial gate hardmasks 402 are then formed on the sacrificial gate material marking the footprint and location of each of the sacrificial gates 404. As provided above, suitable hardmask materials include, but are not limited to, SiN, $SiO_2$, TiN and/or SiON. An etch using the sacrificial gate hardmasks 402 is then used to pattern the sacrificial gate material into the individual sacrificial gates 404 shown in FIGS. 4A-C.

Figure 5A:
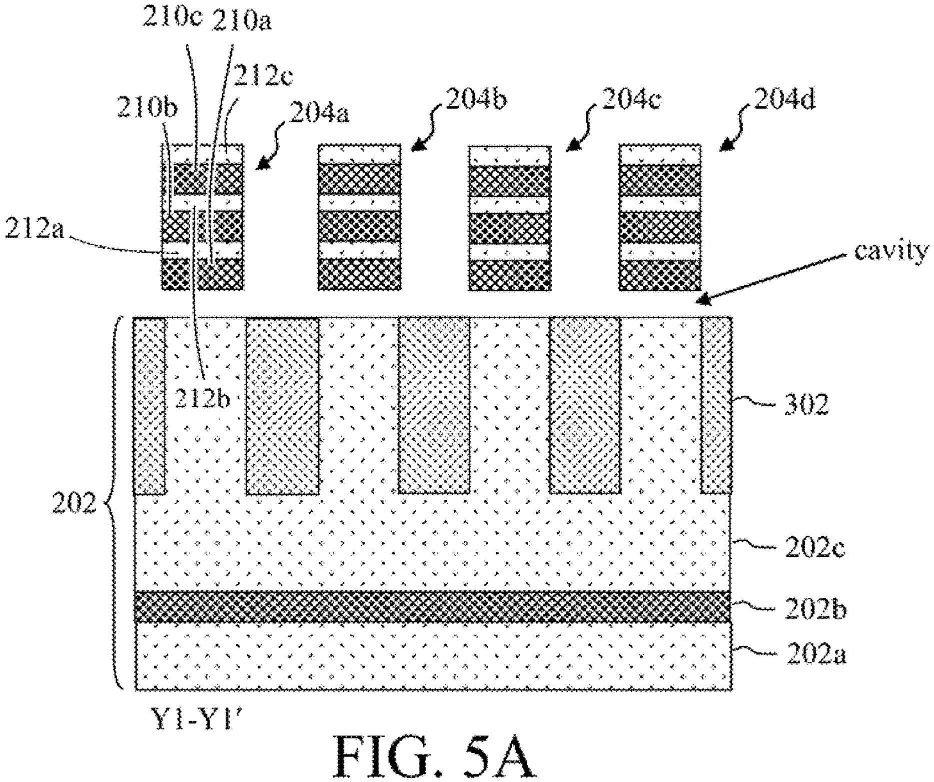
FIG. 5A is a Y1-Y1' cross-sectional view.
Figure 5B:
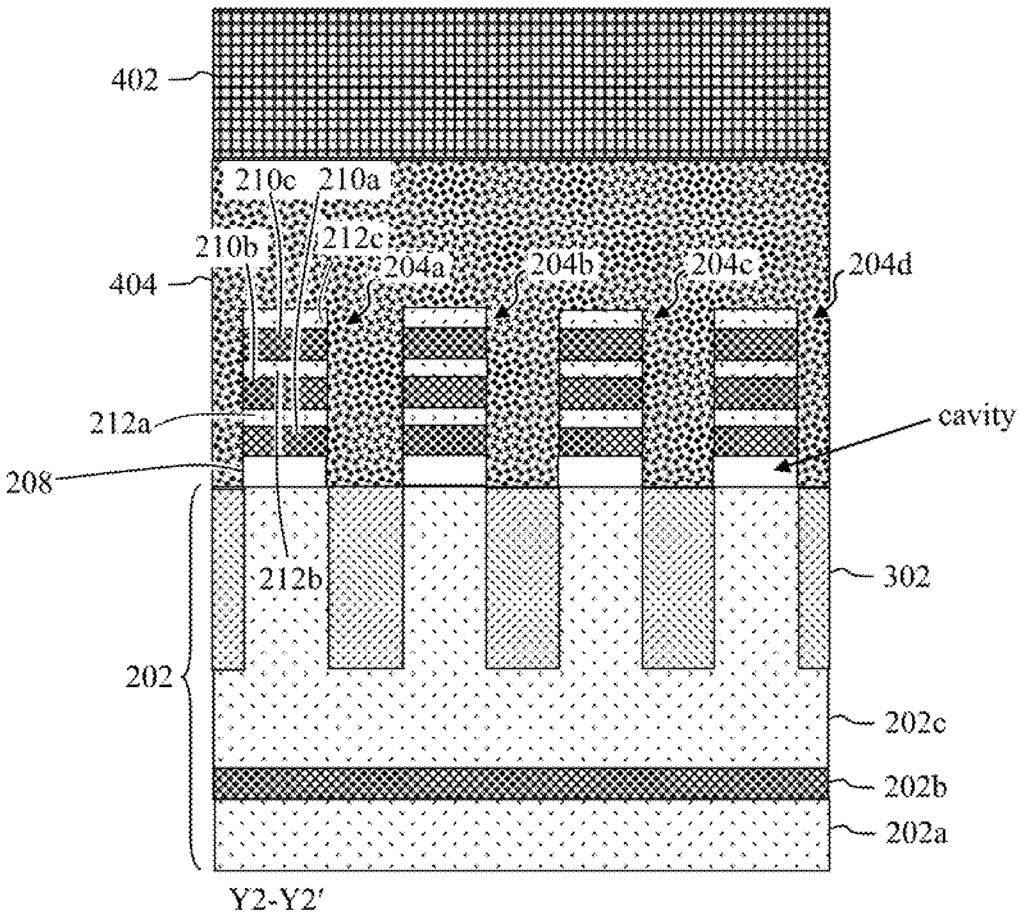
FIG. 5B is a Y2-Y2' cross-sectional view.
Figure 5C:
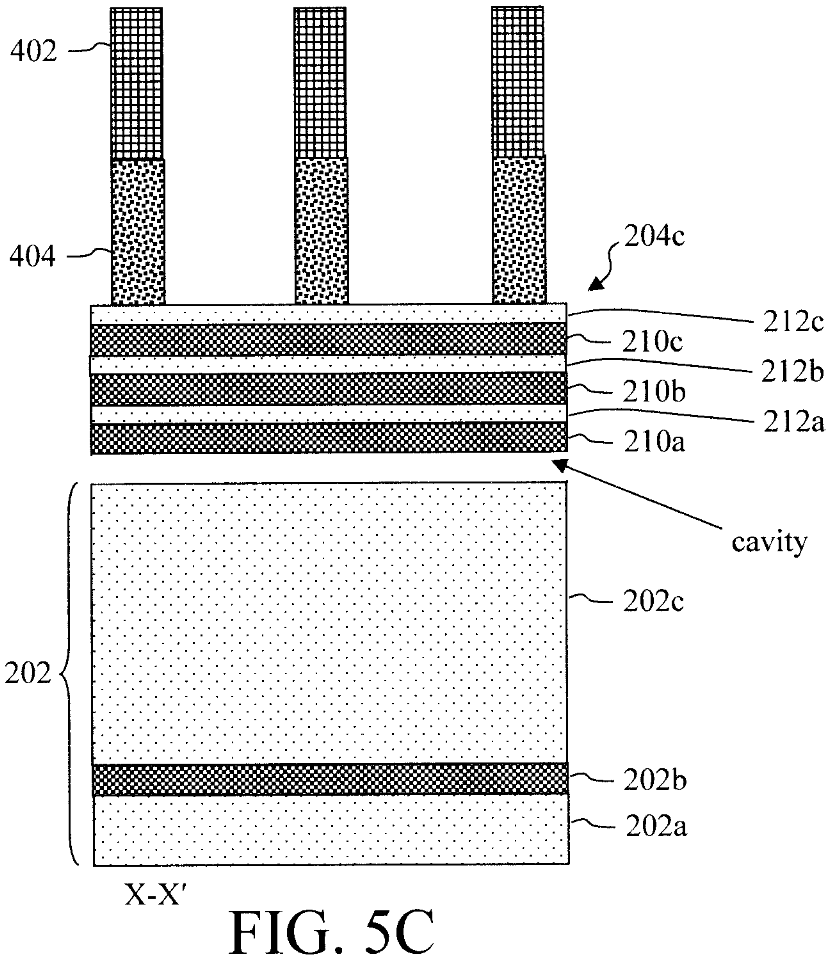
FIG. 5C is an X-X' cross-sectional view illustrating a selective etch having been performed to fully remove a first sacrificial layer from the device stacks forming a cavity in each of the device stacks for bottom dielectric isolation layer formation according to an embodiment of the present invention.

As shown in FIG. 5A (a Y1-Y1' cross-sectional view), FIG. 5B (a Y2-Y2' cross-sectional view) and FIG. 5C (an X-X' cross-sectional view), following patterning of the sacrificial gates 404 a selective etch is performed to fully remove the sacrificial layer 208 from device stacks 204*a,b, c,d*, etc. forming a cavity in each of the device stacks 204*a,b,c,d*, etc. for bottom dielectric isolation layer formation.

As provided above, the sacrificial layer 208 can be formed from SiGe having a high Ge content (such as SiGe55), whereas the sacrificial layers 210*a,b,c*, etc. can be formed from low Ge content SiGe (such as SiGe30). In that case, the sacrificial layer 208 can be selectively removed using an etchant such as dry HCl.

Figure 6A:
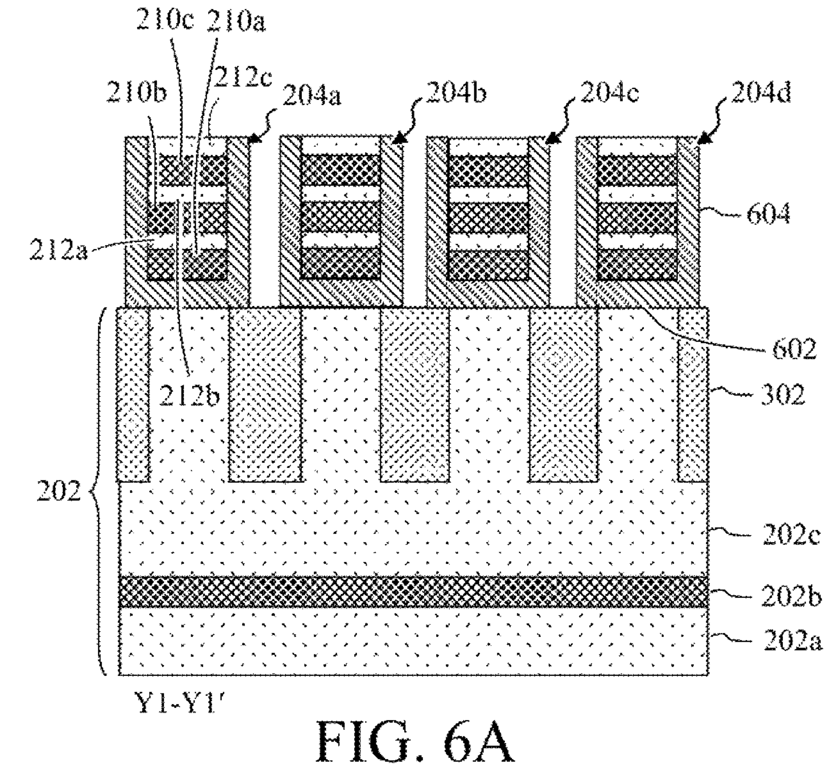
FIG. 6A is a Y1-Y1' cross-sectional view.
Figure 6B:
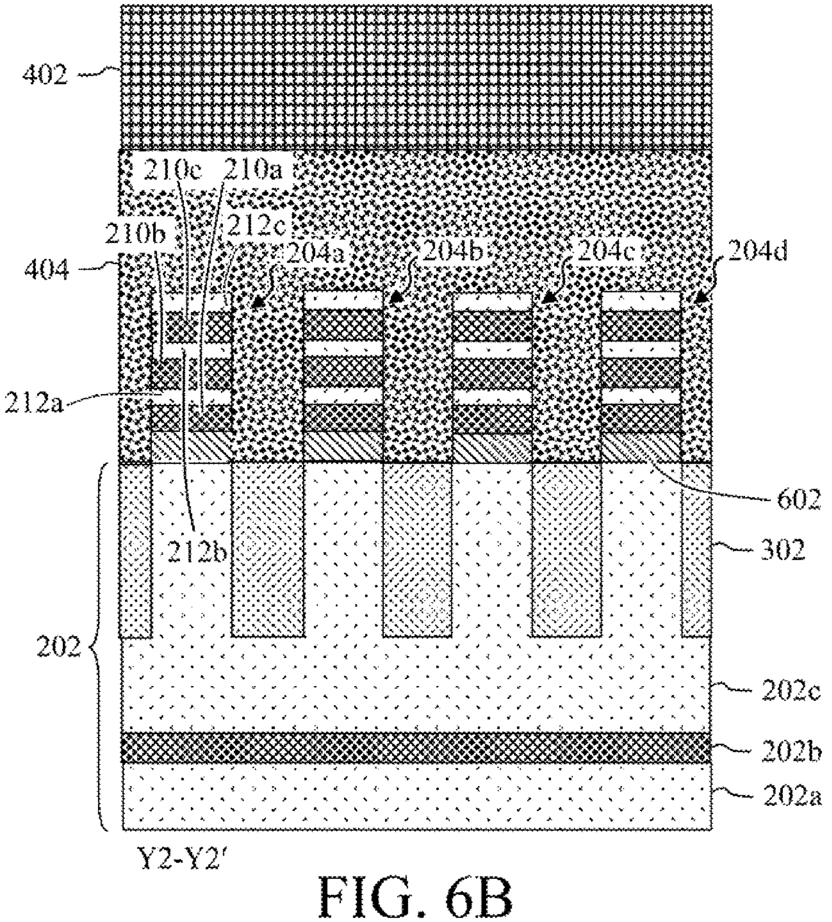
FIG. 6B is a Y2-Y2' cross-sectional view.
Figure 6C:
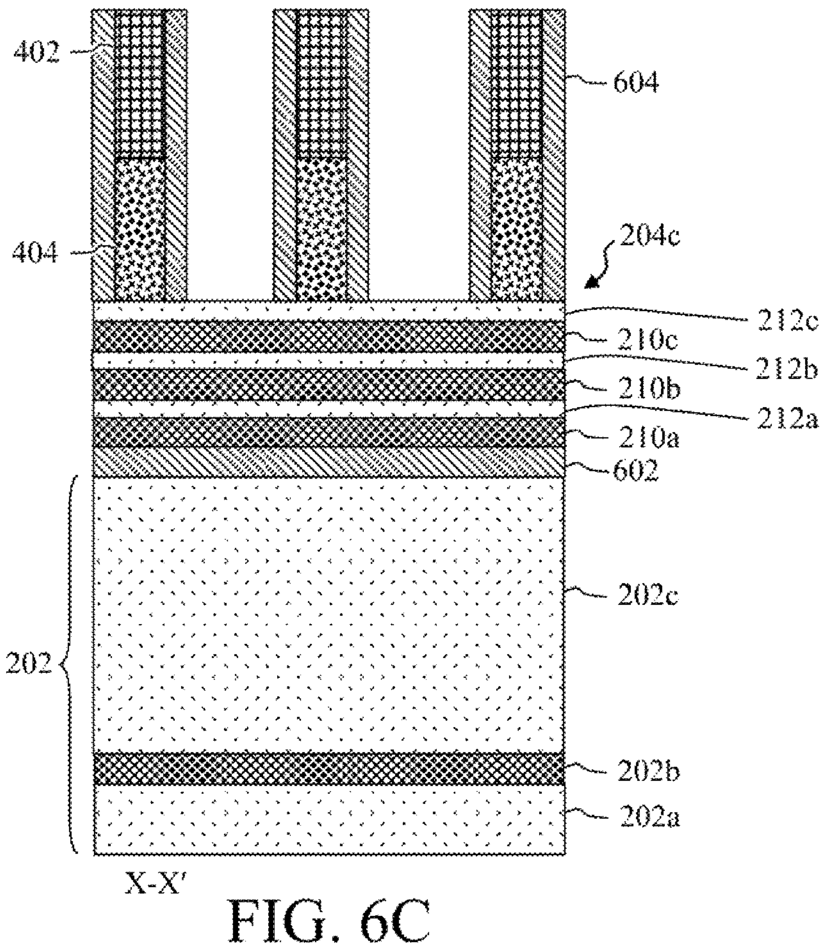
FIG. 6C is an X-X' cross-sectional view illustrating a dielectric spacer material having been deposited over the device stacks and into/filling the cavities, followed by an etch having been used to pattern the dielectric spacer material into a bottom dielectric isolation layer in the cavities and dielectric spacers alongside the sacrificial gate hardmasks/sacrificial gates according to an embodiment of the present invention.

As shown in FIG. 6A (a Y1-Y1' cross-sectional view), FIG. 6B (a Y2-Y2' cross-sectional view) and FIG. 6C (an X-X' cross-sectional view), a dielectric spacer material is then deposited over the device stacks 204*a,b,c,d*, etc. and into/filling the cavities, followed by a directional (anisotropic) etching process such as reactive ion etching to pattern the dielectric spacer material into a bottom dielectric isolation layer 602 in the cavities and dielectric spacers 604 alongside the sacrificial gate hardmasks 402 and sacrificial gates 404. Suitable dielectric spacer materials include, but are not limited to, SiOx, silicon carbide (SiC), silicon oxycarbide (SiCO), SiN, silicoboron carbonitride (SiBCN)

and/or silicon oxycarbonitride (SiOCN), which can be deposited using a process such as CVD, ALD or PVD. As highlighted above, the bottom dielectric isolation layer 602 is used to prevent source-to-drain leakage via the wafer 202.

Figure 7A:
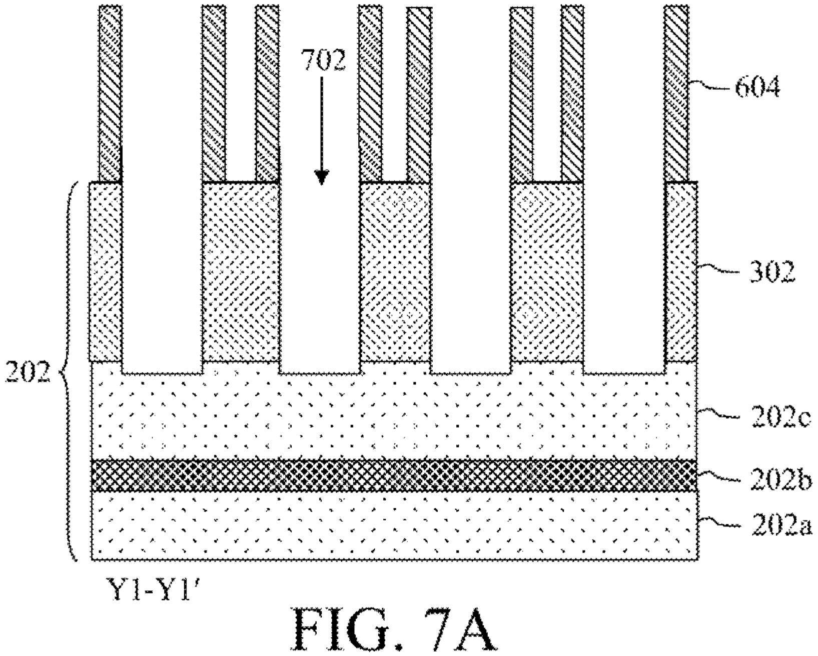
FIG. 7A is a Y1-Y1' cross-sectional view.
Figure 7B:
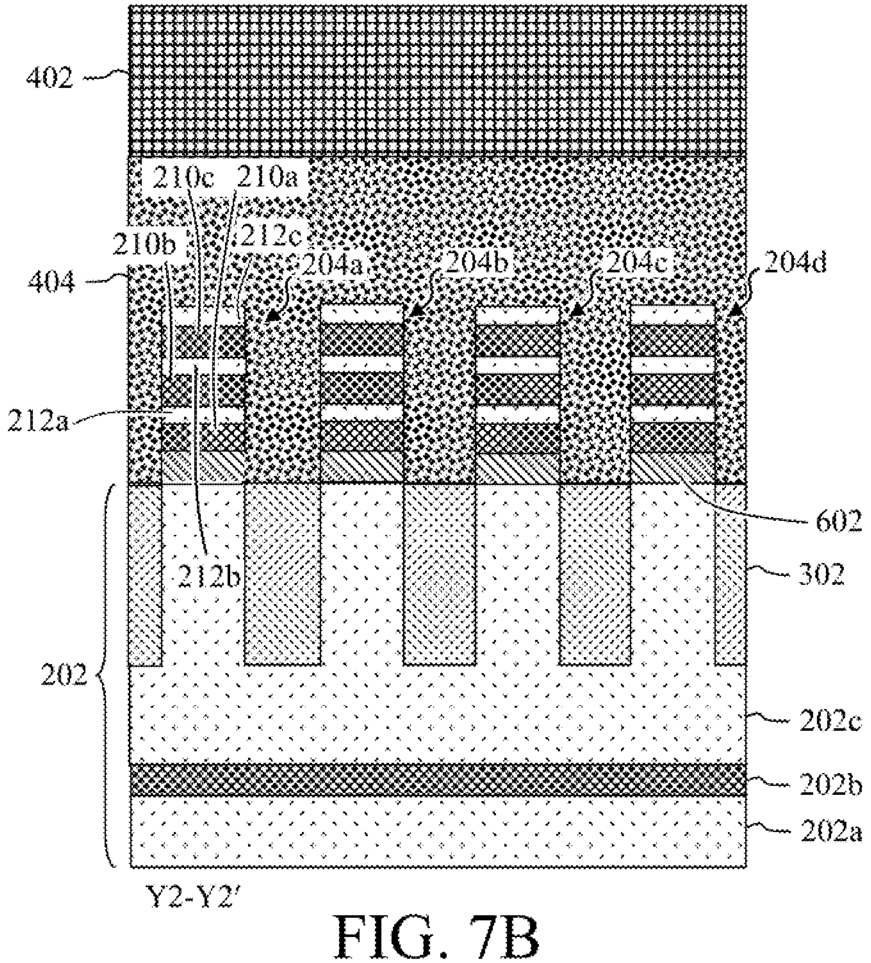
FIG. 7B is a Y2-Y2' cross-sectional view.
Figure 7C:
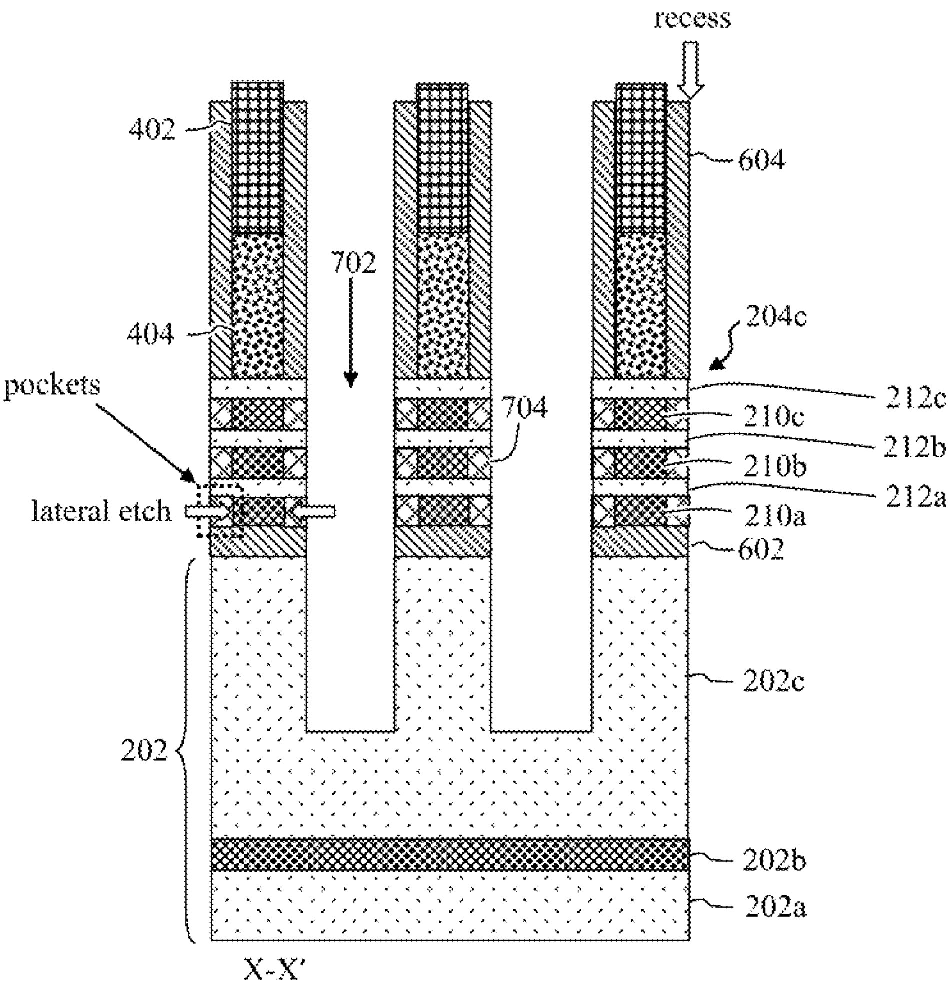
FIG. 7C is an X-X' cross-sectional view illustrating the sacrificial gates and dielectric spacers having been used as a mask to pattern trenches in the device stacks and the substrate, and inner spacers having been formed alongside second sacrificial layers of the device stacks within the trenches according to an embodiment of the present invention.

As shown in FIG. 7A (a Y1-Y1' cross-sectional view), FIG. 7B (a Y2-Y2' cross-sectional view) and FIG. 7C (an X-X' cross-sectional view), the sacrificial gates 404 and dielectric spacers 604 are then used as a mask to pattern trenches 702 in the device stacks 204*a,b,c,d*, etc. and wafer 202 between the sacrificial gates 404, and inner spacers 704 are formed alongside the sacrificial layers 210*a,b,c*, etc. within the trenches 702.

A directional (anisotropic) etching process such as reactive ion etching can be employed for the trench etch. As shown in FIGS. 7A-C, the trenches 702 extend into the underlying semiconductor layer 202*c* below the device stacks 204*a,b,c,d*, etc. Thus, trenches 702 may also be referred to herein as 'deep trenches.' Preferably, the etchant employed for the trench etch is selective for etching the semiconductor layer 202*c* relative to the shallow trench isolation oxide. That way, the shallow trench isolation regions 302 remain intact between the dielectric spacers 604 as shown, e.g., in FIG. 7A. As will be described in detail below, the trenches will later be reshaped and a sacrificial dielectric will be deposited into the trenches as a placeholder for the present backside source/drain region contacts. The source/drain regions of the semiconductor device will be formed (also in the trenches) over the sacrificial dielectric.

To form the inner spacers 704, a selective lateral etch is performed to first recess the sacrificial layers 210*a,b,c*, etc. exposed along the sidewalls of trenches 702. This recess etch forms pockets along the sidewalls of the trenches 702 that are then filled with a dielectric spacer material to form the inner spacers 704 within the pockets. The inner spacers 704 will serve to offset the replacement gates from the source/drain regions (see below). As provided above, the sacrificial layers 210*a,b,c*, etc. can be formed from SiGe. In that case, a SiGe-selective non-directional (isotropic) etching process can be used for the recess etch. Suitable dielectric spacer materials for inner spacers 704 include, but are not limited to, silicon nitride (SiN), SiOx, SiC and/or SiCO. A process such as CVD, ALD or PVD can be employed to deposit the dielectric spacer material into the pockets, after which excess spacer material can be removed from the trenches 702 using an isotropic etching process such as reactive ion etching. As shown in FIGS. 7A-C, this etching process can result in some recessing of the dielectric spacers 604.

Figure 8A:
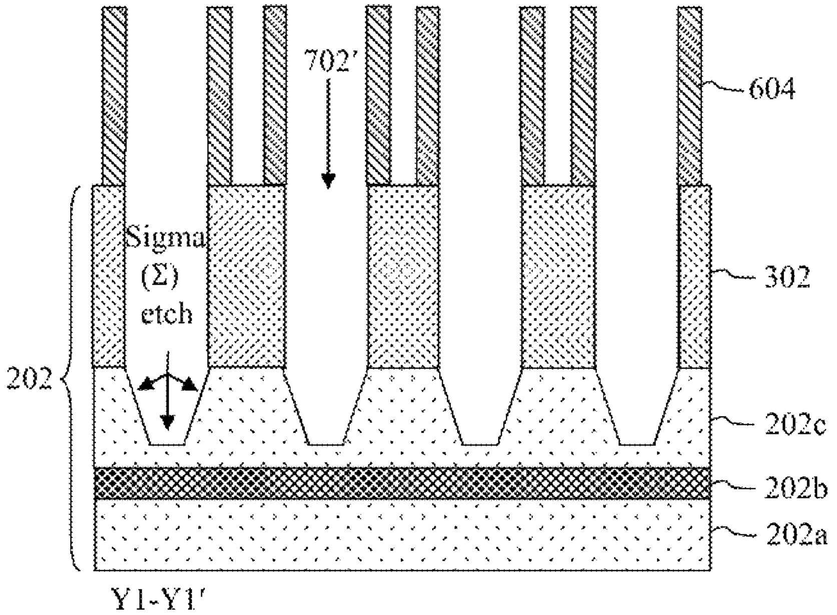
FIG. 8A is a Y1-Y1' cross-sectional view.
Figure 8B:
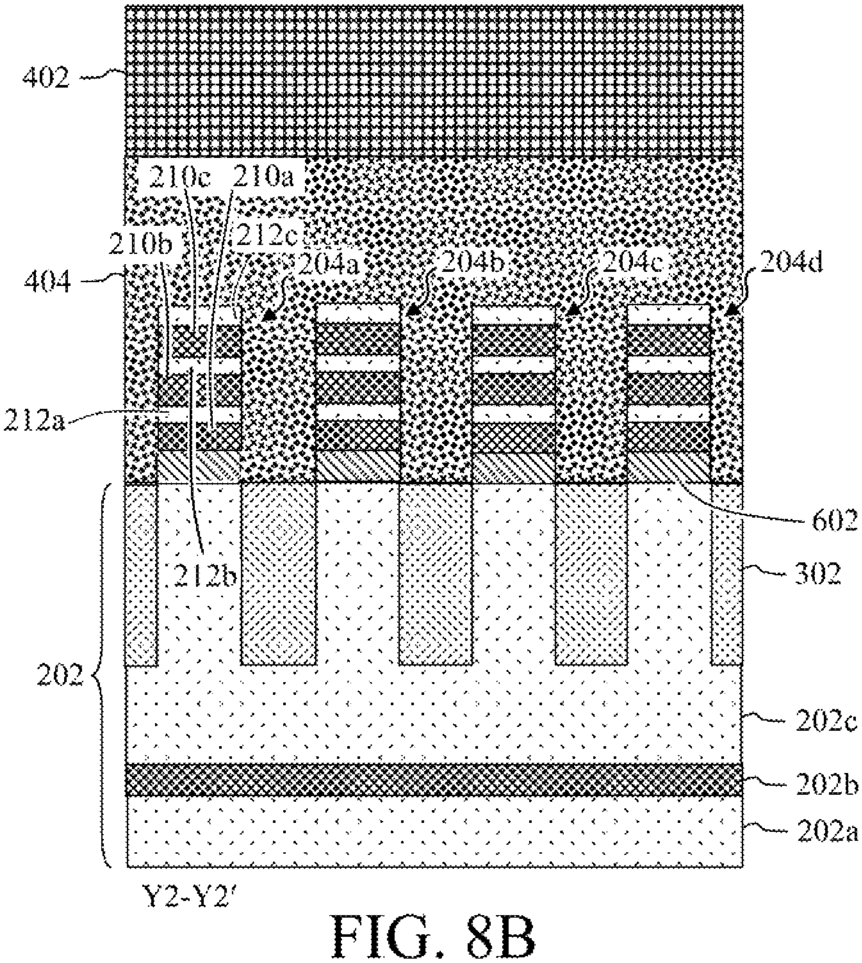
FIG. 8B is a Y2-Y2' cross-sectional view.
Figure 8C:
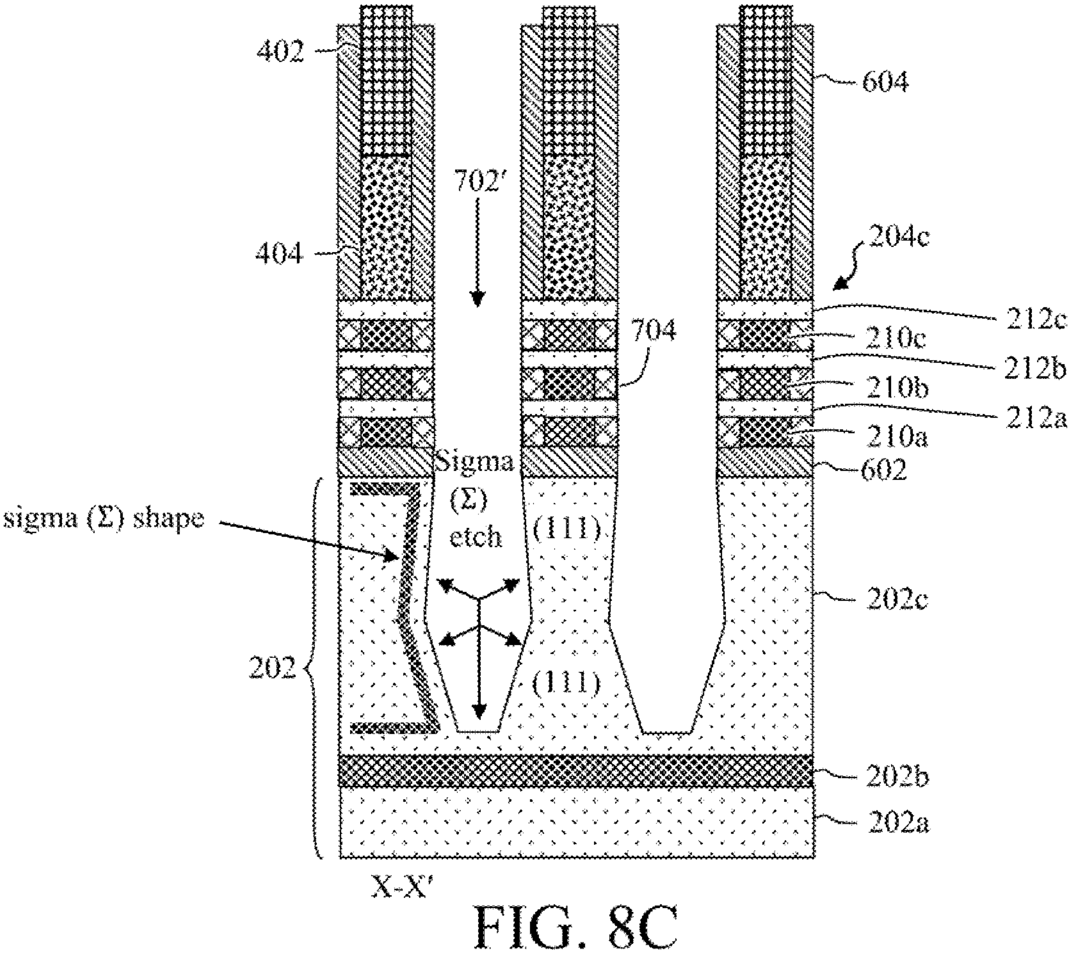
FIG. 8C is an X-X' cross-sectional view illustrating a sigma etch having been performed to change the profile of the trenches, resulting in sigma-shaped trenches according to an embodiment of the present invention.

As shown in FIG. 8A (a Y1-Y1' cross-sectional view), FIG. 8B (a Y2-Y2' cross-sectional view) and FIG. 8C (an X-X' cross-sectional view), a sigma etch is next performed to change the profile of the trenches 702. By 'sigma etch' it is meant that an etch or a combination of etch processes is/are performed to change the shape of trenches 702 (having straight sidewalls) into sigma-shaped trenches, now given the reference numeral 702' (i.e., trenches 702' have sigma or X-shaped sidewalls as shown, e.g., in FIG. 8C). By way of example only, the sigma-shaped trenches 702' can be created using a wet etching process with an etchant including, but not limited to, ammonium hydroxide ($NH_4OH$), tetramethylammonium hydroxide (TMAH; $(CH_3)_4NOH$)), potassium hydroxide (KOH), sodium hydroxide (NaOH), benzoic acid [(thiophen-2-yl)methylene] hydrazide) and/or an amine etchant. For instance, in one exemplary embodiment, the semiconductor layer 202*c* is a single-crystal silicon. In that case, a (111) crystal plane has a relatively high density as compared with other crystal planes. As such, an etching amount of the (111) crystal plane may be saturated during the wet etching process. Thus, following the wet etching process, the sigma-shaped trenches 702' may mainly consist of inner surfaces with a (111) crystal plane, creating the unique sigma shaped profile shown in FIGS. 8A-C.

Figure 9A:
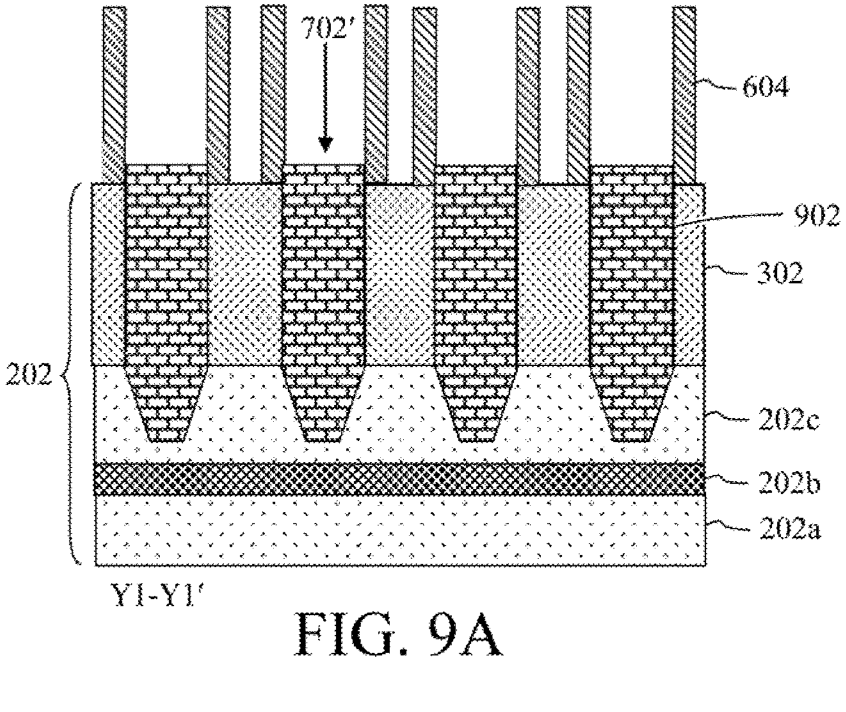
FIG. 9A is a Y1-Y1' cross-sectional view.
Figure 9B:
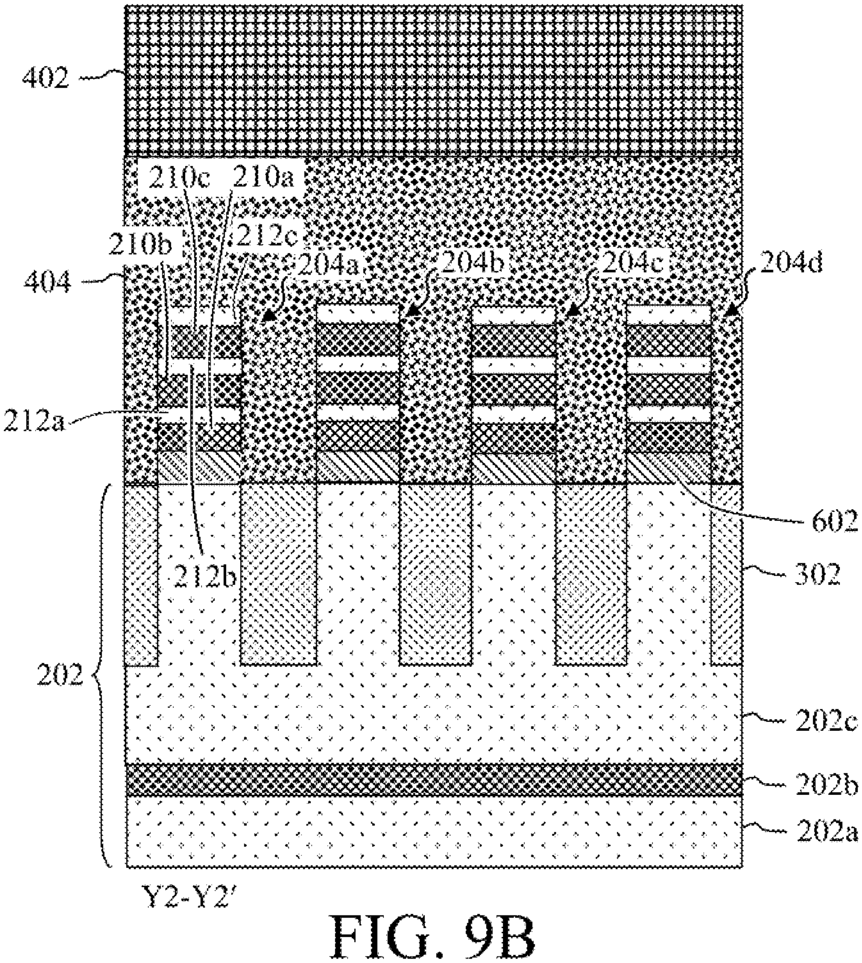
FIG. 9B is a Y2-Y2' cross-sectional view.
Figure 9C:
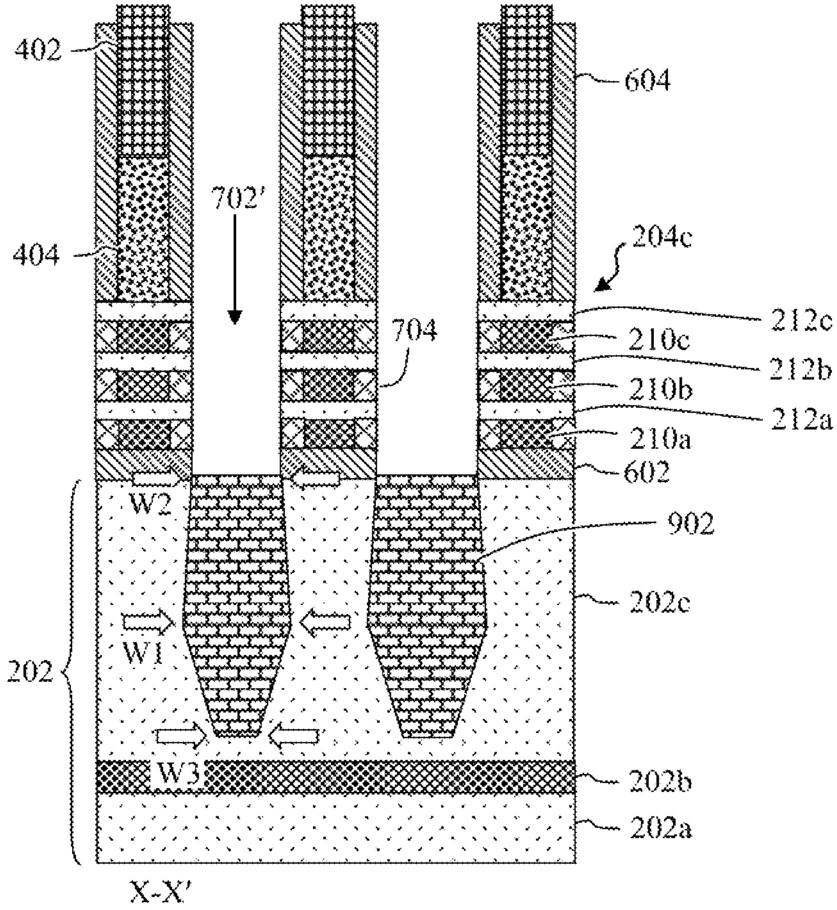
FIG. 9C is an X-X' cross-sectional view illustrating dielectric placeholders having been formed in the sigma-shaped trenches according to an embodiment of the present invention.

As shown in FIG. 9A (a Y1-Y1' cross-sectional view), FIG. 9B (a Y2-Y2' cross-sectional view) and FIG. 9C (an X-X' cross-sectional view), a sacrificial dielectric is deposited into/filling the sigma-shaped trenches 702' and is then recessed to form dielectric placeholders 902 for the present backside source/drain region contacts.

Since they are formed in the sigma-shaped trenches 702', the dielectric placeholders 902 have a uniquely shaped profile. For instance, as shown in FIG. 9C, each dielectric placeholder 902 is widest at its middle and tapers at both ends. Specifically, each dielectric placeholder 902 has a (first) width W1 at its middle, and (second and third) widths W2 and W3 at its opposing ends, where W1 is greater than (>) either W2 or W3. As will be described in detail below, this unique profile shape provides large backside contact misplacement error tolerance and, following removal of the dielectric placeholder 902, vastly improves backside metallization to form the backside source/drain region contacts.

Suitable sacrificial dielectric materials include, but are not limited to, flowable silicon carbide (SiC), silicon oxycarbide (SiOC), or a thin layer (e.g., from about 1 nm to about 3 nm) of SiN lining the sigma-shaped trenches 702' followed by SiOx, which can be deposited using a process such as CVD, plasma-enhanced chemical vapor deposition (PECVD) or ALD. The deposited material overfills the sigma-shaped trenches 702'. Thus, a selective recess etch of the sacrificial dielectric is performed to remove excess material, thereby forming the dielectric placeholders 902 in the sigma-shaped trenches 702' as shown in FIGS. 9A-C.

According to an exemplary embodiment, the sacrificial dielectric material is recessed down to a base of the device stacks 204*a,b,c,d*, etc. Recessing of the sacrificial dielectric material re-opens the sigma-shaped trenches 702' alongside the device stacks 204*a,b,c,d*, etc., which permits source/drain regions of the NFETs and PFETs to be formed in the sigma-shaped trenches 702', alongside the device stacks 204*a,b,c,d*, etc., over the dielectric placeholders 902.

Figure 10A:
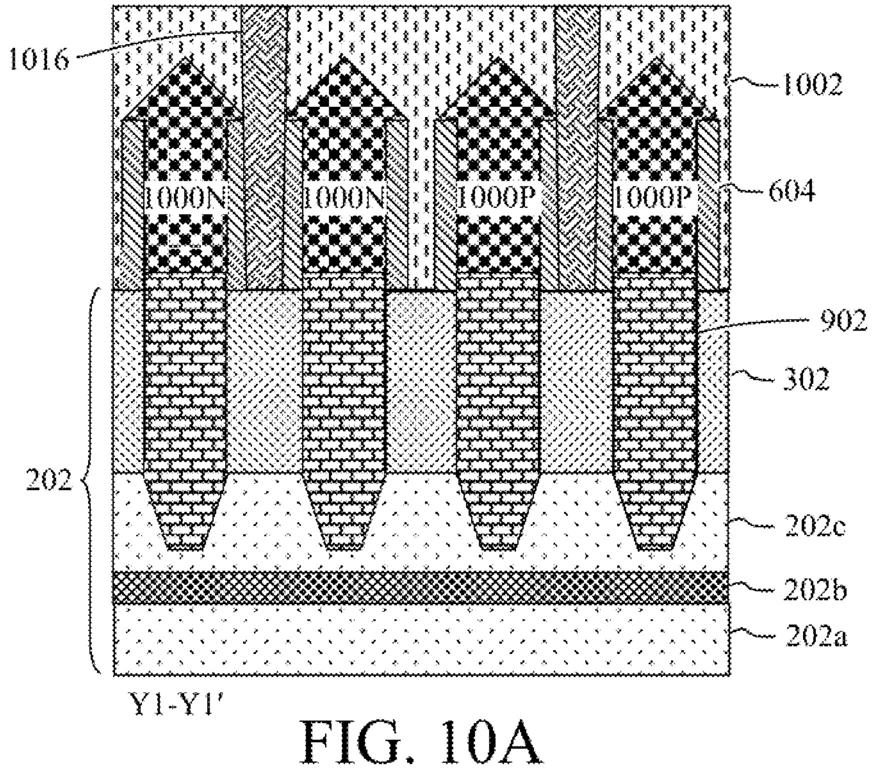
FIG. 10A is a Y1-Y1' cross-sectional view.
Figure 10B:
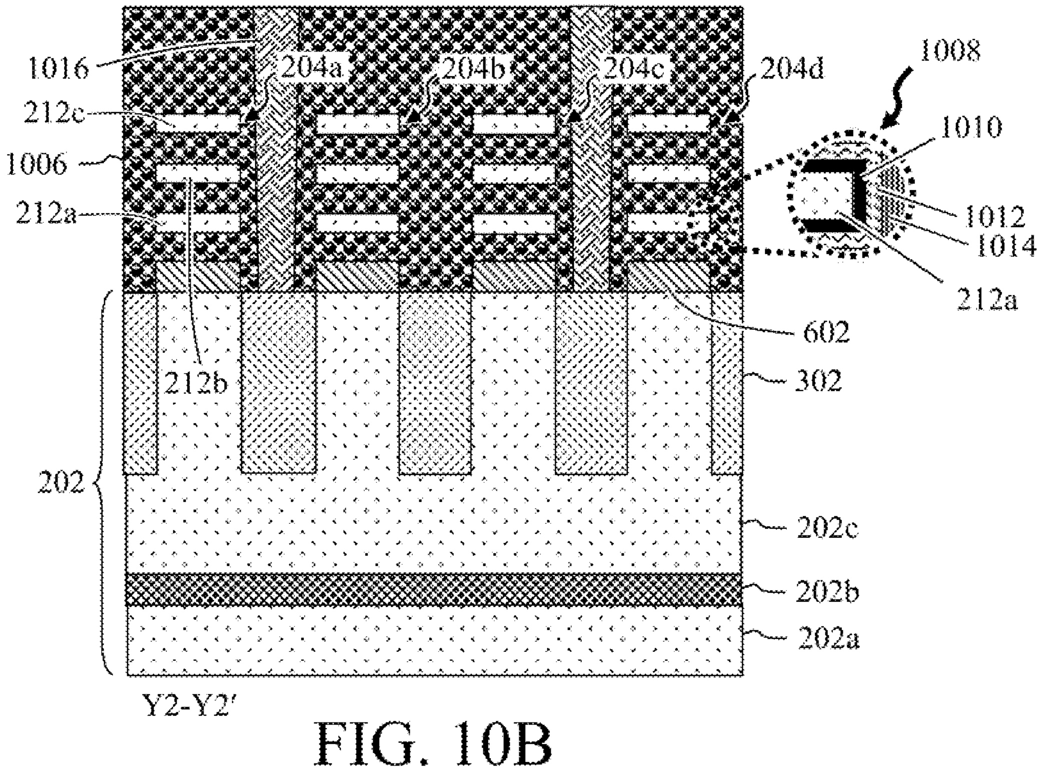
FIG. 10B is a Y2-Y2' cross-sectional view.
Figure 10C:
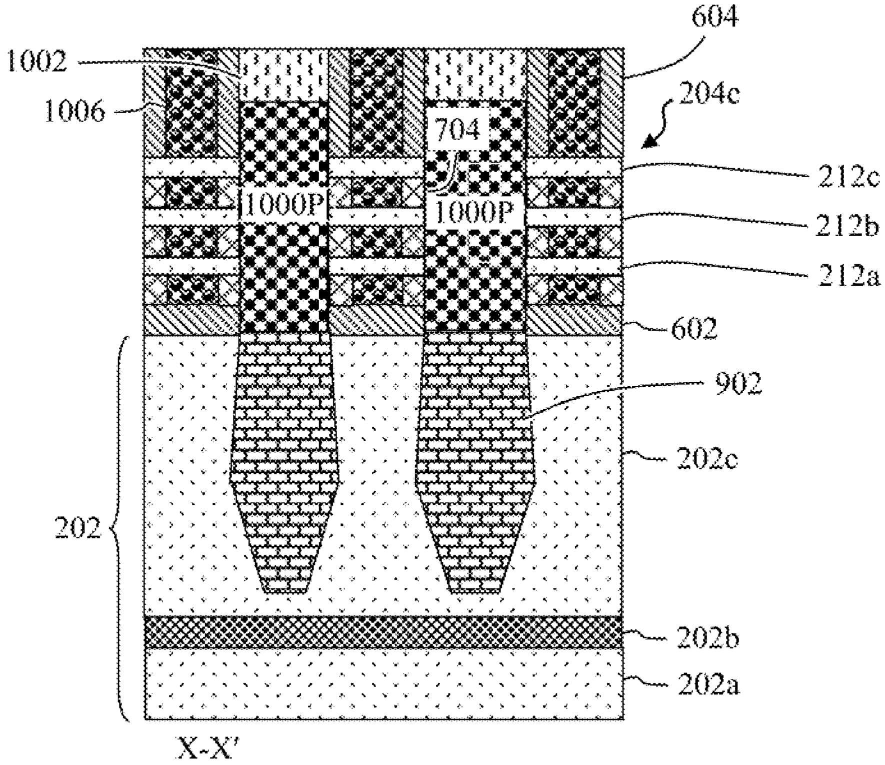
FIG. 10C is an X-X' cross-sectional view illustrating n-channel field-effect transistor (NFET) and p-channel field-effect transistor (PFET) source/drain regions having been formed in the sigma-shaped trenches over the dielectric placeholders, the sacrificial gate hardmasks/sacrificial gates and second sacrificial layers having been removed, replacement gates having been formed surrounding each of the active layers in the device stacks in a gate-all-around configuration, and gate cuts having been formed in the replacement gates according to an embodiment of the present invention.

Namely, as shown in FIG. 10A (a Y1-Y1' cross-sectional view), FIG. 10B (a Y2-Y2' cross-sectional view) and FIG. 10C (an X-X' cross-sectional view), NFET and PFET source/drain regions 1000N and 1000P are next formed in the sigma-shaped trenches 702' over and in direct contact with the dielectric placeholders 902, the sacrificial gate hardmasks 402/sacrificial gates 404 and sacrificial layers 210*a,b,c*, etc. are removed and replaced with replacement gates 1006 that surround each of the active layers 212*a,b,c*, etc. in the device stacks 204*a,b,c,d*, etc. in a gate-all-around configuration, and gate cuts 1016 are formed in the replacement gates 1006 between adjacent (NFET/PFET) device stacks 204*a,b,c,d*, etc.

Specifically, the NFET and PFET source/drain regions 1000N and 1000P are formed in the sigma-shaped trenches 702' on opposite sides of the sacrificial gates 404 alongside the sacrificial layers 210*a,b,c*, etc. and active layers active layers 212*a,b,c*, etc. According to an exemplary embodiment, the NFET and PFET source/drain regions 1000N and 1000P are each formed from an in-situ doped (i.e., during growth) or ex-situ doped (e.g., via ion implantation) epitaxial material such as epitaxial Si, epitaxial SiGe, etc. Suitable n-type dopants for NFET and PFET source/drain regions 1000N include, but are not limited to, phosphorous (P) and/or arsenic (As). Suitable p-type dopants for PFET source/drain regions 1000P include, but are not limited to, boron (B). With inner spacers 704 in place along the sidewalls of the device stacks 204*a,b,c, d*, etc., epitaxial growth of the NFET and PFET source/drain regions 1000N and 1000P is templated only from the ends of the active layers 212*a,b,c*, etc. along the sidewalls of the device stacks 204*a,b,c,d*, etc.

Following formation of the NFET and PFET source/drain regions 1000N and 1000P, an interlayer dielectric 1002 is deposited onto the semiconductor device structure. Suitable interlayer dielectric 1002 materials include, but are not limited to, silicon nitride (SiN), SiOC and/or oxide low-κ materials such as SiOx and/or oxide ULK-ILD materials such as pSiCOH, which can be deposited onto the semiconductor device structure using a process such as CVD, ALD or PVD. According to an exemplary embodiment, the interlayer dielectric 1002 is a different dielectric material from the shallow trench isolation regions 302 (e.g., interlayer dielectric 1002 can be SiN, and the shallow trench isolation regions 302 can be SiOx). Following deposition, the interlayer dielectric 1002 can be planarized using a process such as chemical mechanical polishing. According to an exemplary embodiment, this chemical mechanical polishing serves to remove the sacrificial gate hardmasks 402 thereby exposing the underlying sacrificial gates 404.

Removal of the sacrificial gates 404 exposes the underlying device stacks 204*a,b,c,d*, etc. which enables the selective removal of the sacrificial layers 210*a,b,c*, etc. According to an exemplary embodiment, sacrificial layers 210*a,b,c*, etc. are formed from SiGe, while active layers 212*a,b,c*, etc. are formed from Si. In that case, etchants such as wet hot SC1, vapor phase HCl, vapor phase $ClF_3$ and/or other reactive clean processes can be employed to remove the sacrificial layers 210*a,b,c*, etc., selective to the active layers 212*a,b,c*, etc. Removal of the sacrificial layers 210*a,b,c*, etc. releases the active layers 212*a,b,c*, etc. from the device stacks 204*a,b,c,d*, etc. These 'released' active layers 212*a,b,c*, etc. will be used to form the channels of the NFET and PFET transistors on the frontside of the wafer 202.

Replacement gates 1006 are then formed surrounding a portion of each of the active layers 212*a,b,c*, etc. in a gate-all-around configuration. The simple term 'gates' may also be used herein when referring to replacement gates 1006. Referring to magnified view 1008 in FIG. 10B, according to an exemplary embodiment, formation of the replacement gates 1006 begins with the deposition of a (conformal) gate dielectric 1010 onto/surrounding each of the active layers 212*a,b,c*, etc. According to an exemplary embodiment, the gate dielectric 1010 is a high-κ material. The term "high-κ," as used herein, refers to a material having a relative dielectric constant κ which is much higher than that of silicon dioxide (e.g., a dielectric constant κ=25 for hafnium oxide ($HfO_2$) rather than 4 for $SiO_2$). Suitable high-κ gate dielectrics include, but are not limited to, hafnium oxide ($HfO_2$) and/or lanthanum oxide ($La_2O_3$). A process such as CVD, ALD or PVD can be employed to deposit the gate dielectric 1010. According to an exemplary embodiment, gate dielectric 1010 has a thickness of from about 1 nm to about 5 nm and ranges therebetween. A reliability anneal can be performed following deposition of the gate dielectric 1010. In one exemplary embodiment, the reliability anneal is performed at a temperature of from about 500° C. to about 1200° C. and ranges therebetween, for a duration of from about 1 nanosecond to about 30 seconds and ranges therebetween. Preferably, the reliability anneal is performed in the presence of an inert gas such as, but not limited to, nitrogen.

At least one workfunction-setting metal 1012 is then deposited over the gate dielectric 1010. Suitable n-type workfunction-setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction-setting metals include, but are not limited to, TiN, TaN, and/or tungsten (W). TiN and TaN are relatively thick (e.g., greater than about 2 nm) when used as p-type workfunction-setting metals. However, very thin TiN or TaN layers (e.g., less than about 2 nm) may also be used beneath Al-containing alloys in n-type workfunction-setting stacks to improve electrical properties such as gate leakage currents. Thus, there is some overlap in the exemplary n- and p-type workfunction-setting metals given above. A process such as CVD, ALD or PVD can be employed to deposit the workfunction-setting metal (s) 1012, after which the metal overburden can be removed using a process such as chemical mechanical polishing.

Optionally, a (low-resistance) fill metal 1014 can be deposited over the workfunction-setting metal(s) 1012 so as to fill in any remaining spaces in the replacement gates 1006. Suitable low-resistance fill metals 1014 include, but are not limited to, W, cobalt (Co), ruthenium (Ru) and/or Al which can be deposited using a process or combination of processes including, but not limited to, CVD, ALD, PVD, sputtering, plating, evaporation, ion beam deposition, electron beam deposition, laser assisted deposition, chemical solution deposition, etc.

Figure 11:
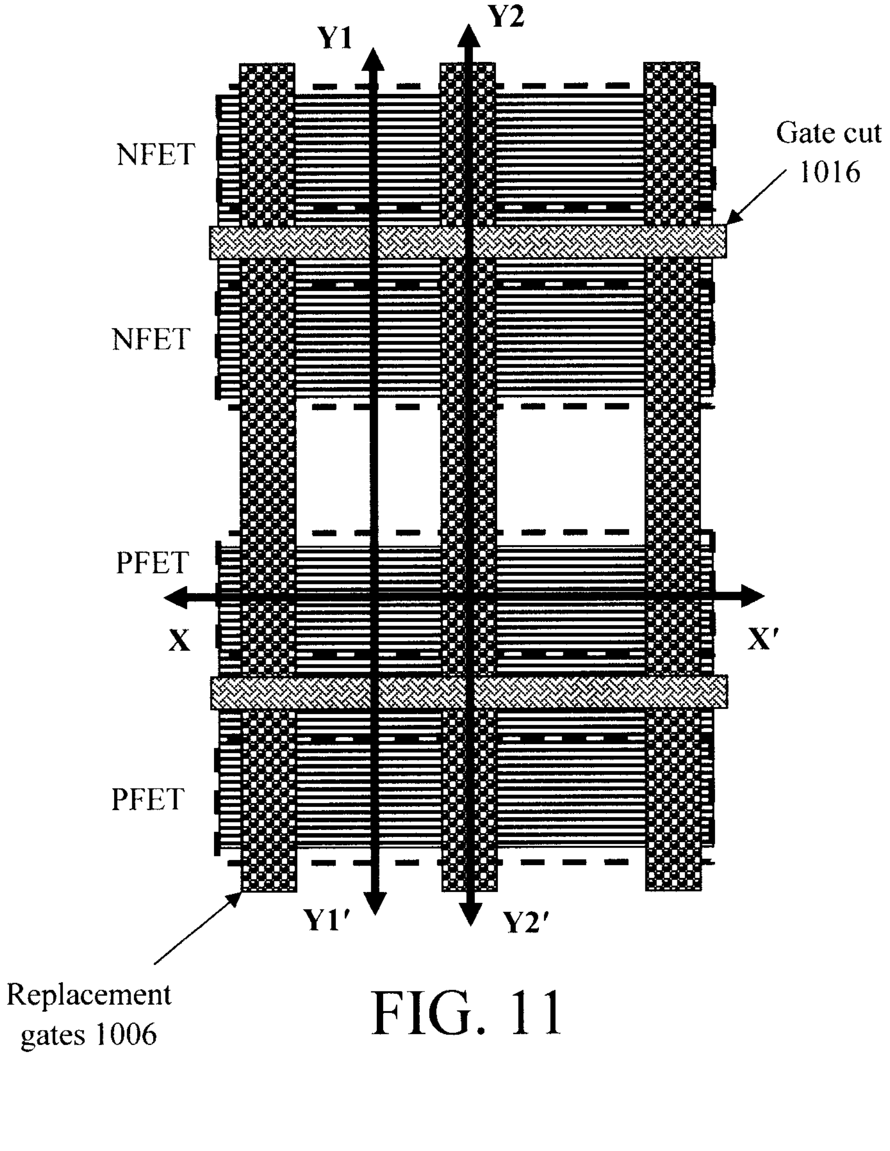
FIG. 11 is a top-down diagram illustrating an orientation of the gate cuts across the replacement gates according to an embodiment of the present invention.

To form the gates cuts 1016, gate cut openings are created in the replacement gates 1006 between adjacent (NFET and PFET) device stacks 204*a,b,c,d*, etc. Standard lithography and etching techniques (see above) can be employed to pattern the gate cut openings in the replacement gates 1006. The gate cut openings are then filled with a gate cut dielectric material to form the gate cuts 1016 which will serve to isolate the gates of the respective NFET and PFET transistors. Thus, what is visible as the gates cuts 1016 in the figures is the gate cut dielectric material. Suitable gate cut dielectric materials include, but are not limited to, SiN, SiOx, SiC and/or SiCO, which can be deposited into the gate cut openings using a process such as CVD, ALD or PVD. Following deposition, the excess gate cut dielectric material can be removed using a process such as chemical mechanical polishing. For clarity, a top-down diagram is provided in FIG. 11 to illustrate the orientation of the gate cuts 1016 along the replacement gates 1006 with respect to the positioning of the PFET and NFET transistors. Notably, as shown in FIG. 11, the gates cuts 1016 are present across each of the replacement gates 1006 on the frontside of the wafer 202.

As shown in FIGS. 10A-C, a plurality of NFET and PFET transistors are now present on the frontside of the wafer 202. Each of the NFET and PFET transistors includes a stack of the active layers 212*a,b,c*, etc., a replacement gates 1006 gate (or simply a 'gate') surrounding the active layers 212*a,b,c*, etc. in a gate-all-around configuration, and source/drain regions 1000N and 1000P, respectively, on opposite sides of the stack of active layers 212*a,b,c*, etc.

Figure 12A:
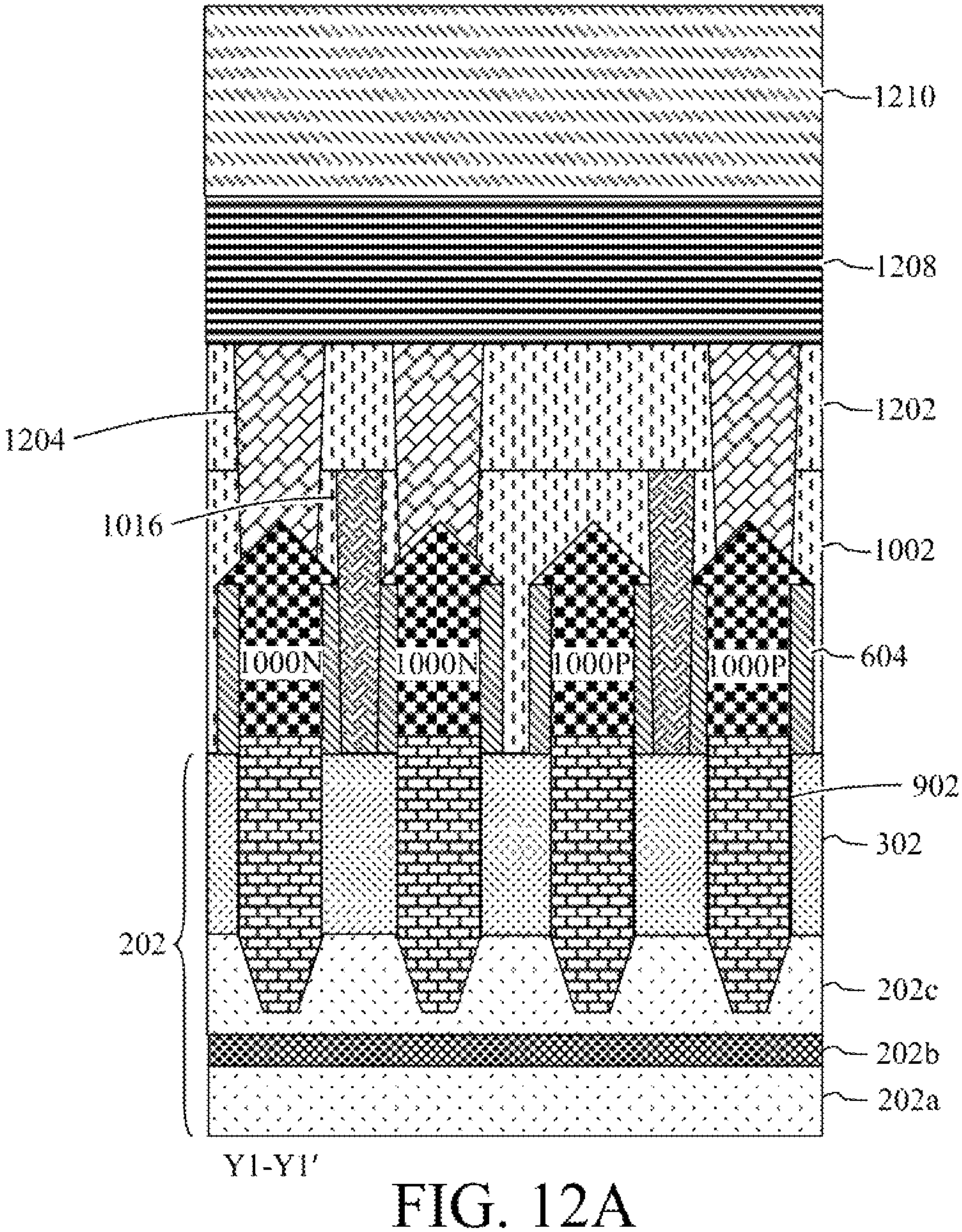
FIG. 12A is a Y1-Y1' cross-sectional view.
Figure 12B:
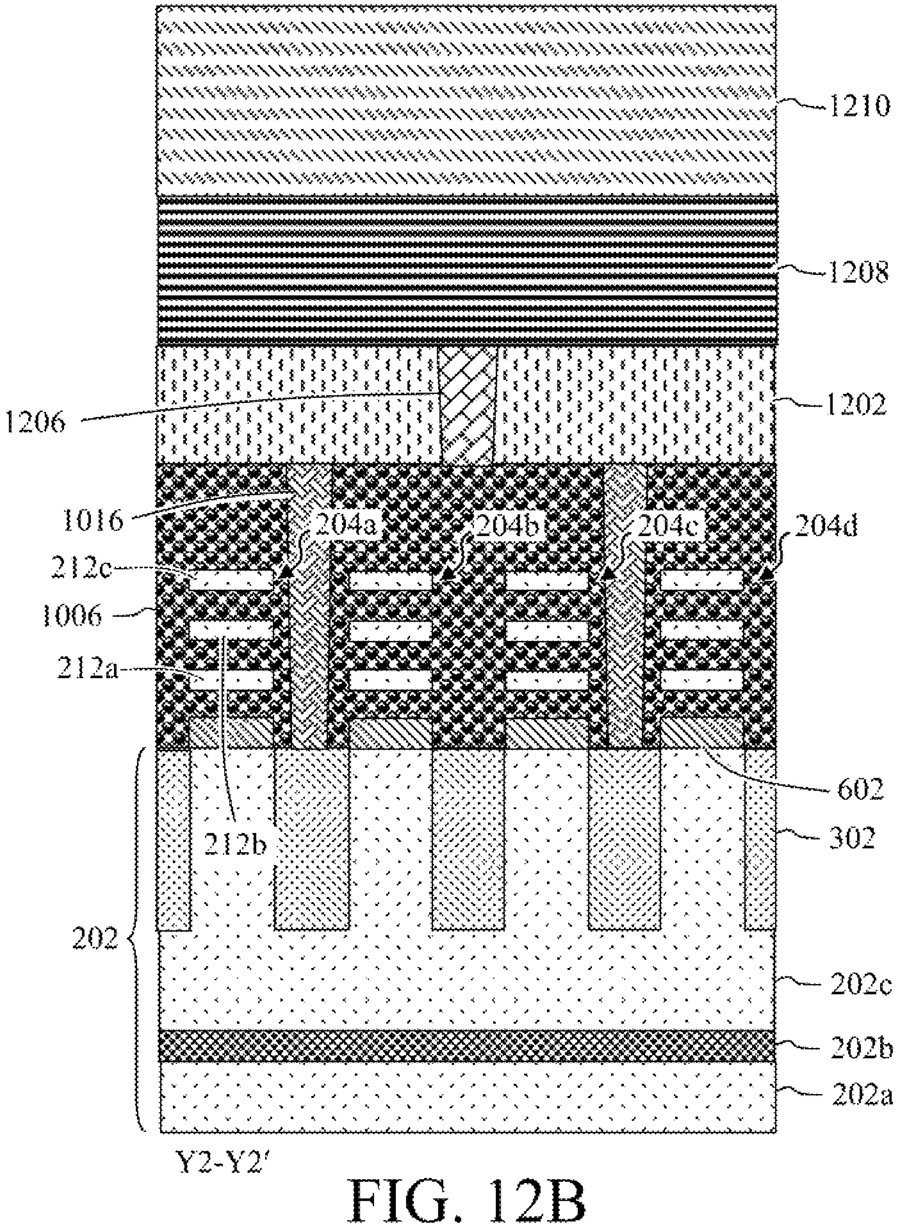
FIG. 12B is a Y2-Y2' cross-sectional view.
Figure 12C:
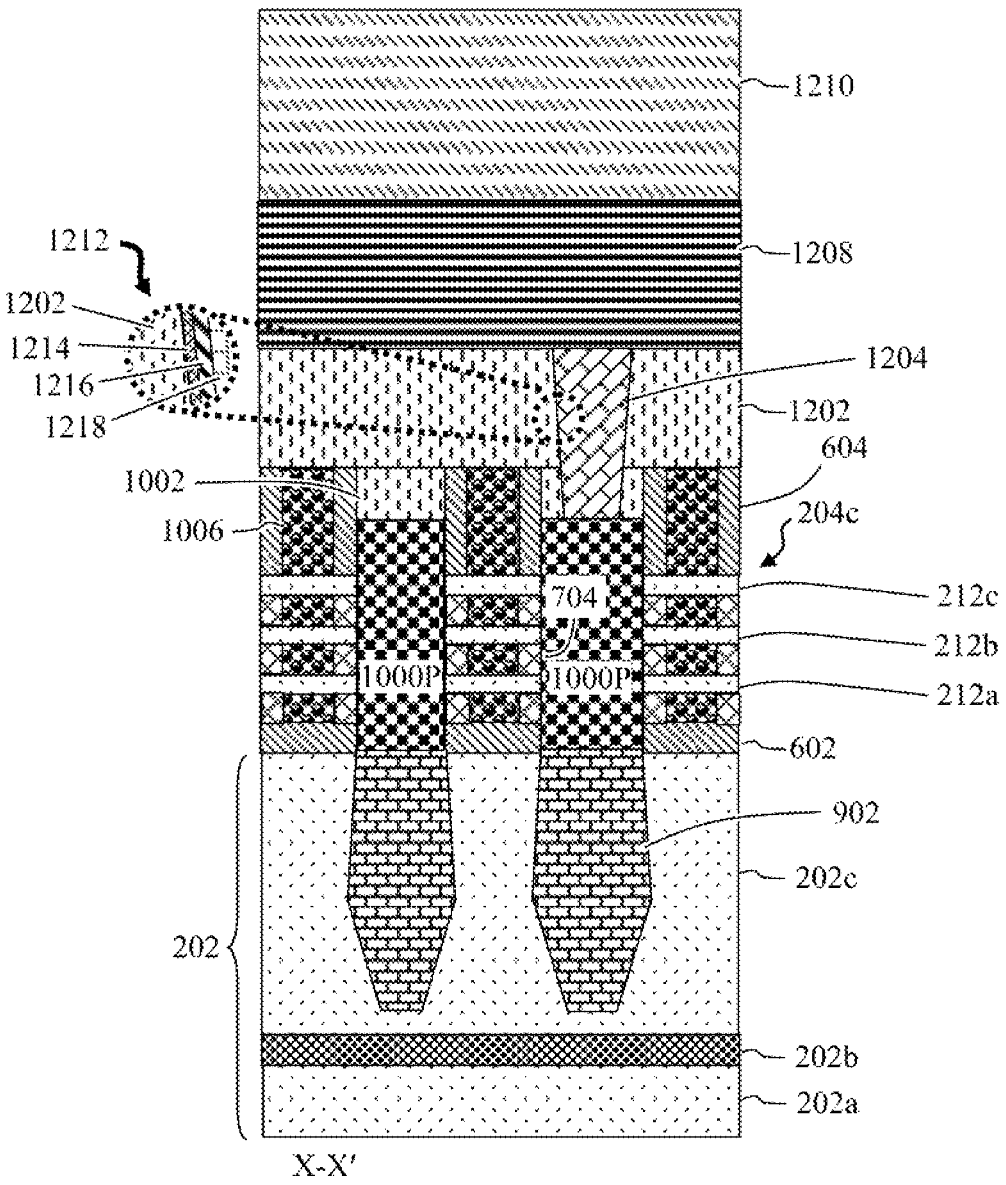
FIG. 12C is an X-X' cross-sectional view illustrating middle of line source/drain region contacts and gate contacts having been formed, followed by a back end of line interconnect layer, and a frontside of the wafer having been bonded to a carrier wafer according to an embodiment of the present invention.

As shown in FIG. 12A (a Y1-Y1' cross-sectional view), FIG. 12B (a Y2-Y2' cross-sectional view) and FIG. 12C (an X-X' cross-sectional view), middle of line source/drain region contacts 1204 and gate contacts 1206 are next formed, followed by back end of line interconnect layer 1208, and bonding of the frontside of the wafer 202 (via back end of line interconnect layer 1208) to a carrier wafer 1210. Namely, as will be described in detail below, carrier wafer 1210 will enable wafer 202 to be flipped over for backside processing, which includes the formation of the present backside source/drain region contacts and backside power rails.

First, an interlayer dielectric 1202 is deposited onto the interlayer dielectric 1002 over the semiconductor device structure. For clarity, the terms 'first' and 'second' may also be used herein when referring to interlayer dielectric 1002 and interlayer dielectric 1202, respectively. Suitable interlayer dielectric 1202 materials include, but are not limited to, SiN, SiOC and/or oxide low-κ materials such as SiOx and/or oxide ULK-ILD materials such as pSiCOH, which can be deposited using a process such as CVD, ALD or PVD. Following deposition, the interlayer dielectric 1202 can be planarized using a process such as chemical mechanical polishing.

Standard lithography and etching techniques (see above) are then used to pattern trenches in the interlayer dielectrics 1002/1202 over the NFET and PFET source/drain regions 1000N and 1000P and over the replacement gates 1006, followed by metallization to form the middle of line source/drain region contacts 1204 and gate contacts 1206, respectively. Referring to magnified view 1212 in FIG. 12C, the metallization can include first depositing a silicide liner 1214 into and lining the trenches, depositing a metal adhesion layer 1216 onto the silicide liner 1214, and then depositing a fill metal 1218 onto the metal adhesion layer 1216. Suitable silicide liner 1214 materials include, but are not limited to, titanium (Ti), nickel (Ni) and/or nickel platinum (NiPt), which can be deposited using a process such as CVD, ALD or PVD. According to an exemplary embodiment, silicide liner 1214 has a thickness of from about 1 nm to about 5 nm. Suitable metal adhesion layer 1216 materials include, but are not limited to, TiN and/or TaN, which can be deposited onto the silicide liner 1214 using a process such as CVD, ALD or PVD. According to an exemplary embodiment, metal adhesion layer 1216 has a thickness of from about 1 nm to about 5 nm. Suitable fill metals 1218 include, but are not limited to, W, Co. Ru and/or Al, which can be deposited onto the metal adhesion layer 1216 using a process such as CVD, ALD, PVD, sputtering, plating, evaporation, ion beam deposition, electron beam deposition, laser assisted deposition, chemical solution deposition, etc. Following deposition, the overburden can be removed using a process such as chemical mechanical polishing. While magnified view 1212 is of one of the middle of line source/drain region contacts 1204, it is to be understood that the middle of line gate contacts 1206 can have the same above-described configuration and be formed in the same manner as the middle of line source/drain region contacts 1204.

Back end of line interconnect layer 1208 generally includes interconnect structures commonly formed in the back end of line during semiconductor device fabrication. Namely, in the back end of line, individual devices such as transistors get interconnected through a series of metal layers. For instance, conductive structures like vias and metal lines can be employed to connect a device to one or more other devices, with the metal lines making lateral connections and the vias making vertical connections amongst different metallization levels. Standard metallization techniques can be employed to form the back end of line interconnect layer 1208. While the individual interconnects present in back end of line interconnect layer 1208 are not specifically shown in the figures, one skilled in the art would understand how such a back end of line interconnect layer 1208 is implemented for a given semiconductor device application.

Carrier wafer 1210 is then bonded to the frontside of wafer 202 over back end of line interconnect layer 1208. Suitable carrier wafers include, but are not limited to, silicon, silicon carbide and/or glass wafers. As will be described in detail below, the use a carrier wafer 1210 will enable wafer 202 to be flipped, thereby permitting the necessary backside processing for the backside source/drain region contacts and backside power rails.

Figure 13A:
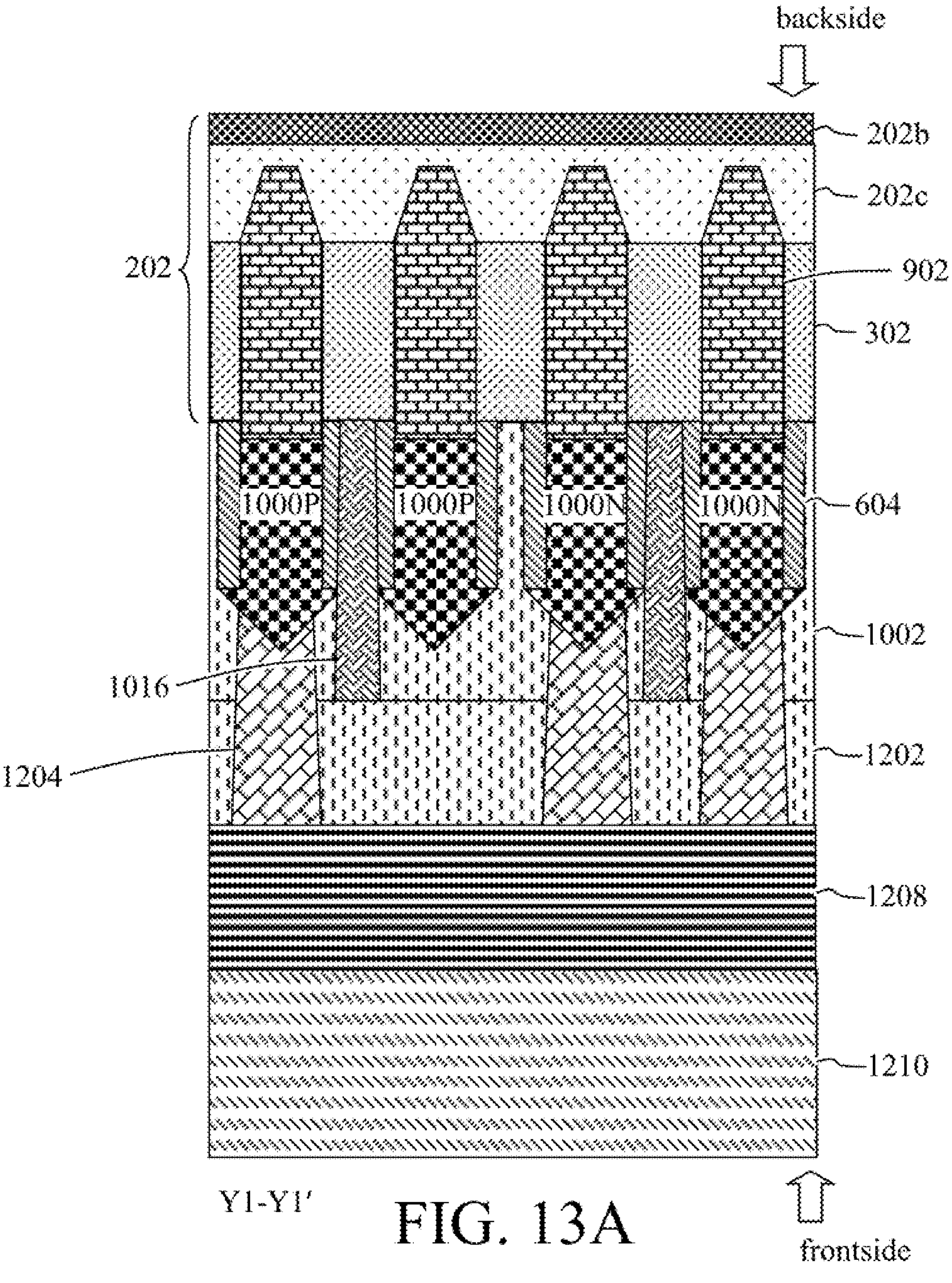
FIG. 13A is a Y1-Y1' cross-sectional view.
Figure 13B:
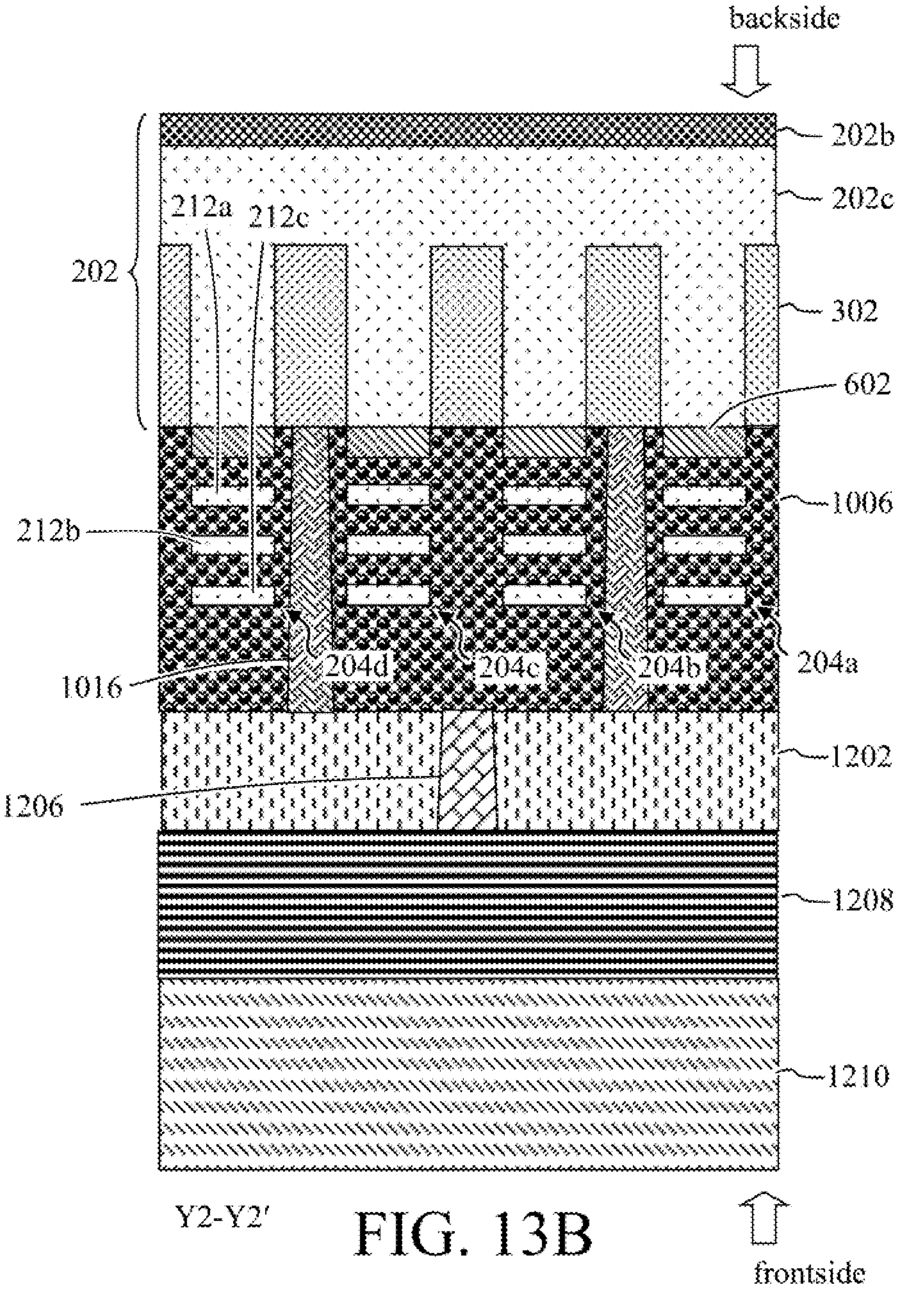
FIG. 13B is a Y2-Y2' cross-sectional view.
Figure 13C:
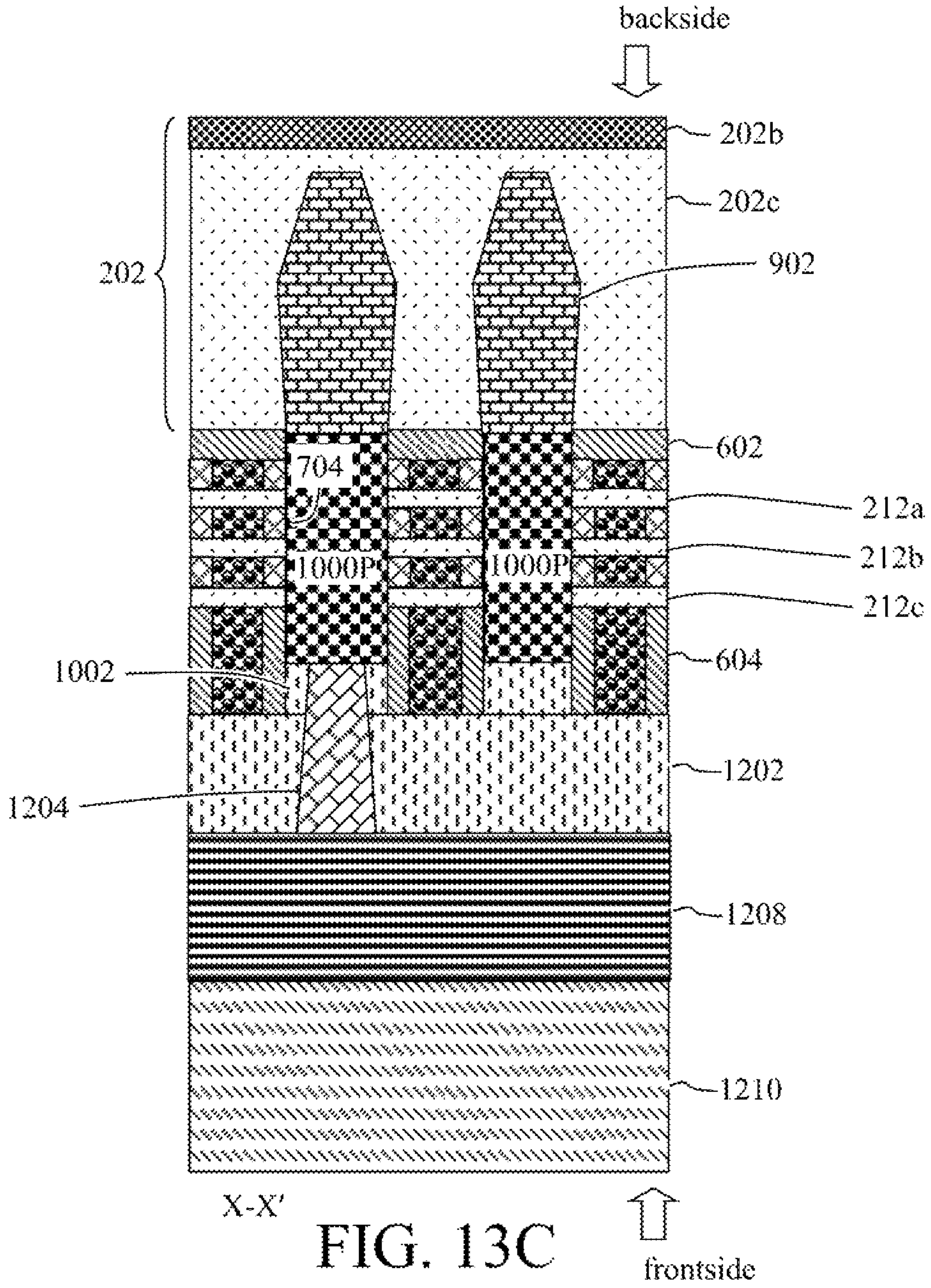
FIG. 13C is an X-X' cross-sectional view illustrating the wafer having been flipped, and an etch having been performed to remove the substrate, stopping on the etch stop layer according to an embodiment of the present invention.

Namely, as shown in FIG. 13A (a Y1-Y1' cross-sectional view), FIG. 13B (a Y2-Y2' cross-sectional view) and FIG. 13C (an X-X' cross-sectional view), the wafer 202 is flipped over and an etch is used to remove the substrate 202*a*, stopping on the etch stop layer 202*b*. Following the flip and substrate 202*a* removal, what was once at the bottom of wafer 202 is now on the top, and vice versa. For instance, etch stop layer 202*b* is now the top-most layer, and carrier wafer 1210 is at the bottom. Accordingly, what has been designated the frontside and backside of the wafer 202 is now also reversed by the flip. Namely, the backside of the wafer 202 is now at the top of each figure, and the frontside of the wafer 202 is at the bottom of each figure. Thus, following the flip, 'frontside' and 'backside' labels are added for clarity.

As provided above, etch stop layer 202*b* can be formed from SiGe or an oxide material, and the substrate 202*a* can be formed from Si. In that case, an Si-selective etch can be used to remove the substrate 202*a*.

Figure 14A:
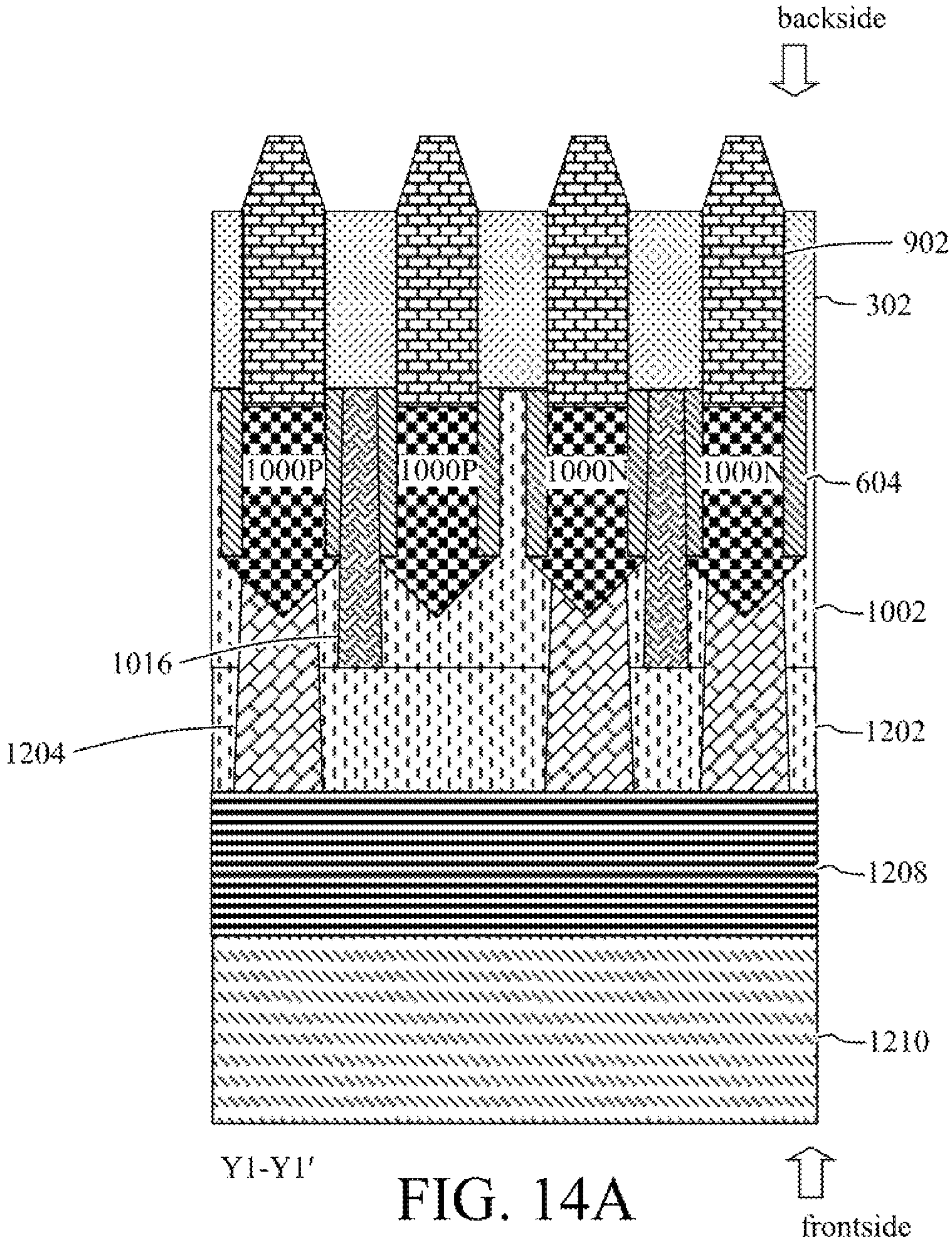
FIG. 14A is a Y1-Y1' cross-sectional view.
Figure 14B:
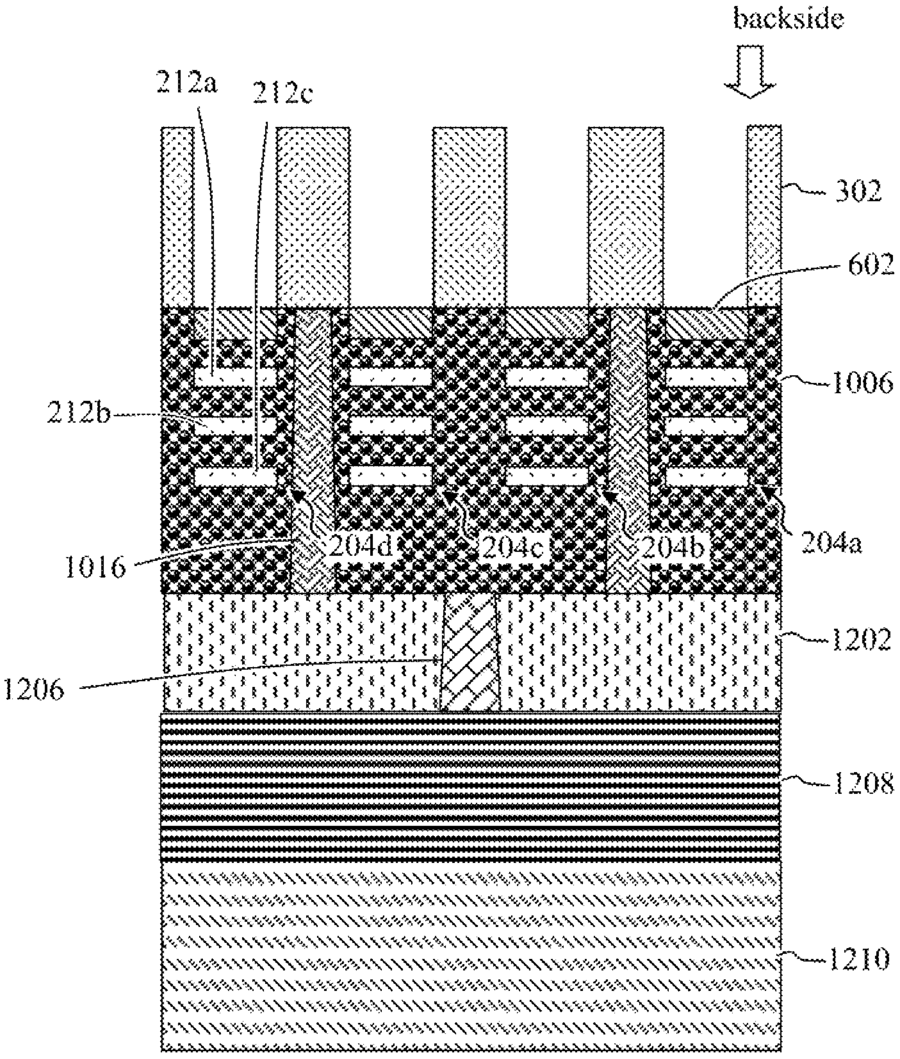
FIG. 14B is a Y2-Y2' cross-sectional view.
Figure 14C:
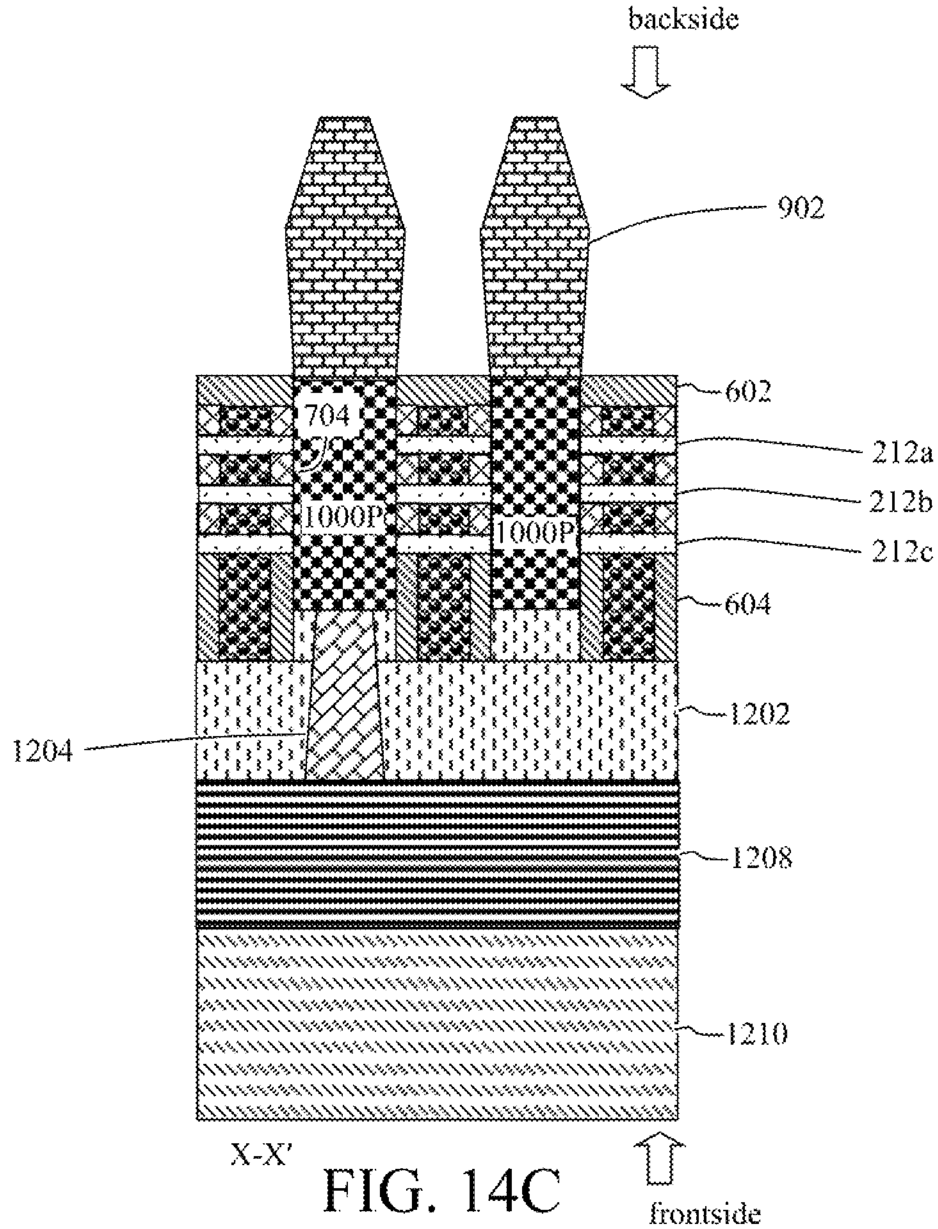
FIG. 14C is an X-X' cross-sectional view illustrating the etch stop layer and remaining semiconductor layer having been removed according to an embodiment of the present invention.

As shown in FIG. 14A (a Y1-Y1' cross-sectional view), FIG. 14B (a Y2-Y2' cross-sectional view) and FIG. 14C (an X-X' cross-sectional view), the etch stop layer 202*b* and remaining semiconductor layer 202*c* are removed. As provided above, the etch stop layer 202*b* can be formed from SiGe or an oxide material, and the semiconductor layer 202*c* can be formed from Si. In that case, the etch stop layer 202*b* can be removed using a SiGe or oxide-selective, followed by an Si-selective etch to remove what remains of the semiconductor layer 202*c*.

It is notable that semiconductor layer 202*c* was the last remaining part of the wafer 202. Thus, the wafer 202 is now fully removed from the semiconductor device structure. However, reference will still be made hereinafter to the 'frontside' and 'backside' of the semiconductor device structure which, as shown in the figures, is based on the same orientation of the same structures as they were originally built on the wafer 202, i.e., the NFET and PFET transistors are on the frontside of the semiconductor device structure (as they were on the wafer 202), the backside power rails will be fabricated on the backside of the semiconductor device structure (see below), and so on.

Figure 15A:
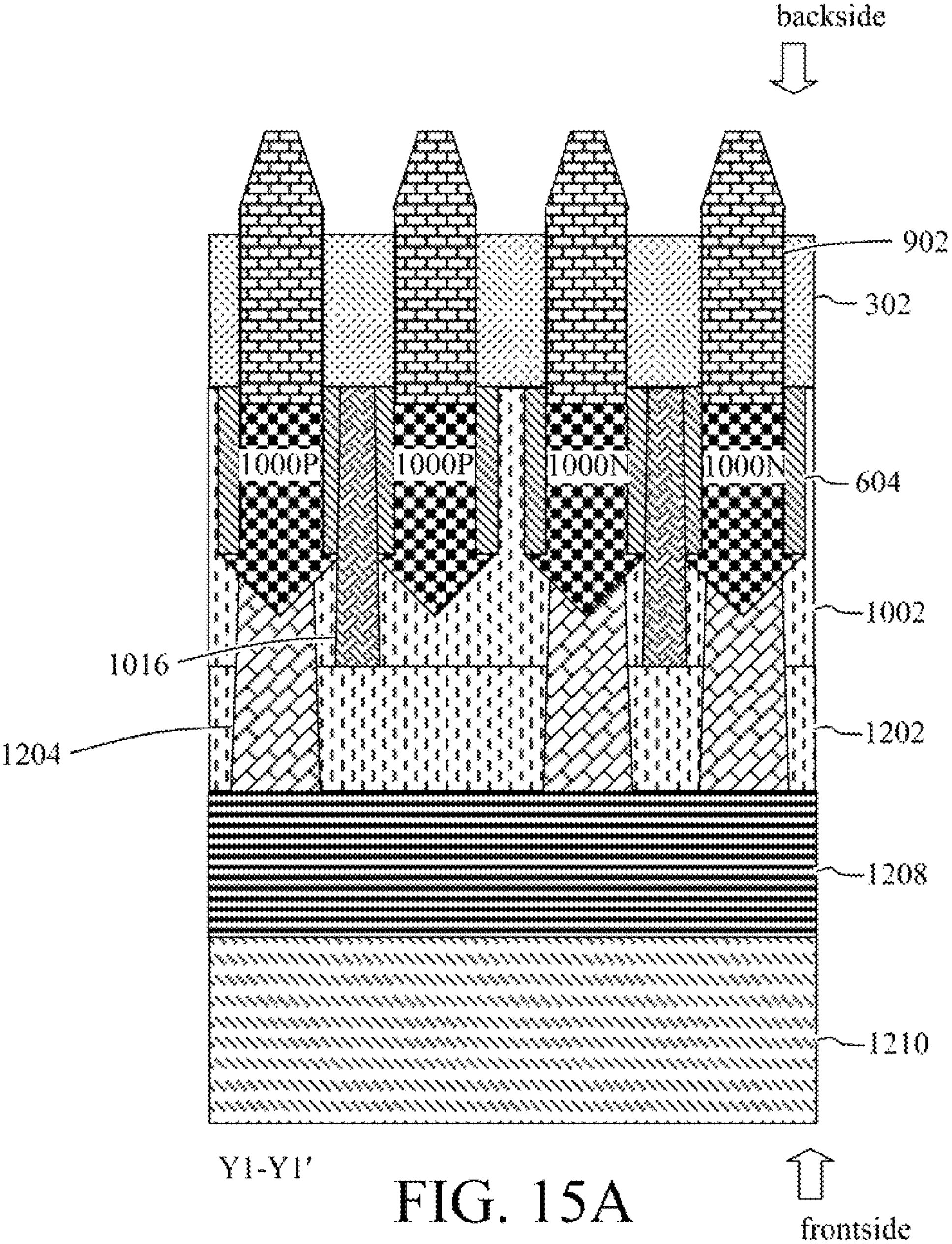
FIG. 15A is a Y1-Y1' cross-sectional view.
Figure 15B:
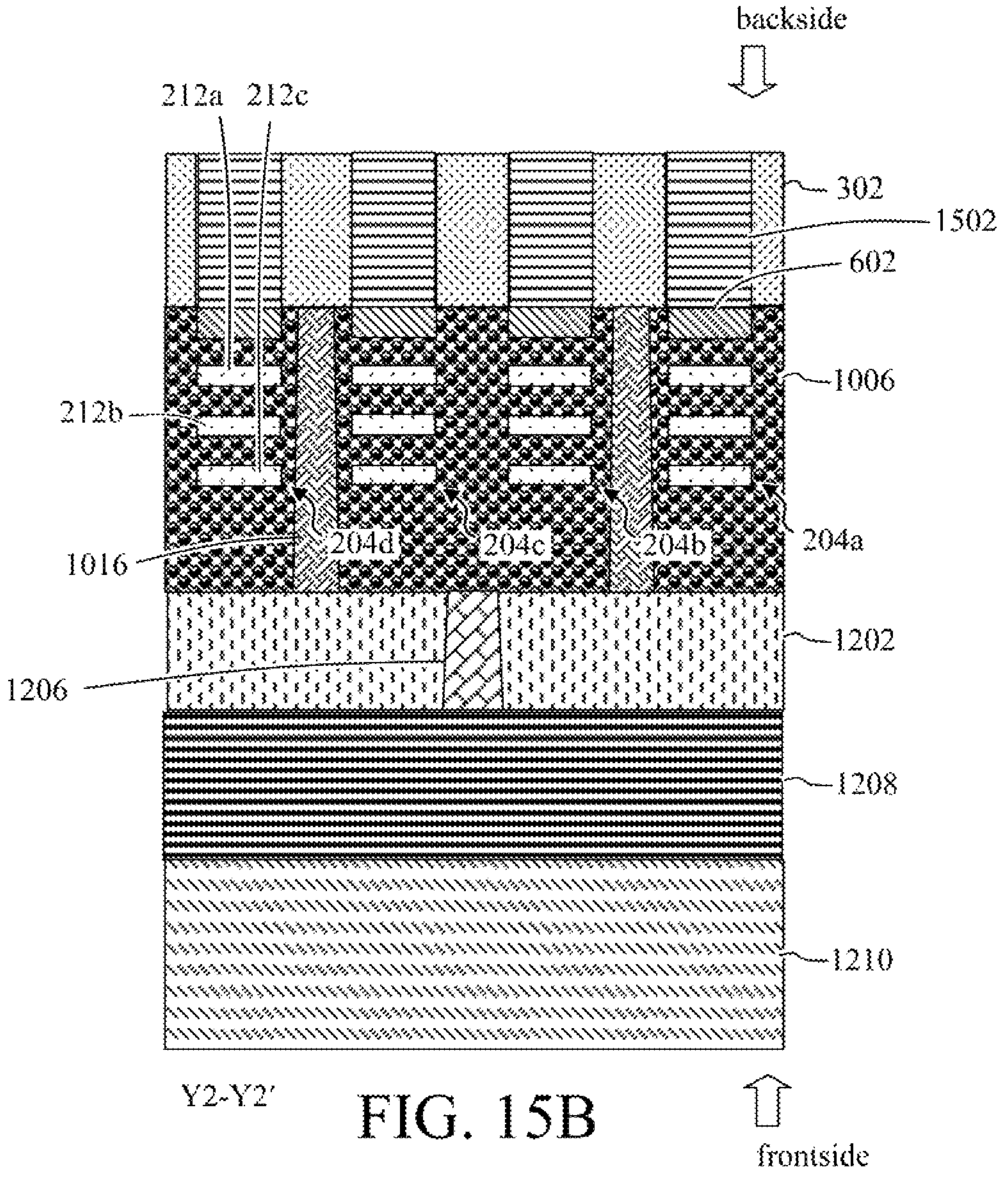
FIG. 15B is a Y2-Y2' cross-sectional view.
Figure 15C:
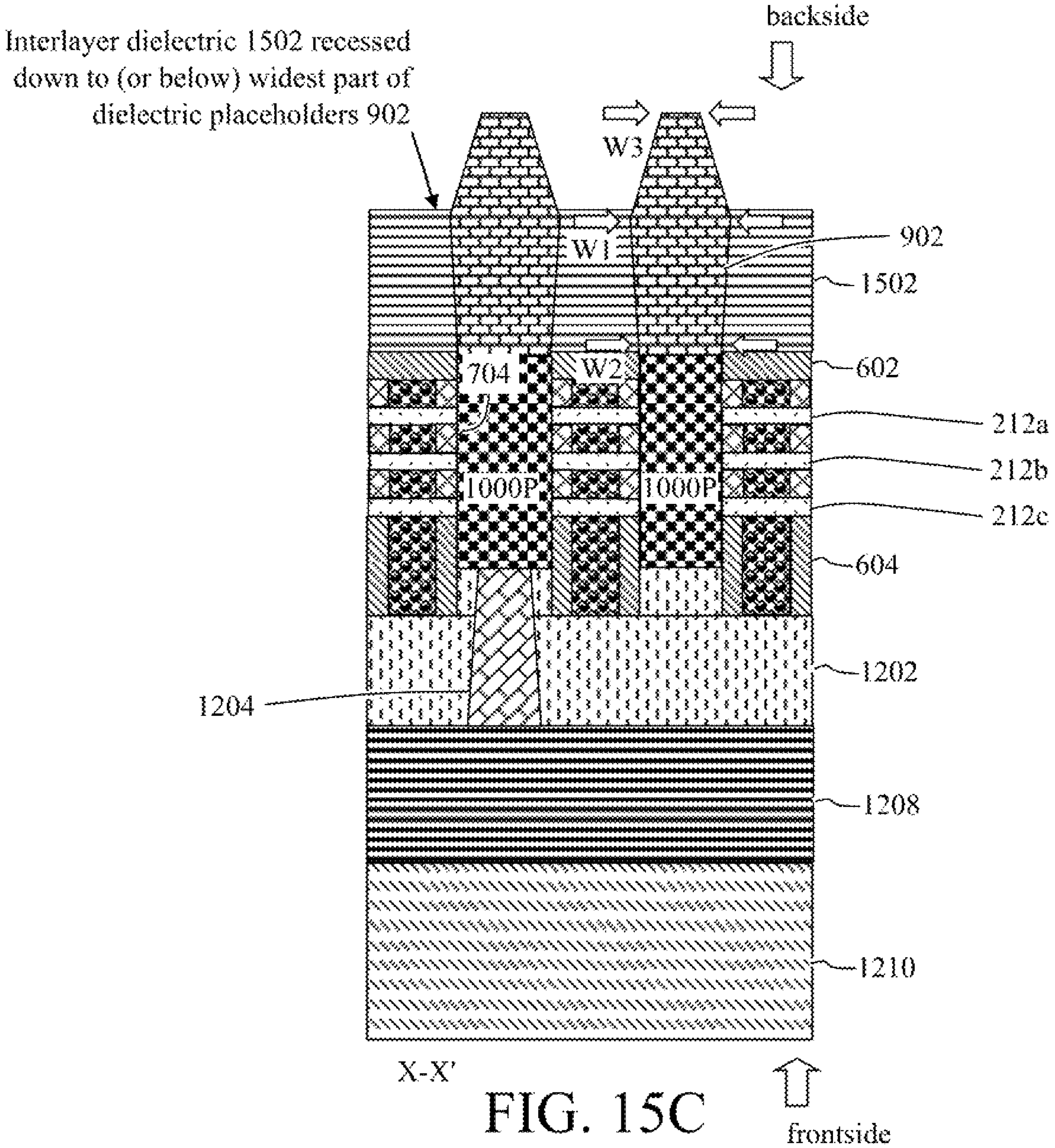
FIG. 15C is an X-X' cross-sectional view illustrating a (backside) interlayer dielectric having been deposited over the shallow trench isolation regions (filling the spaces between the shallow trench isolation regions left by removal of the semiconductor layer), and then having been recessed according to an embodiment of the present invention.

As shown in FIG. 15A (a Y1-Y1' cross-sectional view), FIG. 15B (a Y2-Y2' cross-sectional view) and FIG. 15C (an X-X' cross-sectional view), a (backside) interlayer dielectric 1502 is next deposited over and surrounding the shallow trench isolation regions 302 (filling the spaces between the shallow trench isolation regions 302 left by removal of the semiconductor layer 202*c*), and the (backside) interlayer dielectric 1502 is then recessed. For clarity, the term 'third' may also be used herein when referring to interlayer dielectric 1502 so as to distinguish it from the 'first' interlayer dielectric 1002 and the 'second' interlayer dielectric 1202.

Suitable interlayer dielectric 1502 materials include, but are not limited to, SiN, SiOC and/or oxide low-K materials such as SiOx and/or oxide ULK-ILD materials such as pSiCOH, which can be deposited using a process such as CVD, ALD or PVD. In one embodiment, the interlayer dielectric 1502 includes a same or similar material as the shallow trench isolation regions 302. For instance, by way of example only, interlayer dielectric 1502 and shallow trench isolation regions 302 can both be formed from SiOx. Following deposition, the interlayer dielectric 1502 can be planarized using a process such as chemical mechanical polishing. An etch is then performed to recess the interlayer dielectric 1502 down to the shallow trench isolation regions 302. For instance, according to an exemplary embodiment, following the recess etch a top surface of the interlayer dielectric 1502 is coplanar with the top surfaces of the trench isolation regions 302, as shown in FIG. 15B.

Further, referring to FIG. 15C, it is shown that the recessing of the interlayer dielectric 1502 exposes a portion of the dielectric placeholders 902 on the backside of the semiconductor device structure. As will be described in detail below, at least one of the dielectric placeholders 902 will later be removed selective to the interlayer dielectric 1502 and the shallow trench isolation regions 302, and replaced with the present backside source/drain region contacts. Thus, in order to facilitate metallization of the backside source/drain region contacts, it is preferable that the interlayer dielectric 1502 is recessed down to, or below, the widest part of the dielectric placeholders 902. Namely, as provided above, each dielectric placeholder 902 is widest at its middle (W1) and tapers at both ends (W2 and W3). Doing so will facilitate metal fill and help prevent void formation.

Figure 16A:
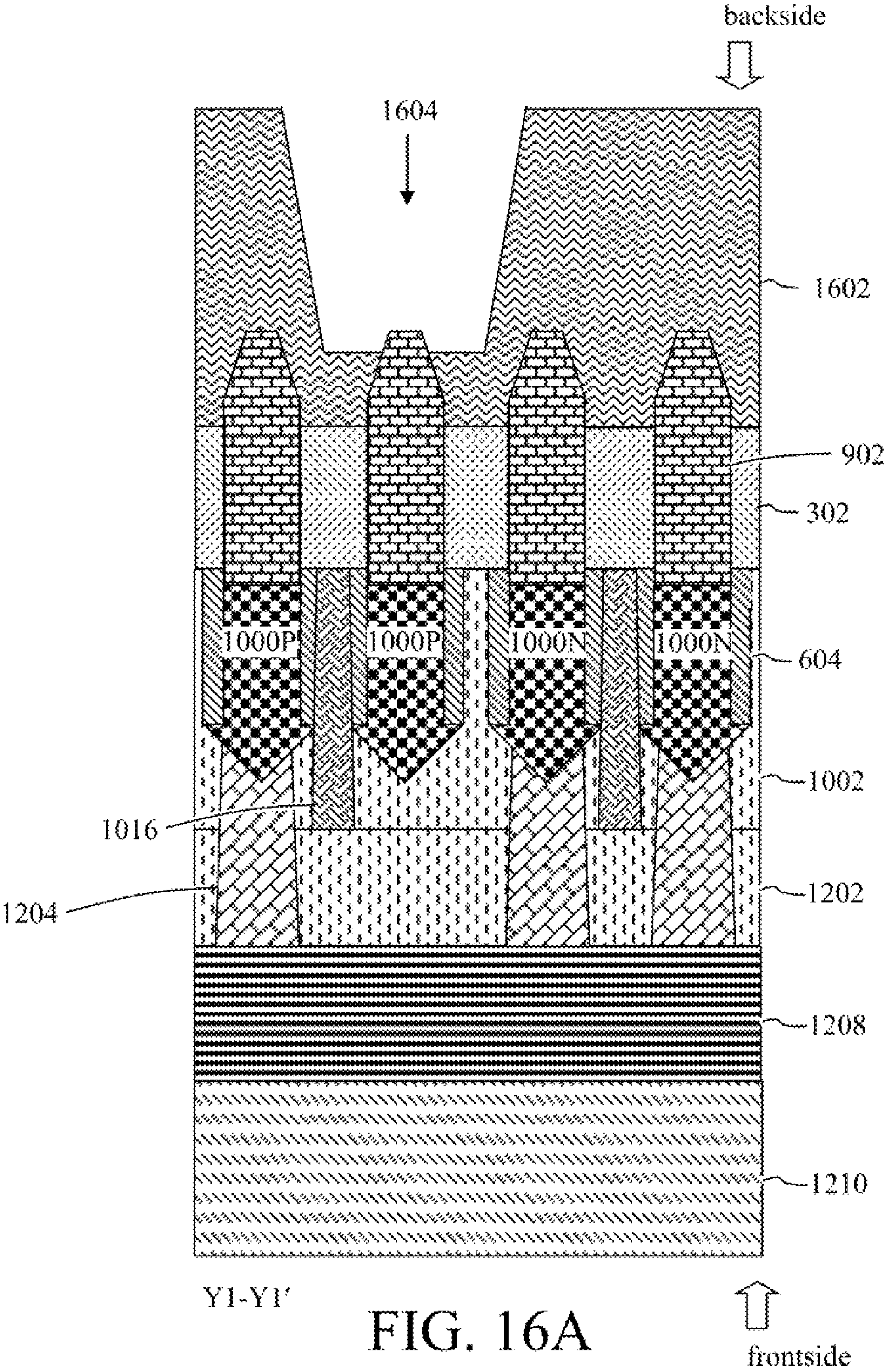
FIG. 16A is a Y-Y1' cross-sectional view.
Figure 16B:
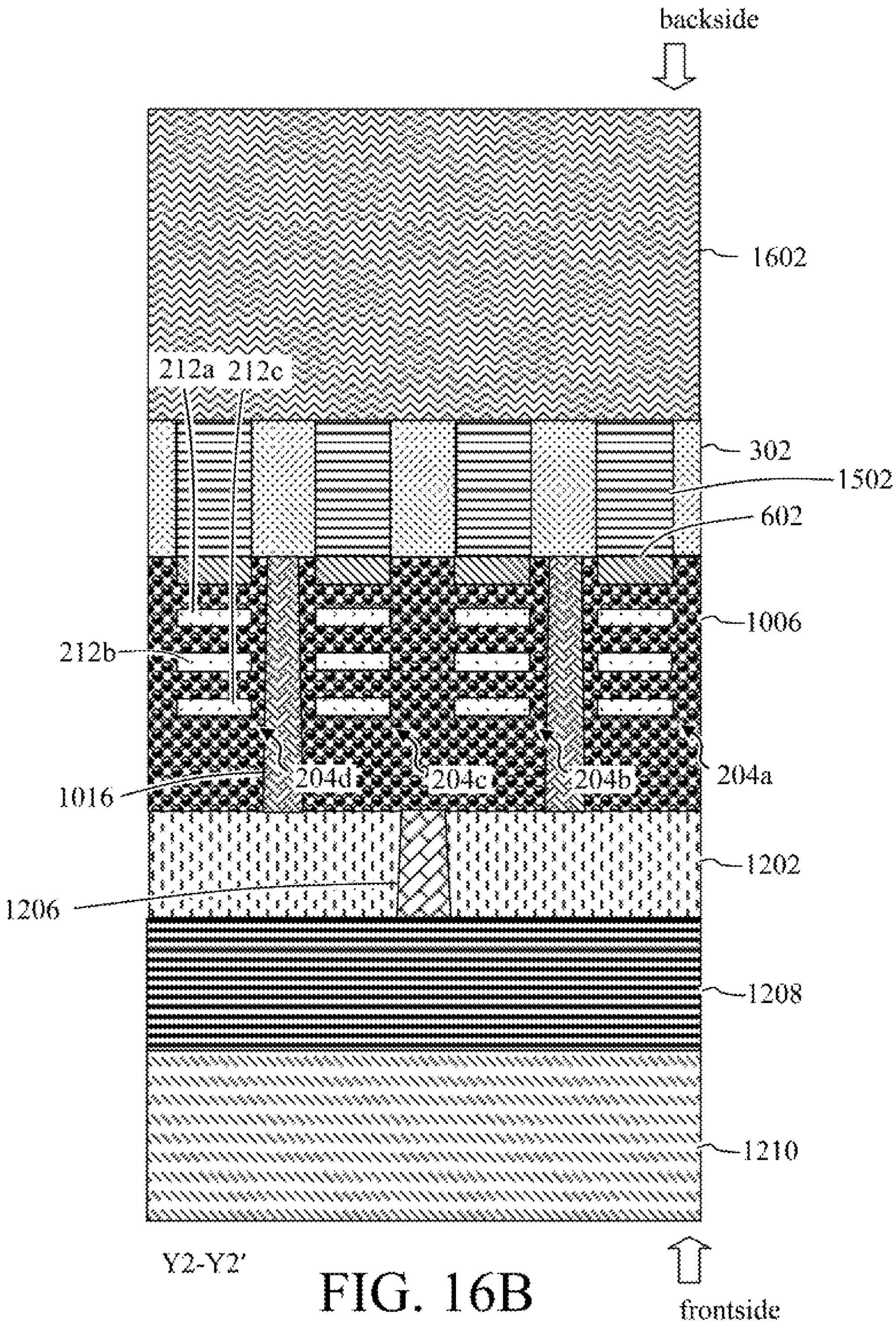
FIG. 16B is a Y2-Y2' cross-sectional view.
Figure 16C:
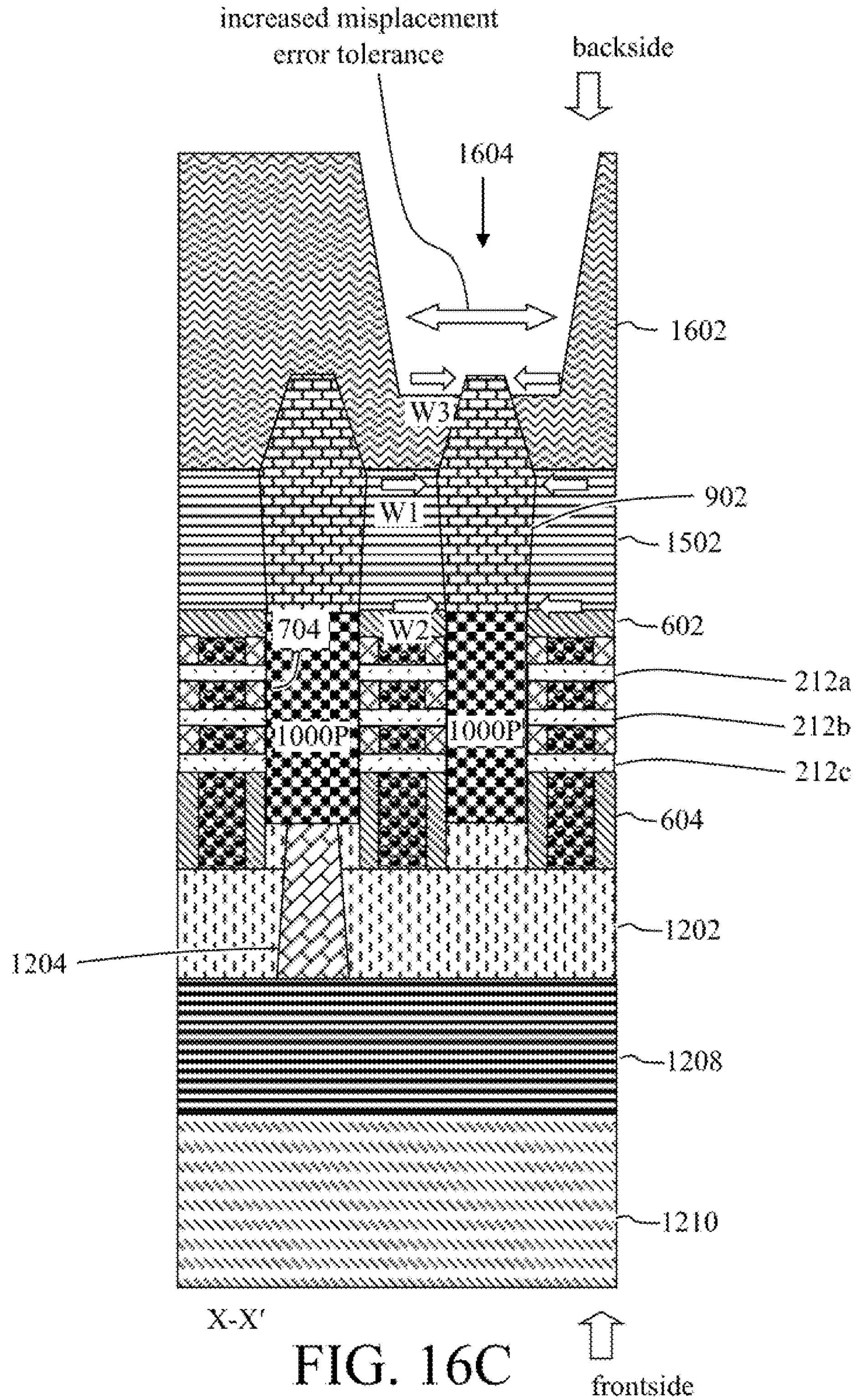
FIG. 16C is an X-X' cross-sectional view illustrating a fill material having been deposited onto the backside of the semiconductor device structure over the dielectric placeholders, and at least one contact via having been formed in the fill material over one of the dielectric placeholders according to an embodiment of the present invention.

As shown in FIG. 16A (a Y1-Y1' cross-sectional view), FIG. 16B (a Y2-Y2' cross-sectional view) and FIG. 16C (an X-X' cross-sectional view), a fill material 1602 is deposited onto the backside of the semiconductor device structure over the dielectric placeholders 902, and at least one contact via 1604 is formed in the fill material 1602 over one of the dielectric placeholders 902. Suitable fill materials 1602 include, but are not limited to, organic planarizing layer materials, which can be deposited using a casting process such as spray coating or spin casting. Standard lithography and etching techniques (see above) can be employed to pattern the contact via(s) 1604 in fill material 1602.

As shown, for example in FIG. 16C, the unique shape of the dielectric placeholders 902 advantageously provides a large misplacement error tolerance for the contact via 1604 over the respective dielectric placeholder 902. Namely, since each dielectric placeholder 902 is widest at its middle (W1) and tapers at both ends (W2 and W3), even if there is some misalignment of the contact via 1604 with the respective dielectric placeholder 902, the risk of exposing an adjacent one of the dielectric placeholders 902 is minimal as the adjacent dielectric placeholders 902 also has tapered ends.

Figure 17A:
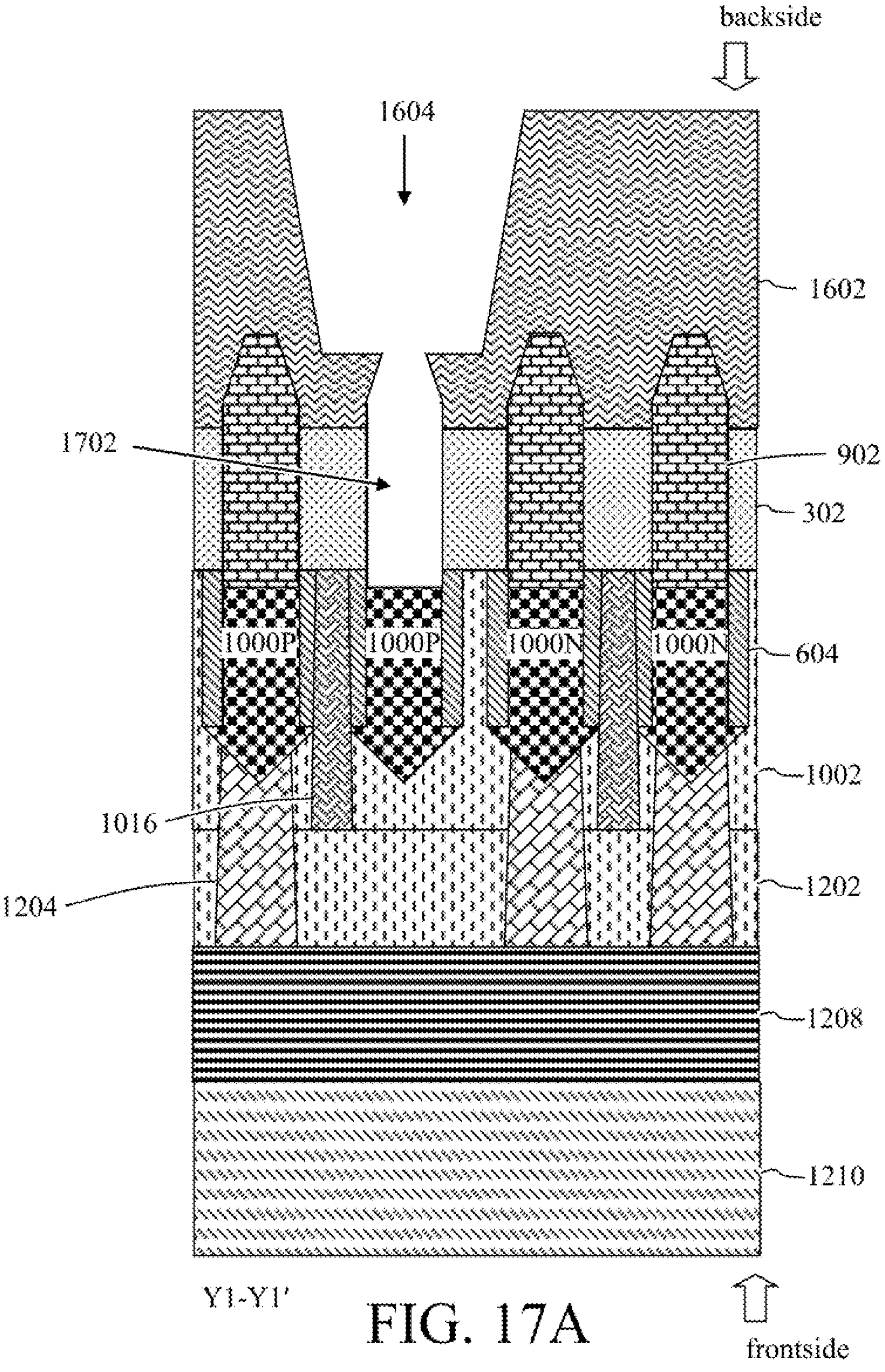
FIG. 17A is a Y1-Y' cross-sectional view.
Figure 17B:
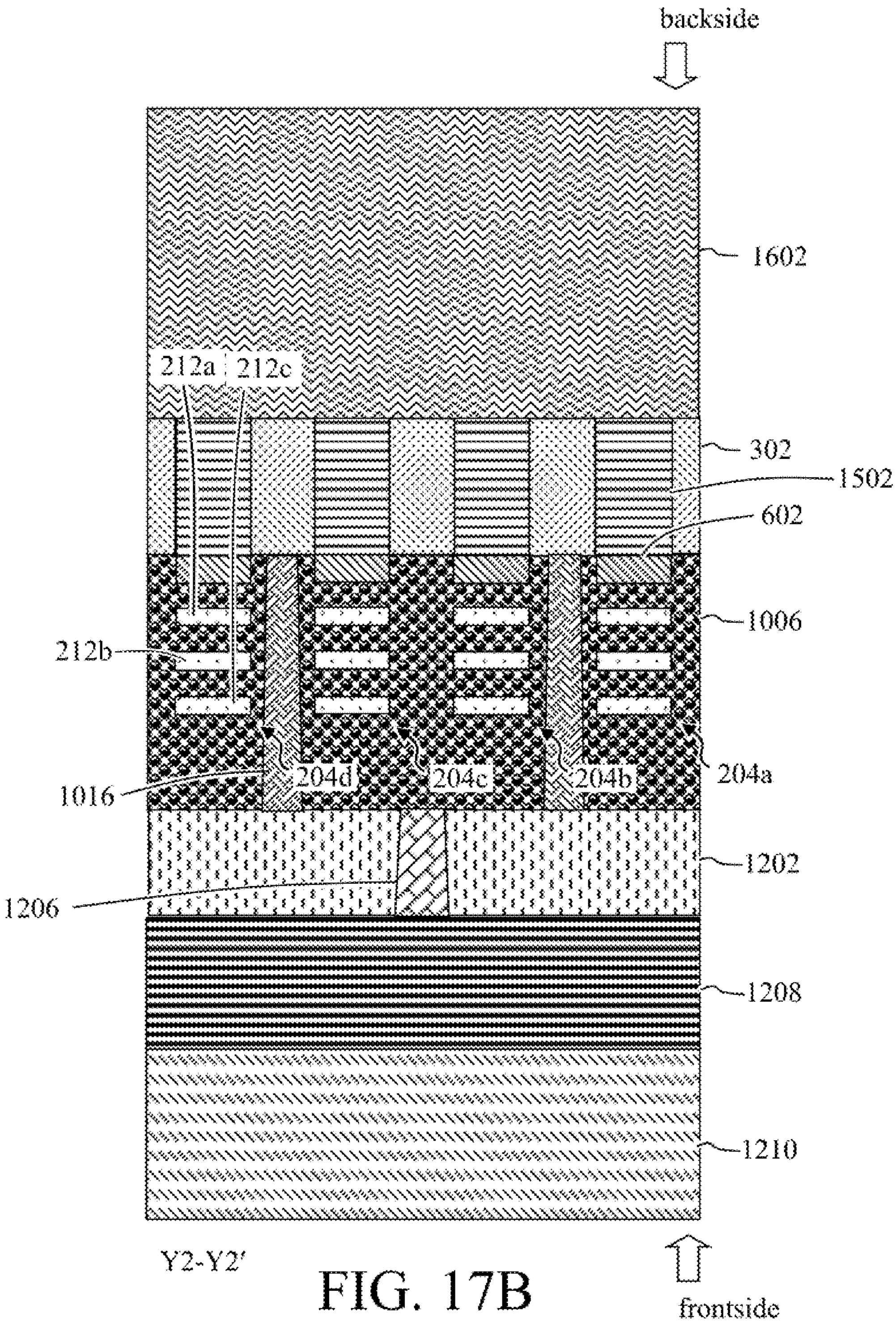
FIG. 17B is a Y2-Y2' cross-sectional view.
Figure 17C:
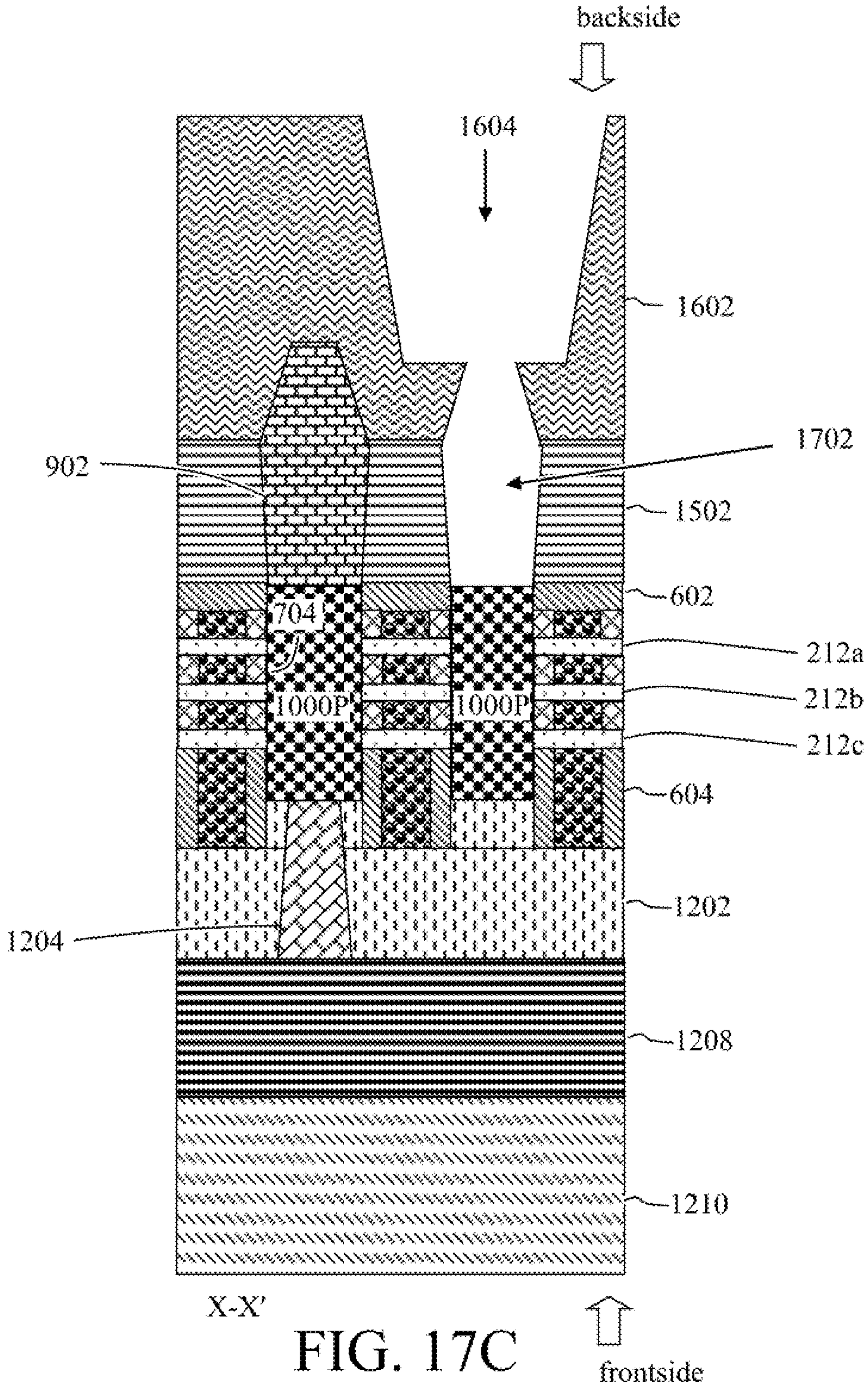
FIG. 17C is an X-X' cross-sectional view illustrating the dielectric placeholder exposed at the bottom of the contact via having been selectively removed creating a cavity in the backside interlayer dielectric/shallow trench isolation regions over the backside of a select one (or more) of the NFET and PFET source/drain regions according to an embodiment of the present invention.

As shown in FIG. 17A (a Y1-Y1' cross-sectional view), FIG. 17B (a Y2-Y2' cross-sectional view) and FIG. 17C (an X-X' cross-sectional view), the dielectric placeholder 902 exposed at the bottom of the contact via 1604 is then selectively removed creating a cavity 1702 in the interlayer dielectric 1502/shallow trench isolation regions 302 over the backside of a select one (or more) of the NFET and PFET source/drain regions 1000N and 1000P. As provided above, the dielectric placeholders 902 can be formed from a material such as SiC. In that case, a SiC-selective etch can be employed to remove the exposed dielectric placeholder 902 through the contact via 1604.

Figure 18A:
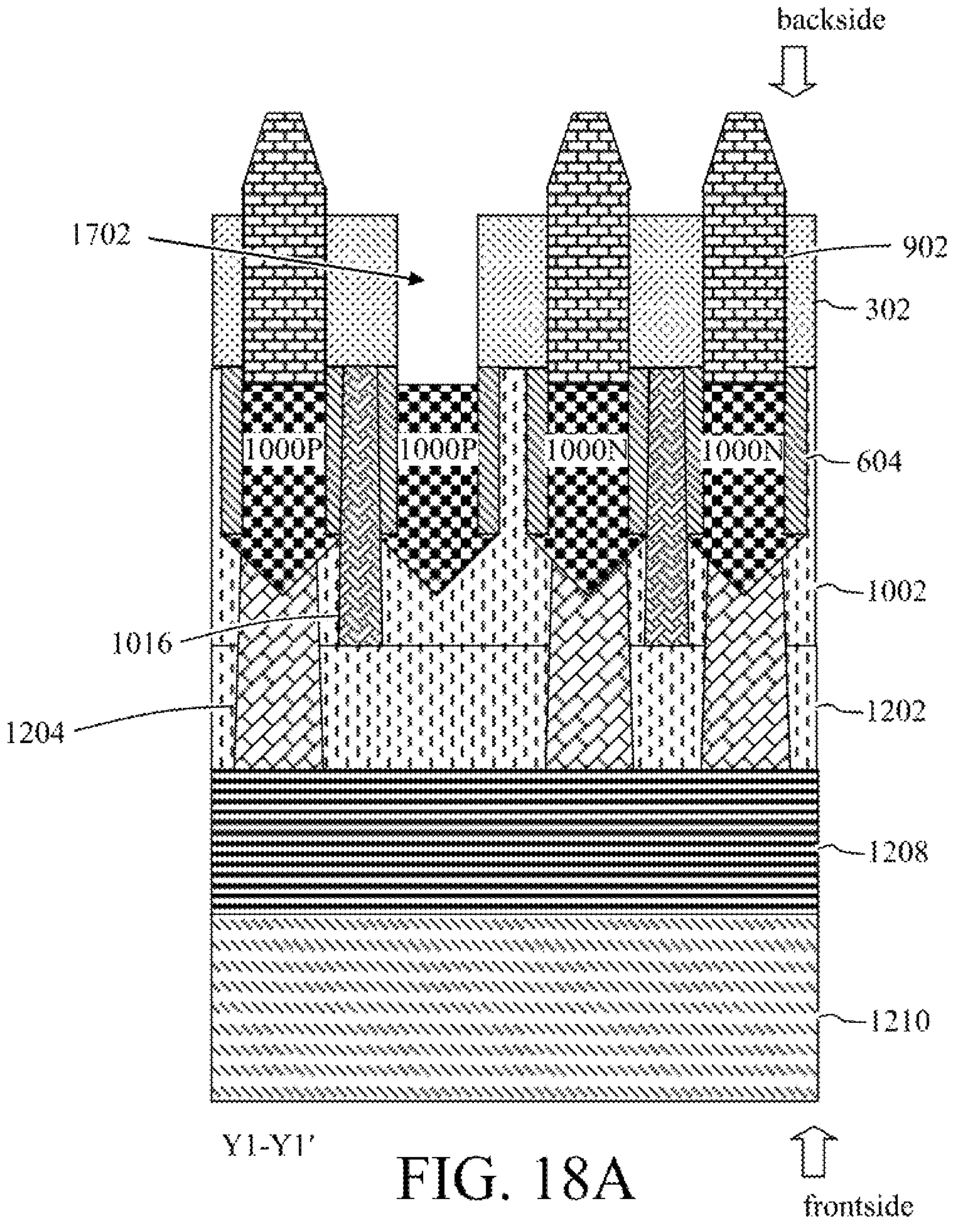
FIG. 18A is a Y1-Y1' cross-sectional view.
Figure 18B:
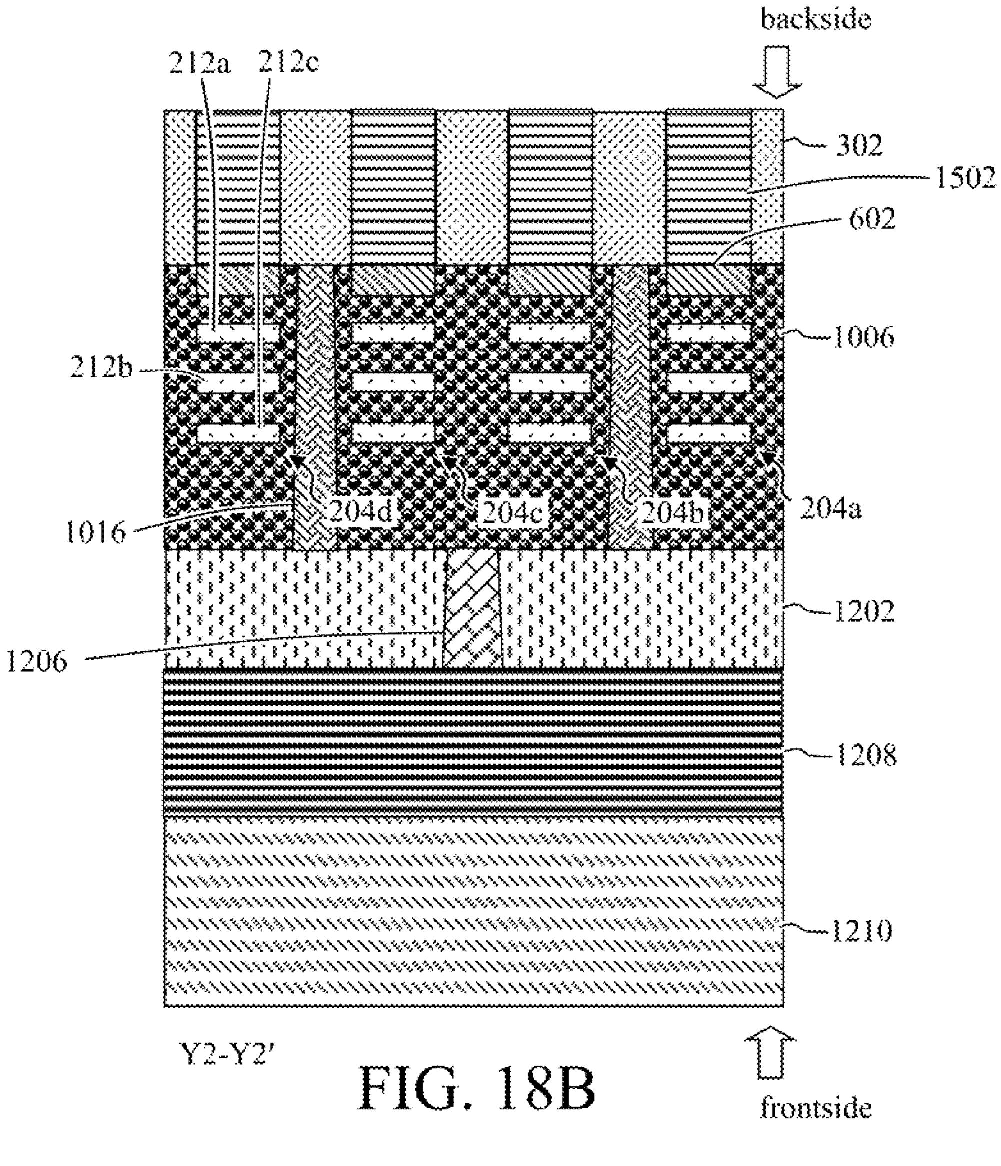
FIG. 18B is a Y2-Y2' cross-sectional view.
Figure 18C:
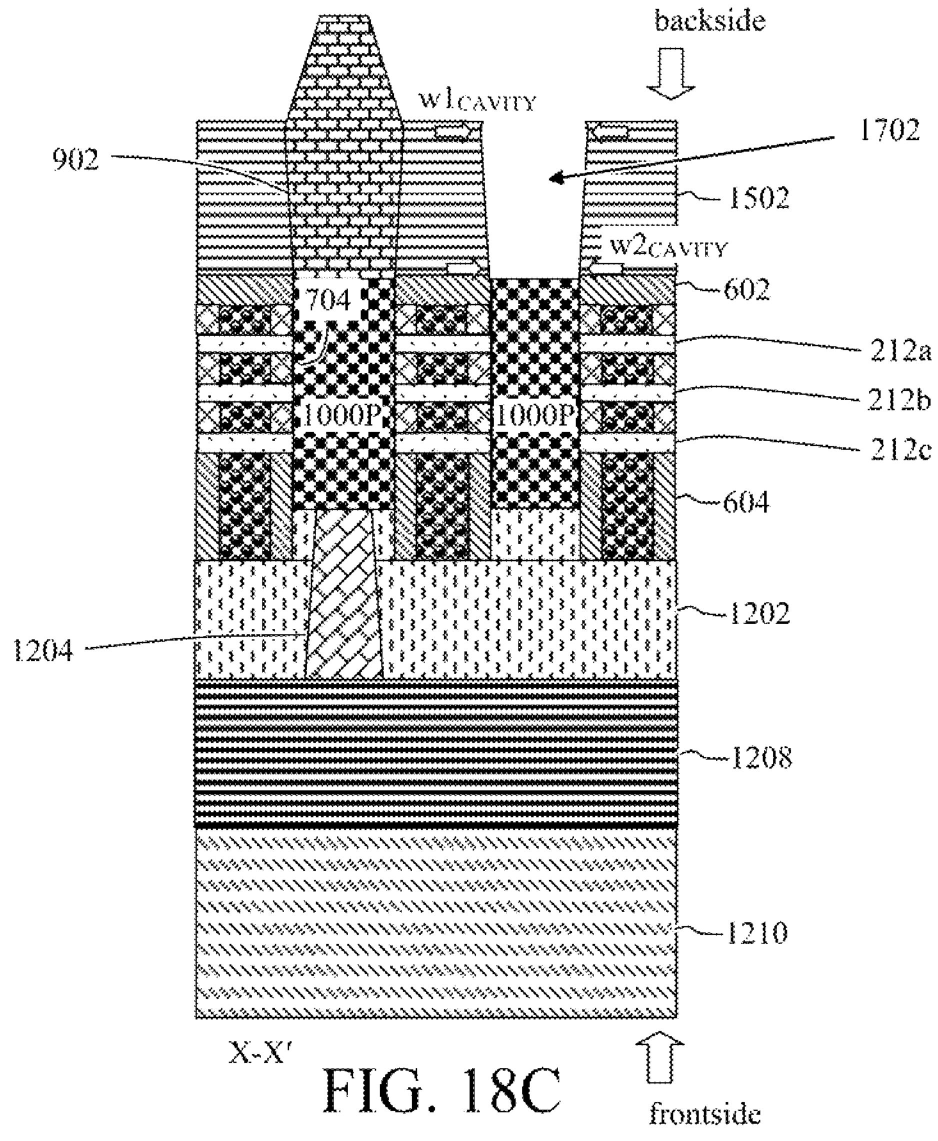
FIG. 18C is an X-X' cross-sectional view illustrating the fill material having been removed according to an embodiment of the present invention.

As shown in FIG. 18A (a Y1-Y1' cross-sectional view), FIG. 18B (a Y2-Y2' cross-sectional view) and FIG. 18C (an X-X' cross-sectional view), the fill material 1602 is removed. As provided above, fill material 1602 can be an organic planarizing layer material. In that case, fill material 1602 can be removed using an ashing process.

As shown in FIG. 18C, the cavity 1702 that remains in the interlayer dielectric 1502/shallow trench isolation regions 302 over the backside of a select one (or more) of the NFET and PFET source/drain regions 1000N and 1000P has a shape that is conducive to (backside) metal fill without void formation. Namely, cavity 1702 is widest at its opening and has inward sloping sidewalls. More specifically, as shown in FIG. 18C, cavity 1702 has a (first) width $w1_{CAVITY}$ at its opening on the backside of the semiconductor device structure, which tapers to a (second) width $w2_{CAVITY}$ at the respective, in this case, PFET source/drain region 1000P, i.e., $w1_{CAVITY} > w2_{CAVITY}$. Thus, when a backside metal fill is later performed, there is no risk for void formation. By contrast, if the opening was smaller, there is a chance that the opening could close off before the cavity is fully filled, thus resulting in voids.

Figure 19A:
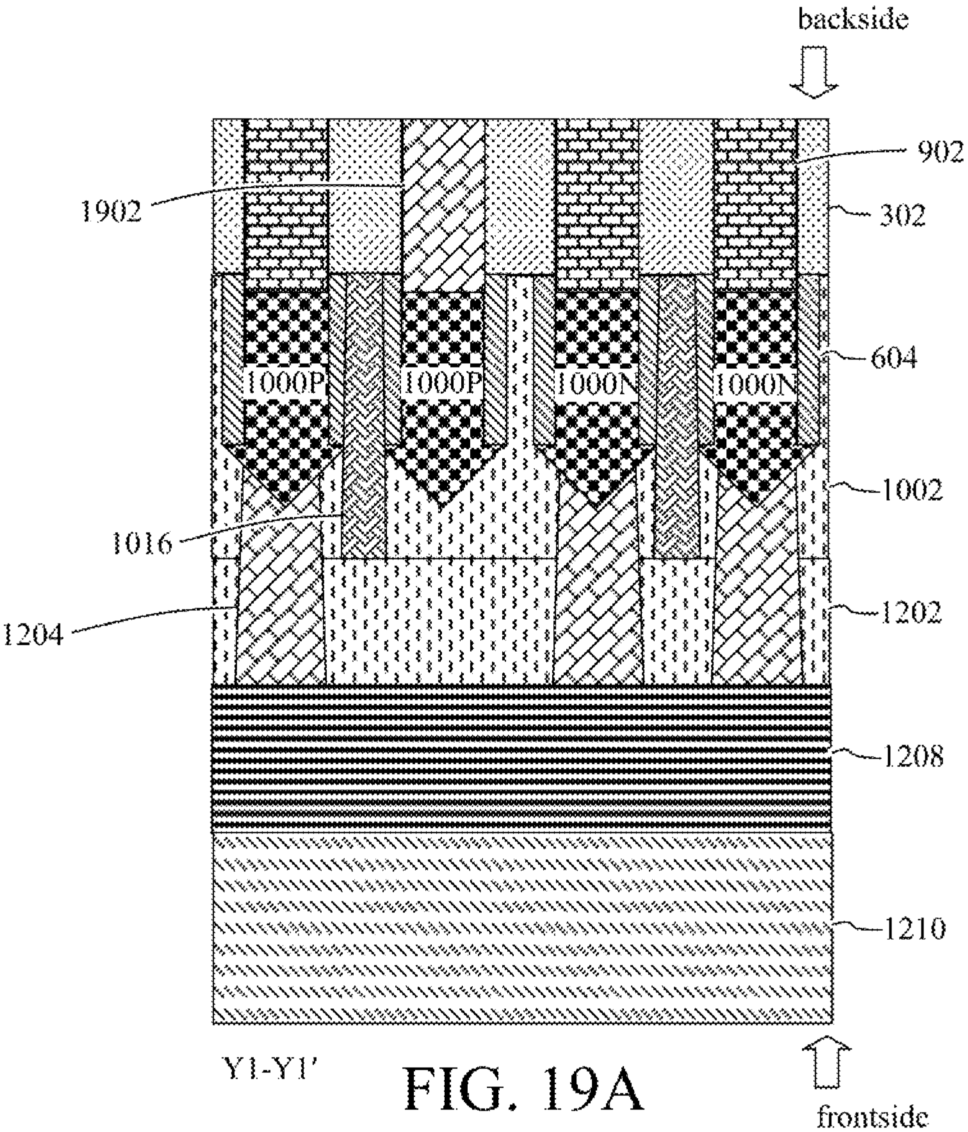
FIG. 19A is a Y1-Y1' cross-sectional view.
Figure 19B:
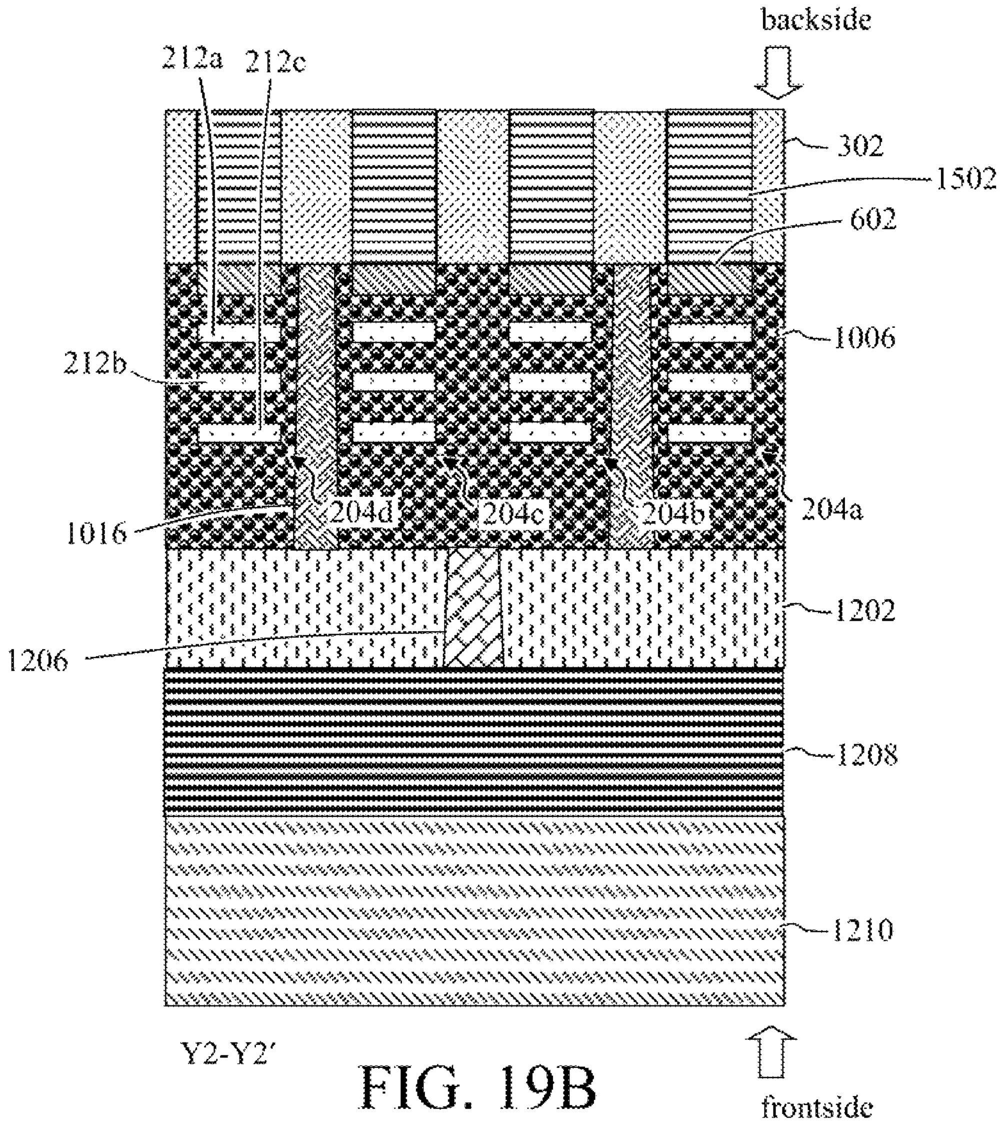
FIG. 19B is a Y2-Y2' cross-sectional view.
Figure 19C:
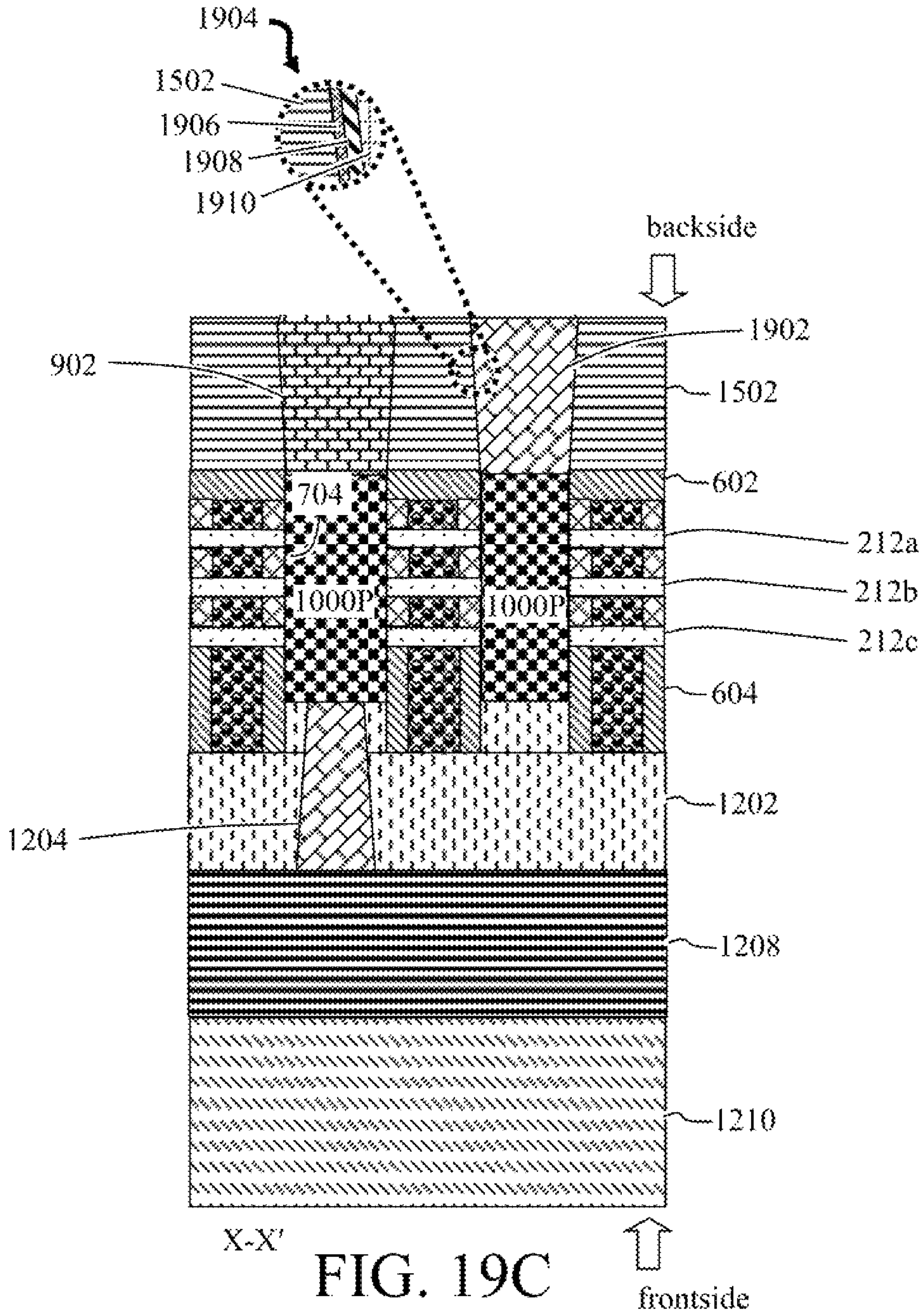
FIG. 19C is an X-X' cross-sectional view illustrating backside contact metallization followed by polishing having been used to form a backside source/drain region contact in the cavity according to an embodiment of the present invention.

As shown in FIG. 19A (a Y1-Y1' cross-sectional view), FIG. 19B (a Y2-Y2' cross-sectional view) and FIG. 19C (an X-X' cross-sectional view), backside contact metallization followed by chemical mechanical polishing is then used to form a backside source/drain region contact 1902 in cavity 1702.

Referring to magnified view 1904 in FIG. 19C, the metallization can include first depositing a silicide liner 1906 into and lining cavity 1702, depositing a metal adhesion layer 1908 onto the silicide liner 1906, and then depositing a fill metal 1910 onto the metal adhesion layer 1908. Suitable silicide liner 1906 materials include, but are not limited to, Ti, Ni and/or NiPt, which can be deposited using a process such as CVD, ALD or PVD. According to an exemplary embodiment, silicide liner 1906 has a thickness of from about 1 nm to about 5 nm. Suitable metal adhesion layer 1908 materials include, but are not limited to, TiN and/or TaN, which can be deposited onto the silicide liner 1906 using a process such as CVD, ALD or PVD. According to an exemplary embodiment, metal adhesion layer 1908 has a thickness of from about 1 nm to about 5 nm. Suitable fill metals 1910 include, but are not limited to, W, Co, Ru and/or Al, which can be deposited onto the metal adhesion layer 1908 using a process such as CVD, ALD, PVD, sputtering, plating, evaporation, ion beam deposition, electron beam deposition, laser assisted deposition, chemical solution deposition, etc. As highlighted above, the overburden can be removed using a process such as chemical mechanical polishing, which also serves to recess the dielectric placeholders 902 down to a surface of the interlayer dielectric 1502/shallow trench isolation regions 302. By way of this 'replacement contact process' the dielectric placeholders 902 are placed early on in the process, and then later selectively removed and replaced with a backside source/drain region contact 1902. Further, the backside source/drain region contact 1902 formed advantageously is self-aligned with the underlying NFET or PFET source/drain region 1000N or 1000P. Namely, since the NFET and PFET source/drain region 1000N and 1000P were formed on the frontside of the semiconductor device directly over the dielectric placeholders 902 (see above), then removal of the dielectric placeholders 902 from the backside of the semiconductor device produces the cavity 1702 (and subsequent backside source/drain region contact 1902 within the cavity 1702) that is aligned with the corresponding NFET or PFET source/drain region 1000N or 1000P.

Figure 20A:
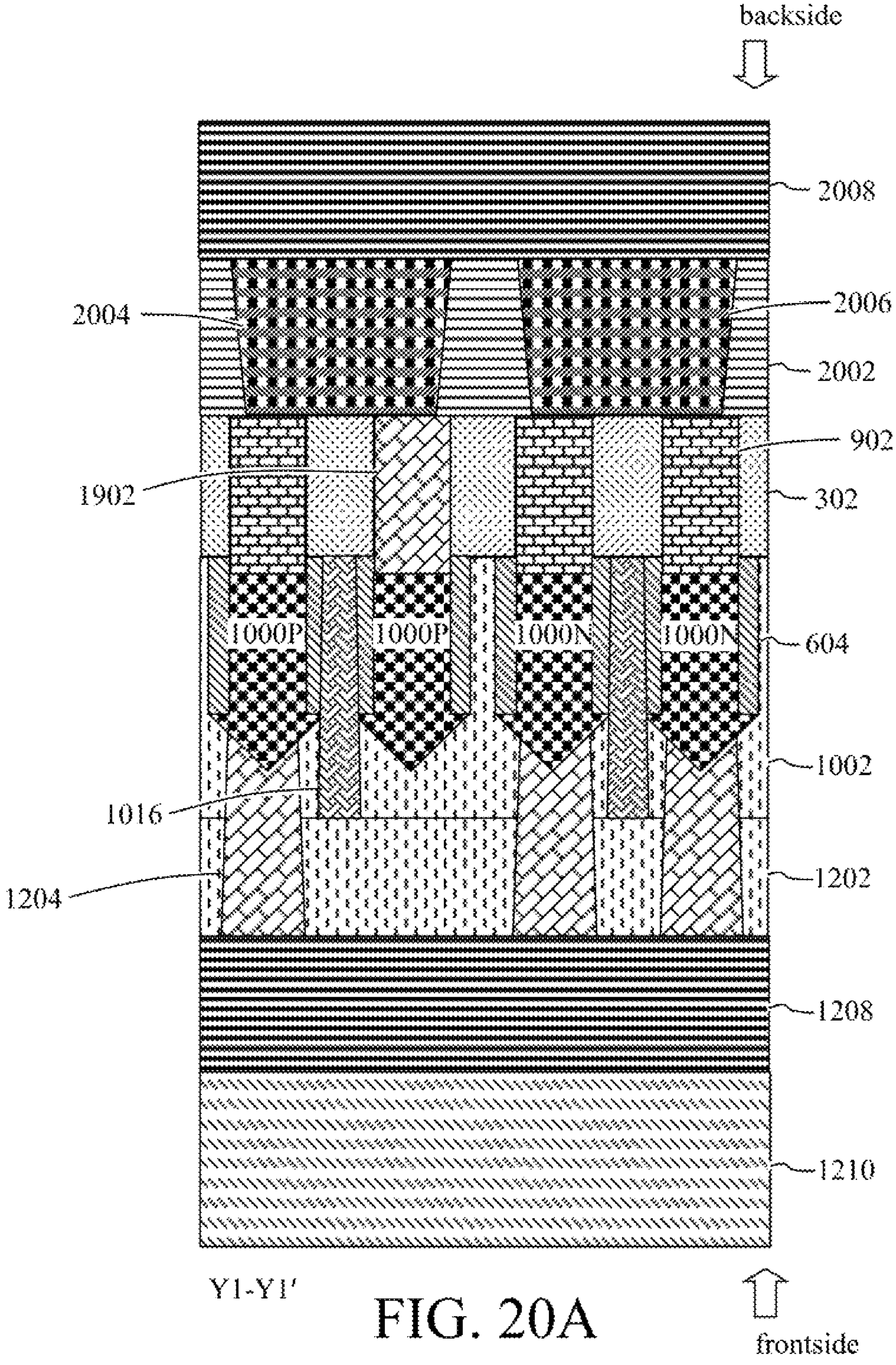
FIG. 20A is a Y1-Y1' cross-sectional view.
Figure 20B:
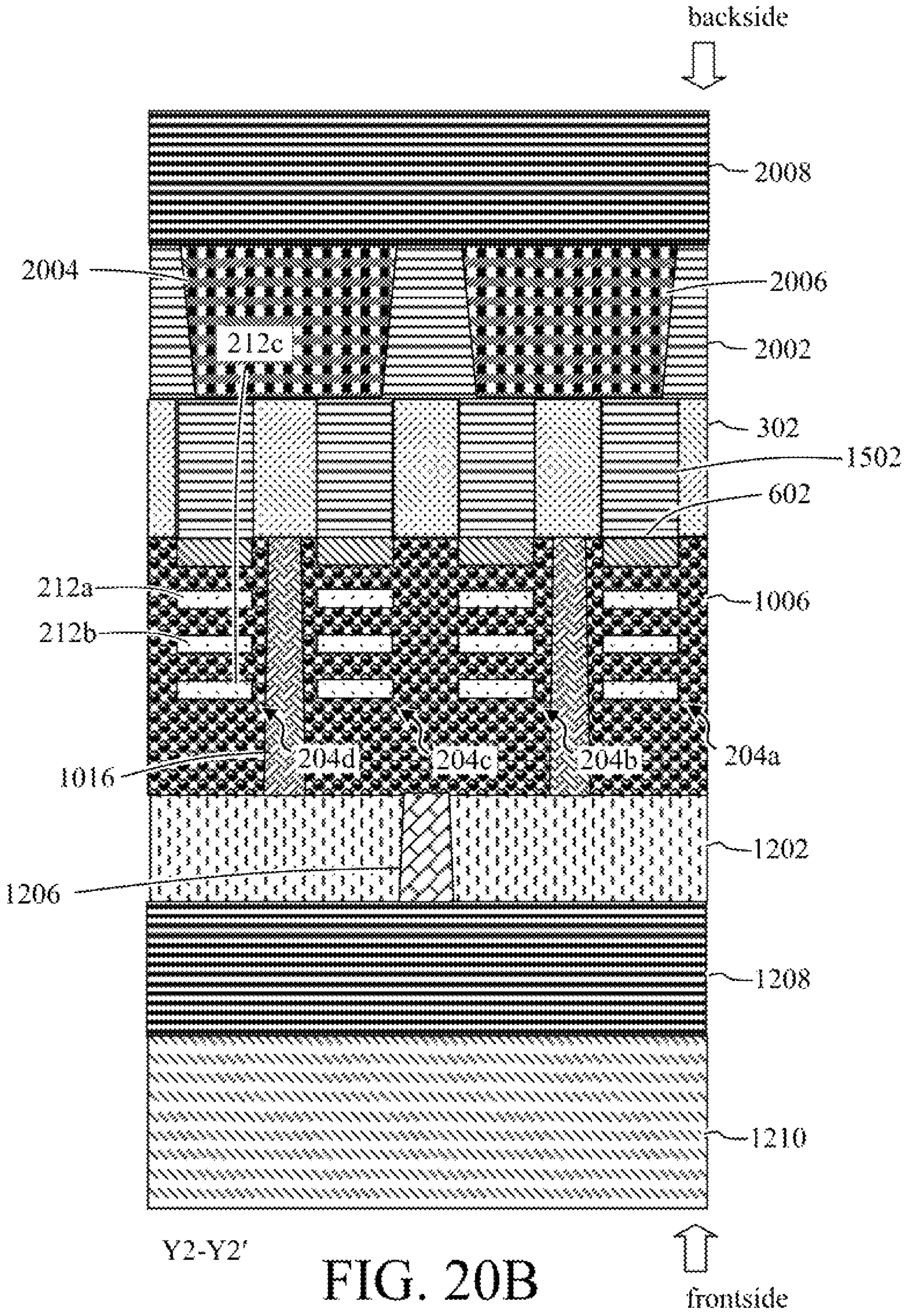
FIG. 20B is a Y2-Y2' cross-sectional view.
Figure 20C:
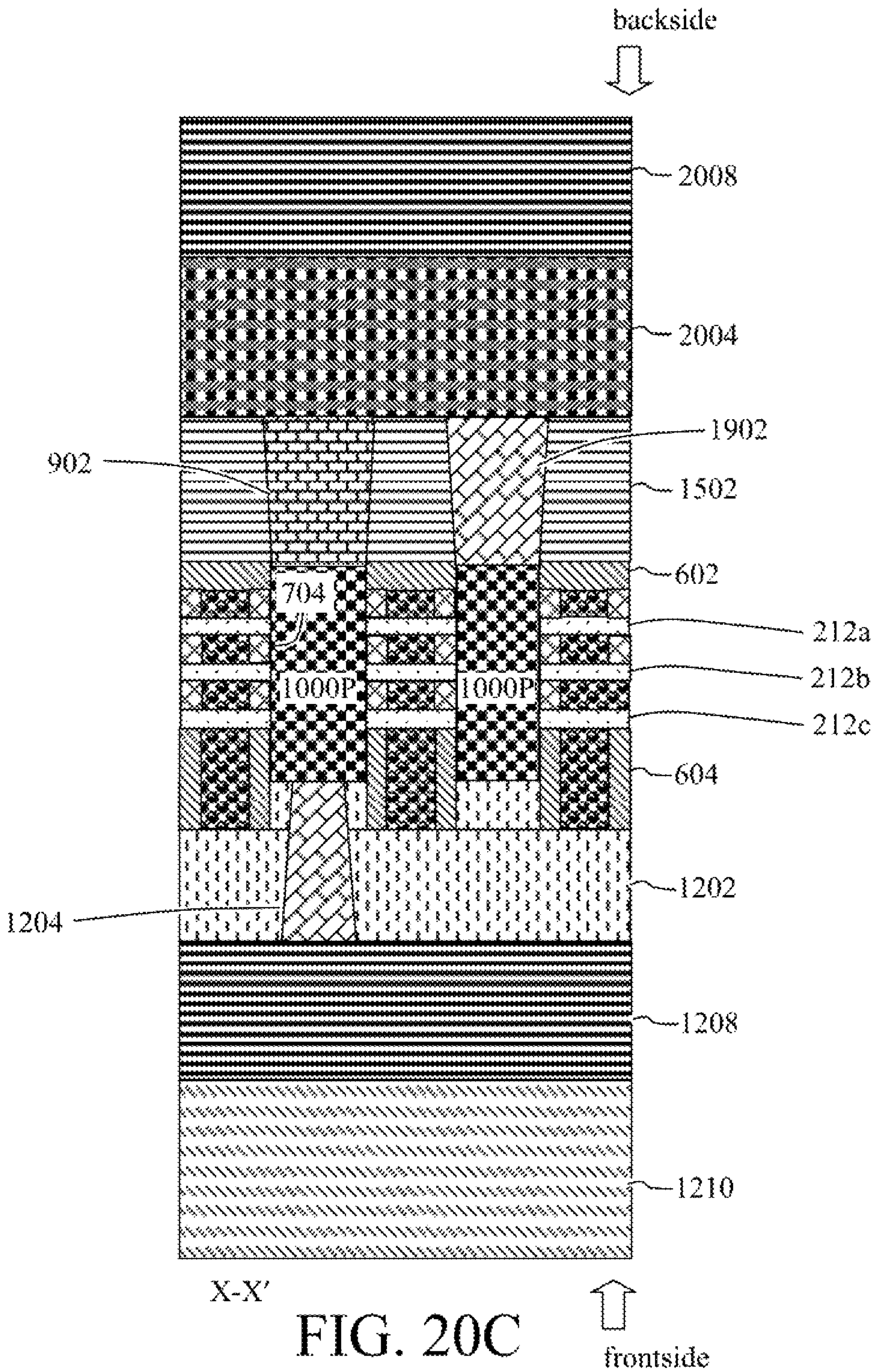
FIG. 20C is an X-X' cross-sectional view illustrating power rails having been formed on the backside of the semiconductor device structure in direct contact with the backside source/drain region contact and/or the dielectric placeholders, and a backside power delivery network having been formed over the power rails according to an embodiment of the present invention.

As shown in FIG. 20A (a Y1-Y1' cross-sectional view), FIG. 20B (a Y2-Y2' cross-sectional view) and FIG. 20C (an X-X' cross-sectional view), VDD and VSS power rails 2004 and 2006, respectively, are then formed on the backside of the semiconductor device structure in direct contact with the backside source/drain region contact 1902 and/or the dielectric placeholders 902, and a backside power delivery network 2008 is formed over the VDD and VSS power rails 2004 and 2006. In general, VDD refers to the positive supply voltage, and VSS refers to the zero volt or ground voltage.

First, a (backside) interlayer dielectric 2002 is deposited onto the interlayer dielectric 1502/shallow trench isolation regions 302 over the backside source/drain region contact 1902 and dielectric placeholders 902. For clarity, the term 'fourth' may also be used herein when referring to interlayer dielectric 2002 so as to distinguish it from the 'first' interlayer dielectric 1002, the 'second' interlayer dielectric 1202, and the 'third' interlayer dielectric 1502. Suitable interlayer dielectric 2002 materials include, but are not limited to, SiN, SiOC and/or oxide low-κ materials such as SiOx and/or oxide ULK-ILD materials such as pSiCOH, which can be deposited using a process such as CVD, ALD or PVD. Following deposition, the interlayer dielectric 2002 can be planarized using a process such as chemical mechanical polishing.

The VDD and VSS power rails 2004 and 2006 are then formed in the interlayer dielectric 2002 over, and in direct contact with, the backside source/drain region contact 1902 and/or the dielectric placeholders 902. To form the VDD and VSS power rails 2004 and 2006, a standard lithography and etching process (see above) is employed to pattern trenches in the interlayer dielectric 2002, which are then filled with a metal or combination of metals. Suitable metals for the VDD and VSS power rails 2004 and 2006 include, but are not limited to, Cu, W, Ru and/or Co, which can be deposited into the trenches using a process such as evaporation, sputtering, ALD, CVD or electrochemical plating. Following deposition, the metal overburden can be removed using a process such as chemical-mechanical polishing. Prior to depositing the metal(s), an adhesion layer (not shown) can be formed lining the trenches. Suitable adhesion layer materials include, but are not limited to. TiN and/or TaN. Additionally, a seed layer (not shown) can also be deposited into and lining the trenches prior to metal deposition, e.g., to facilitate plating of the metal.

Backside power delivery network 2008 generally includes backside interconnect structures such as conductive vias and metal lines commonly formed to interconnect the various devices (in this case the VDD and VSS power rails 2004 and 2006), with the metal lines making lateral connections and the vias making vertical connections amongst different metallization levels. Standard metallization techniques can be employed to form the backside power delivery network 2008. While the individual interconnects present in backside power delivery network 2008 are not specifically shown in the figures, one skilled in the art would understand how such a backside power delivery network 2008 is implemented for a given semiconductor device application.

As shown in FIGS. 20A-C, the backside source/drain region contact 1902 connects one of the source/drain regions (in this example one of the PFET source/drain regions 1000P) to one of the backside power rails (in this example, the VDD power rail 2004). Namely, one (first) end of the backside source/drain region contact 1902 directly contacts the corresponding VDD power rail 2004, and another (second) end of the backside source/drain region contact 1902 directly contacts the corresponding PFET source/drain region 1000P. The remaining dielectric placeholders 902 separate the VDD and VSS power rails 2004 and 2006 from the other NFET and PFET source/drain regions 1000N and 1000P. Namely, one (first) end of the dielectric placeholders 902 directly contacts the VDD and VSS power rails 2004 and 2006, and another (second) end of the dielectric placeholders 902 directly contacts the other NFET and PFET source/drain regions 1000N and 1000P. Each VDD and/or VSS power rails 2004 and 2006 can be in direct contact with multiple dielectric placeholders 902. The middle of line source/drain region contacts 1204 directly contact a side of those other NFET and PFET source/drain regions 1000N and 1000P directly opposite the remaining dielectric placeholders 902.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A semiconductor device, comprising:

at least one field-effect transistor on a frontside of the semiconductor device;

backside power rails on a backside of the semiconductor device;

a backside source/drain region contact connecting a given one of the backside power rails to a source/drain region of the at least one field-effect transistor; and at least one dielectric placeholder between the given backside power rail and another source/drain region of the at least one field-effect transistor, wherein a first end of the at least one dielectric placeholder is in direct contact with the given backside power rail and has a first width W1, wherein a second end of the at least one dielectric placeholder is in direct contact with the other source/drain region of the at least one field-effect transistor and has a second width W2, and wherein W1 is greater than W2, and wherein the width W2 is equal to a width of the other source/drain region.

2. The semiconductor device of claim 1, wherein a first end of the backside source/drain region contact is in direct contact with the given backside power rail and has a first width W1', wherein a second end of the backside source/drain region contact is in direct contact with the source/drain region of the at least one field-effect transistor and has a second width W2', and wherein W1' is greater than W2'.

3. The semiconductor device of claim 1, wherein the at least one dielectric placeholder comprises: silicon carbide, silicon oxycarbide, or silicon oxide disposed over a layer of silicon nitride.

4. The semiconductor device of claim 1, further comprising:

at least one middle of line source/drain region contact in contact with the other source/drain region of the at least one field-effect transistor.

5. The semiconductor device of claim 4, wherein the at least one middle of line source/drain region contact is in contact with a side of the other source/drain region of the at least one field-effect transistor directly opposite the at least one dielectric placeholder.

6. The semiconductor device of claim 1, wherein multiple dielectric placeholders are present between the backside power rails and the at least one field-effect transistor, and wherein at least one of the backside power rails directly contacts more than one of the dielectric placeholders.

7. The semiconductor device of claim 1, further comprising:

shallow trench isolation regions between the backside power rails and the at least one field-effect transistor; and a backside interlayer dielectric surrounding the shallow trench isolation regions.

8. A semiconductor device, comprising:

at least one field-effect transistor on a frontside of the semiconductor device, wherein the at least one field-effect transistor comprises a stack of active layers with bottom dielectric isolation, a gate surrounding the active layers in a gate-all-around configuration, and source/drain regions on opposite sides of the stack of active layers;

backside power rails on a backside of the semiconductor device;

a backside source/drain region contact connecting a given one of the backside power rails to a source/drain region of the source/drain regions of the at least one field-effect transistor; and at least one dielectric placeholder between the given backside power rail and another source/drain region of the source/drain regions of the at least one field-effect transistor, wherein a first end of the at least one dielectric placeholder is in direct contact with the given backside power rail and has a first width W1, wherein a second end of the at least one dielectric placeholder is in direct contact with the other source/drain region of the at least one field-effect transistor and has a second width W2, and wherein W1 is greater than W2, and wherein the width W2 is equal to a width of the other source/drain region.

9. The semiconductor device of claim 8, wherein a first end of the backside source/drain region contact is in direct contact with the given backside power rail and has a first width W1', wherein a second end of the backside source/drain region contact is in direct contact with the source/drain region of the at least one field-effect transistor and has a second width W2', and wherein W1' is greater than W2'.

10. The semiconductor device of claim 8, wherein the at least one dielectric placeholder comprises a material selected from the group consisting of: silicon carbide, silicon oxycarbide, or silicon oxide disposed over a layer of silicon nitride.

11. The semiconductor device of claim 8, further comprising:

at least one middle of line source/drain region contact in contact with the other source/drain region of the at least one field-effect transistor.

12. The semiconductor device of claim 11, wherein the at least one middle of line source/drain region contact is in contact with a side of the other source/drain region of the at least one field-effect transistor directly opposite the at least one dielectric placeholder.

13. The semiconductor device of claim 8, wherein multiple dielectric placeholders are present between the backside power rails and the at least one field-effect transistor, and wherein at least one of the backside power rails directly contacts more than one of the dielectric placeholders.

14. The semiconductor device of claim 8, further comprising:

shallow trench isolation regions between the backside power rails and the at least one field- effect transistor; and a backside interlayer dielectric surrounding the shallow trench isolation regions.

15. The semiconductor device of claim 8, wherein the gate comprises:

a gate dielectric disposed on each of the active layers;

at least one workfunction-setting metal disposed over the gate dielectric; and a fill metal disposed over the at least one workfunction-setting metal.

* * * * *